US008728353B2

(12) United States Patent
Gotou et al.

(10) Patent No.: US 8,728,353 B2
(45) Date of Patent: May 20, 2014

(54) BURNED PLANT MATERIAL AND ELECTROMAGNETIC SHIELDING MEMBER

(75) Inventors: Hiroyuki Gotou, Tokyo (JP); Go Shinohara, Tokyo (JP); Noriyasu Kuno, Tokyo (JP); Hiroshi Iizuka, Yamagata (JP); Takehiko Takahashi, Yamagata (JP); Takeshi Takahashi, Yamagata (JP)

(73) Assignee: Asahi Organic Chemicals Industry Co., Ltd., Miyazaki (JP)

( * ) Notice: Subject to any disclaimer, the term of this patent is extended or adjusted under 35 U.S.C. 154(b) by 412 days.

(21) Appl. No.: 13/121,483

(22) PCT Filed: Sep. 28, 2009

(86) PCT No.: PCT/JP2009/066778
§ 371 (c)(1),
(2), (4) Date: Mar. 29, 2011

(87) PCT Pub. No.: WO2010/035829
PCT Pub. Date: Apr. 1, 2010

(65) Prior Publication Data
US 2011/0175037 A1    Jul. 21, 2011

(30) Foreign Application Priority Data

Sep. 29, 2008  (JP) ................. 2008-249848
Sep. 29, 2008  (JP) ................. 2008-249849
Sep. 29, 2008  (JP) ................. 2008-249850
Dec. 10, 2008  (JP) ................. 2008-314942
Dec. 10, 2008  (JP) ................. 2008-314943
Dec. 10, 2008  (JP) ................. 2008-314944

(51) Int. Cl.
H01B 1/04    (2006.01)

(52) U.S. Cl.
USPC ........ 252/511; 252/510; 252/502; 429/231.8; 174/565; 174/102 R

(58) Field of Classification Search
USPC ........ 252/502, 511, 510; 429/231.8; 174/565; 174/102 R
See application file for complete search history.

(56) References Cited

U.S. PATENT DOCUMENTS

| | | | | |
|---|---|---|---|---|
| 4,602,051 A * | 7/1986 | Nabeta et al. | ................. | 523/137 |
| 4,759,966 A * | 7/1988 | Shimozawa et al. | ........... | 428/141 |
| 5,156,771 A * | 10/1992 | Yamamoto et al. | ............ | 252/512 |
| 5,209,873 A * | 5/1993 | Yamamoto et al. | ............ | 252/512 |
| 5,310,784 A * | 5/1994 | Ide et al. | ........................ | 524/876 |
| 5,834,138 A | 11/1998 | Yamada et al. | | |
| 5,904,980 A * | 5/1999 | Rivas | ............................ | 428/362 |
| 5,916,499 A | 6/1999 | Murayama et al. | | |
| 5,938,979 A * | 8/1999 | Kambe et al. | .................. | 252/500 |
| 5,972,536 A | 10/1999 | Yamada et al. | | |
| 6,316,144 B1 | 11/2001 | Xue et al. | | |
| 6,399,737 B1 * | 6/2002 | Elkovitch | ..................... | 528/196 |
| 6,537,947 B1 * | 3/2003 | Johns et al. | ..................... | 502/416 |
| 7,674,555 B2 * | 3/2010 | Nanba et al. | ................. | 429/231.8 |
| 8,318,356 B2 * | 11/2012 | Gadkaree et al. | ........... | 429/231.8 |
| 2003/0068556 A1 | 4/2003 | Xue et al. | | |
| 2005/0196336 A1 * | 9/2005 | Chatterjee et al. | ............. | 423/448 |
| 2006/0133980 A1 * | 6/2006 | Nanba et al. | ................ | 423/445 R |
| 2007/0092428 A1 * | 4/2007 | Sotowa et al. | ............. | 423/445 R |
| 2007/0275302 A1 | 11/2007 | Sotowa et al. | | |
| 2010/0151328 A1 * | 6/2010 | Gadkaree et al. | ........... | 429/231.8 |
| 2010/0178571 A1 * | 7/2010 | Nanba et al. | ................... | 429/338 |
| 2011/0175037 A1 * | 7/2011 | Gotou et al. | ................... | 252/502 |
| 2011/0180749 A1 * | 7/2011 | Gotou et al. | ................ | 252/182.1 |
| 2011/0193014 A1 | 8/2011 | Sotowa et al. | | |
| 2012/0286195 A1 * | 11/2012 | Gotou et al. | ..................... | 252/73 |
| 2012/0315482 A1 * | 12/2012 | Muramatsu et al. | ......... | 428/402 |
| 2012/0318176 A1 * | 12/2012 | Gotou et al. | .................. | 106/805 |

FOREIGN PATENT DOCUMENTS

| | | |
|---|---|---|
| JP | 8-236116 A | 9/1996 |
| JP | 9-86910 A | 3/1997 |
| JP | 9-087418 | 3/1997 |
| JP | 1997-87418 | 3/1997 |
| JP | 9-161801 A | 6/1997 |
| JP | 10-101453 A | 4/1998 |
| JP | 11-026984 A | 1/1999 |
| JP | 3060389 U | 6/1999 |
| JP | 11-283620 A | 10/1999 |
| JP | 1999-283620 | 10/1999 |
| JP | 11-317116 | 11/1999 |
| JP | 1999-317116 | 11/1999 |
| JP | 2000-290662 A | 10/2000 |
| JP | 2001-139316 A | 5/2001 |
| JP | 2002-368477 | 12/2002 |
| JP | 2004-137144 A | 5/2004 |

(Continued)

OTHER PUBLICATIONS

English translation of Kurata, JP 11-317116.*
International Search Report issued in application PCT/JP2009/066777, completed Nov. 25, 2009 and mailed Dec. 8, 2009.
Kensuke Sato et al. "Mechanical and electrical properties in rubber materials with rice hull silica carbon," Nippon Kikai Gakkai Tohoku Shibu Shuki Koenkai Koen Ronbushu vol. 42, Sep. 30, 2006, p. 77-78.
Mitsuhiro Kaneda et al., "Momigara Shosei Funtai o Riyo shita Plastic Fukugo Zairyo no Dodensei Seigyo," Nippon Sozai Bussei Gakkai Nenkai Koen Yoshishu vol. 18, Jun. 17, 2008, pp. 73-75.

(Continued)

Primary Examiner — Douglas McGinty
(74) Attorney, Agent, or Firm — Griffin & Szipl, P.C.

(57) ABSTRACT

An electrically conductive composition capable of making specific volume resistivity control easier, is a carbonaceous material produced by burning plant material including soybean hulls, rapeseed meal, sesame meal, cotton seed meal, cotton hulls, rice hulls, rice bran, soybean chaffs, rice straws, cereal hulls or the like by adjusting any of the carbon content, burning temperature and median diameter. The burned and carbonized plant material is ground and sieved to give a median diameter of approx. 80 μm or below. The burned plant material is obtained by burning at a temperature of 700° C. or higher.

13 Claims, 47 Drawing Sheets

(56) References Cited

FOREIGN PATENT DOCUMENTS

| | | |
|---|---|---|
| JP | 2004-220972 A | 8/2004 |
| JP | 2005-222933 A | 8/2005 |
| JP | 2005-336017 A | 12/2005 |
| JP | 2007-134286 A | 5/2007 |
| JP | 2007-191389 A | 8/2007 |
| KR | 1020060083797 A | 7/2006 |
| WO | 96/27911 A1 | 9/1996 |

OTHER PUBLICATIONS

Kensuke Sato et al., "Electrical Property of Plastic Composite Materials with Burned Rice-hull Powder," Nippon Kikai Gakkai Tohoku Shibu Shuki Koenkai Koen Ronbushu vol. 43, Sep. 29, 2007, pp. 147-148.

International Search Report issued in application PCT/JP2009/066778, completed Oct. 13, 2009 and mailed Oct. 27, 2009.

Patent Abstracts of Japan corresponding to JP 11-317116 (filed herewith as Exhibit A).

Office Action issued in co-pending related Japanese application JP2009-222025 on Jul. 1, 2013.

Office Action issued in co-pending related Japanese application JP2009-222024 on Jul. 1, 2013.

Office Action issued in co-pending related Korean application KR10-2011-7006992 on Jun. 29, 2013.

Sato, Kensuke et al., "Mechanical and electrical properties in rubber materials with rice-hull silica carbon," Sep. 30, 2006.

\* cited by examiner (a)

(b)

(c)

(a)

(d)

(b)

(e)

(c)

BURNED PLANT MATERIAL AND ELECTROMAGNETIC SHIELDING MEMBER

This is a National Phase Application in the United States of International Patent Application No. PCT/JP2009/066778 filed Sep. 28, 2009, which claims priority on Japanese Patent Application Nos. 2008-249848, 2008-249849 and 2008-249850, filed Sep. 29, 2008 and 2008-314942, 2008-314943 and 2008-314944, filed Dec. 10, 2008. The entire disclosures of the above patent applications are hereby incorporated by reference.

FIELD OF THE INVENTION

The present invention is related to a burned plant material and electromagnetic shielding member; and more particularly, it is related to a burned plant material and electromagnetic shielding member that are useful for making a conductive material used for electronic components and electronic appliances.

In addition, the present invention is related to a burned plant material also functioning as an anti-charge material, anti-static material, conductor, heating element and electromagnetic wave absorber, and an electromagnetic shielding member, electronic appliance, inspection apparatus for electronic appliance and building material comprising the same.

BACKGROUND OF THE INVENTION

Patent Document 1 discloses the production of a synthetic resin composition comprising synthetic resin and carbon precursor particles with a carbon content of 85%-97% in order to provide a synthetic resin composition capable of stably producing a synthetic resin molded product with a specific volume resistivity of $10^5$-$10^{10}$ [$\Omega\cdot$cm] and a synthetic resin molded product with a specific volume resistivity of $10^5$-$10^{10}$ [$\Omega\cdot$cm] that are useful as an electro-static suppression material. It describes that those carbon precursor particles are obtained by burning an organic material from 400 [° C.] to 900 [° C.] in an inert atmosphere.

Patent Document 2 discloses an electromagnetic wave absorber that comprises vegetable carbon and metal-oxide dielectric as structural components. According to Patent Document 2, it is described that the one comprising vegetable carbon as well as metal-oxide dielectric with a high-frequency electromagnetic wave absorption capability can efficiently absorb [GHz]-band electromagnetic waves due to the synergistic effect, and this electromagnetic wave absorber has a sufficient strength as a base board for building ceilings, walls and floors.

Patent Document 3 discloses that a stable and uniform electromagnetic shielding member is formed by adding conductive carbon and carbon fiber to a plastic material at a ratio of 35-65 parts by weight (phr: per hundred resin (rubber)) in order to provide an electromagnetic shielding member that is excellent in every characteristic of sound insulation, shock and vibration isolation and that can be easily manufactured for an upsizing object at low cost.

Patent Document 1: JPA1997-87418
Patent Document 2: JPA2002-368477
Patent Document 3: JPA1999-317116

Problem to be Solved by the Invention

However, the synthetic resin molded product (electrically conductive composition) disclosed in Patent Document 1 is to control the specific volume resistivity by changing the mixing ratios of synthetic resin and carbon precursor particles. However, slight changes in the mixing ratios result in a relatively large change in the specific volume resistivity. Specifically, Table 1 in Patent Document 1 discloses the specific volume resistivity, and the difference is most clearly seen in the specific volume resistivity in Embodiments 7 and 8.

More specifically, the constitutional difference in Embodiments 7 and 8 is only the difference of approx. 7 parts by weight, wherein the mixing ratios of carbon precursor particles to synthetic resin are respectively 53.8 and 66.7 in parts by weight. In spite of this, a difference in the specific volume resistivity becomes 45 times.

In addition, the synthetic resin molded product (electrically conductive composition) disclosed in Patent Document 1 actually requires for mixing carbon fiber in addition to synthetic resin and carbon precursor particles even though it mentions that it is not essential. This is thus a problem from a view point that 2 types of carbonaceous materials such as carbon precursor particles and carbon fiber have to be mixed for producing a synthetic resin molded product.

Furthermore, the electromagnetic wave absorber disclosed in Patent Document 2 has problems from the following view points. Firstly, although it mentions that the electromagnetic wave absorber disclosed in Patent Document 2 can efficiently absorb [GHz]-band electromagnetic waves, not only the absorbing level for [GHz]-band electromagnetic waves is limited, but also it is unsuitable for efficiently absorbing, for example, [MHz]-band electromagnetic waves.

Secondly, since the electromagnetic wave absorber disclosed in Patent Document 2 contains vegetable carbon, it clearly notes that a smaller specific gravity is an advantageous effect of the invention. However, this electromagnetic wave absorber contains metal-oxide dielectric at a weight percentage of at least 20% or more of the total, or in the most preferred case, 50% or more; and even though it contains vegetable carbon, the specific gravity of the electromagnetic wave absorber can hardly be evaluated as relatively light-weighted, and thus there is a problem that it is hard to use it as a base board for building ceilings and walls due to its own weight.

Furthermore, in the case of the electromagnetic shielding member disclosed in Patent Document 3, if the electromagnetic shielding member is used for a cable, only 35 [phr] to 65 [phr] of conductive carbon etc. can be blended with a plastic material that is a base material in order not to lose the cable flexibility.

Since the blending of conductive carbon etc. and the cable flexibility have a trade-off relationship, a required amount of conductive carbon cannot be contained in consideration of the cable flexibility. Therefore, a sufficient conductivity cannot be acquired.

Thus, a problem to be solved by the present invention is to provide an electrically conductive composition capable of making specific volume resistivity control easier, which can be produced by using a carbonaceous material comprising a burned plant material only.

In addition, another problem to be solved by the present invention is to provide an electromagnetic shielding member with a very small specific gravity that highly shields electromagnetic waves in a wide range.

Yet another problem to be solved by the present invention is to allow blending a relatively large quantity of conductive carbon with the base material and in so doing, not to lose the flexibility of the base material.

SUMMARY OF THE INVENTION

Means of Solving the Problems

In order to solve the above problems, the burned plant material of the present invention is formed by adjusting any of the carbon content, burning temperature and median diameter. The burned and carbonized plant material is ground and sieved to give a median diameter of approx. 80 μm or below. Specifically, the burned material may be burned at a temperature of 700° C. or higher. Here, the burned material includes a burned material of soybean hulls, rapeseed meal, sesame meal, cotton seed meal, cotton hulls, rice hulls, rice bran, soybean chaffs, rice straws, cereal hulls or the like, and further includes a mutual mixture thereof.

In addition, the electromagnetic shielding member of the present invention is determined according to the frequency band of the electromagnetic waves to be shielded by the above burned plant material. Specifically, the content ratio against the base material may be set to 150 [phr] or more, preferably 200 [phr], and more preferably 300 [phr] or more. The burned plant material is contained so that the electromagnetic shielding effectiveness is 20 [dB] or more in the frequency band of 1000 [MHz] and below, or the electromagnetic wave absorption is 20 [dB] or more in the frequency band of 4200 [MHz]-8500 [MHz], or the electromagnetic wave absorption is 20 [dB] or more in the frequency band of 6800 [MHz] and above.

Furthermore, electronic appliance, inspection apparatus for electronic appliance, building material, covering material and anti-static material according to the present invention comprise an electromagnetic shielding member including the above burned plant material. In addition, the present invention is an electrically conductive composition formed by compressing and molding a mixture of the burned plant material and a base material, wherein the burned plant material is a burned plant material produced by adjusting any of the carbon content, burning temperature and median diameter, and is blended 100 [phr] or more against the base material, and the burning temperature is 700 [° C.] or higher, and the median diameter is 1 μm or more.

DETAILED DESCRIPTION OF THE INVENTION

Figure 1:
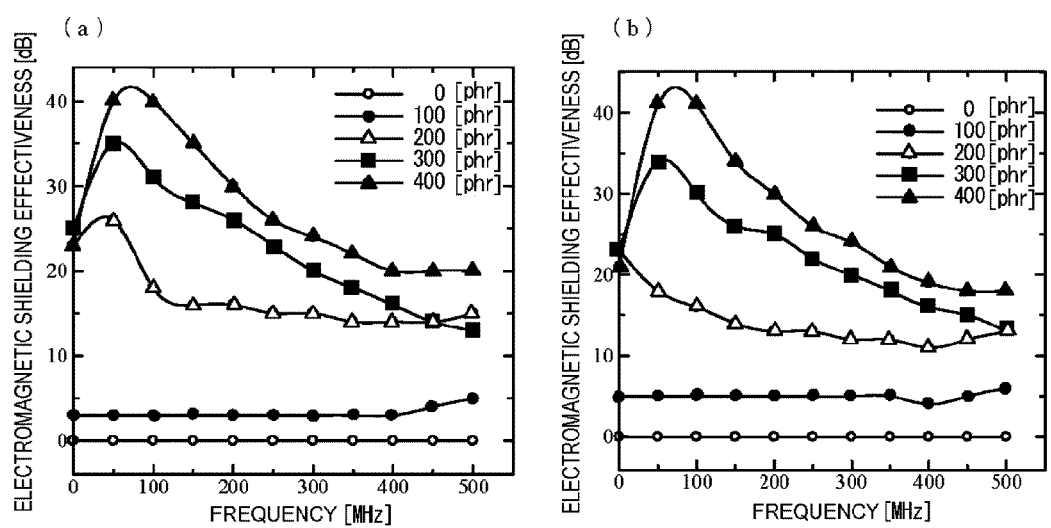
FIG. 1 shows charts indicating the measurement results of the electromagnetic shielding characteristics of the electrically conductive composition of this embodiment.

Referring to drawings, embodiments according to the present invention are described hereinafter.

Embodiment 1

First, an overview of the electrically conductive composition and electromagnetic shielding member of this embodiment is described. The electrically conductive composition of this embodiment was found to function as an electromagnetic shielding member as well. In consideration of this aspect, please note that an electrically conductive composition mentioned in this application of the present invention may refer to an electromagnetic shielding member, while an electromagnetic shielding member mentioned herein may refer to an electrically conductive composition.

This embodiment first produces a burned plant material by burning and carbonizing any of soybean hulls, rapeseed meal, cotton hulls, sesame meal, and cotton seed meal. Today, the production of food oil etc. from soybeans as a raw material results in causing a large amount of soybean hulls etc. Although most of those are reused as fodder for live stock or agricultural fertilizer, further usages have been sought. As a result of dedicated study from the aspect of ecology, as a way of further reusing soybean hulls etc., it was found that the burned plant material obtained by burning soybean hulls etc. can be beneficially used as an electrically conductive composition.

The burned plant material is obtained by burning soybean hulls etc. in an inert gas atmosphere with nitrogen gas etc. or in a vacuum condition by using a carbonization apparatus such as holding furnace or rotary kiln, for example, at a temperature of approx. 900 [° C.]. Then, the burned material of soybean hulls etc. is ground and then sieved with, for example, a 106 μm by 106 μm mesh. As a result, about 80% of the entire burned material of soybean hulls becomes 85 μm or below. In this case, the median diameter becomes, for example, approx. 30 μm to approx. 60 μm.

The median diameter was measured by a laser diffraction particle size analyzer, SALD-7000 etc. made by SHIMADZU Corporation. In this embodiment, a burned material of soybean hulls etc. with a median diameter of, for example, approx. 30 μm to approx. 60 μm, and those further pulverized to the minimum median diameter of approx. 1 μm are blended with ethylene propylene diene rubber etc. as a base material, at a ratio of, for example, approx. 100 [phr] to approx. 400 [phr] (per hundred resin (rubber)).

Pulverizing herein refers to a pulverization of a pre-pulverizing material to reduce its median diameter by about one decimal order. Therefore, it refers that a median diameter of 30 μm before pulverization is pulverized to 3 μm. However, pulverizing does not refer to exactly reducing the median diameter before pulverization by approx. one decimal order, and it also includes pulverizing to reduce the median diameter before pulverization to ⅕-1/20. In this embodiment, the pulverization was carried out so that the median diameter after pulverization becomes 1 µm at the smallest.

After the above blending, an electrically conductive composition is obtained by vulcanizing and molding the rubber. As the base material, urethane, glass wool and wood may be used other than various rubbers such as ethylene propylene diene rubber.

Here, it is worth noting that the maximum of 4 times or more of the conductive carbon can be blended with the base material in comparison to the electromagnetic shielding member disclosed in Patent Document 1.

Objectively evaluating this point, the electromagnetic shielding member is as if produced by adding a small amount of ethylene propylene diene rubber etc. as a binder to the conductive carbon.

FIG. 1 shows charts indicating the measurement results of the electromagnetic shielding characteristics of the electrically conductive composition of this embodiment. Here, ethylene propylene diene rubber was used as the base material. FIG. 1(a) shows a measurement result of the burned material of soybean hulls. FIG. 1(b) shows a measurement result of the burned material of a mixture of raw soybean hulls (=soybean hulls before burned) and a liquid resol-type phenolic resin at the ratio of 75 [wt. %] to 25 [wt. %].

Mixing a resol-type phenolic resin with raw soybean hulls allows improving the strength and carbon content of the burned material of soybean hulls. However, please note that the mixing itself is not essential for producing the electrically conductive composition of this embodiment.

In FIG. 1(a) and FIG. 1(b), the lateral axis and vertical axis indicate frequency [MHz] and electromagnetic shielding effectiveness [dB] respectively. In addition, for both of the measuring objects of the measurement results shown in FIG. 1(a) and FIG. 1(b), the median diameter of the burned material of soybean hulls was set to approx. 60 µm, and the burning temperature for soybean hulls was set to approx. 900 [° C.], and the thickness of the electrically conductive composition was set to approx. 2.5 [mm].

These electromagnetic shielding characteristics were obtained by using Shield Material Evaluator (TR17301 Å manufactured by Advantest Corporation) and Spectrum Analyzer (TR4172 manufactured by Advantest Corporation) at Yamagata Research Institute of Technology, Okitama Branch on 5 Jul. 2007.

As seen in FIG. 1, it is found that the electromagnetic shielding effectiveness has been improved as the content ratio of the burned material of soybean hulls in the electrically conductive composition increases. There are some points that are worth noting, and the first point is that, according to this embodiment, the content ratio of the burned material of soybean hulls against the base material can be adjusted freely. Furthermore, it is particularly worth noting that the content ratio against the base material can be increased generally for the burned plant material including soybean hulls. As shown in FIG. 1, the electrically conductive composition of this embodiment has a characteristic of improving the electromagnetic shielding effectiveness as increasing the content ratio of the burned material of soybean hulls.

Here, instead of the burned material of soybean hulls, when carbon black was used as the containing object to ethylene propylene diene rubber, it was found that the flexibility of the electrically conductive composition was reduced by containing as much as 100 [phr] of carbon black against ethylene propylene diene rubber.

And, I would not say that it is impossible to contain as much as 400 [phr] of carbon black against the rubber, but it will essentially be very difficult to achieve that. In contrast to this, in the case of the electrically conductive composition of this embodiment, as much as approx. 400 [phr] of the burned material of soybean hulls can be contained against the rubber.

The second point is that the electrically conductive composition of this embodiment can advantageously improve the electromagnetic shielding effectiveness significantly as a result of the increased content ratio of the burned material of soybean hulls against the base material. From a different view point, the electrically conductive composition of this embodiment is advantageously easy to control its electromagnetic shielding effectiveness by adjusting the content ratio of the burned material of soybean hulls against the base material.

As shown in FIG. 1, an excellent electromagnetic shielding effectiveness is particularly observed in the frequency band of around 50 [MHz]. Specifically, when the content ratio of the burned material of soybean hulls is approx. 400 [phr] against rubber, the electromagnetic shielding member maintains 20 [dB] or above up to the frequency band of 500 [MHz] with a maximum value of over 40 [dB].

This value is a tremendous value considering that most of the generally available electromagnetic shielding materials in the market have an electromagnetic shielding effectiveness within the range of 5 [dB] to 25 [dB]. Similarly, even if the content ratio of the burned material of soybean hulls is approx. 300 [phr], an electromagnetic shielding effectiveness of 20 [dB] or above has been maintained in the frequency band of 300 [MHz] and below.

Figure 24:
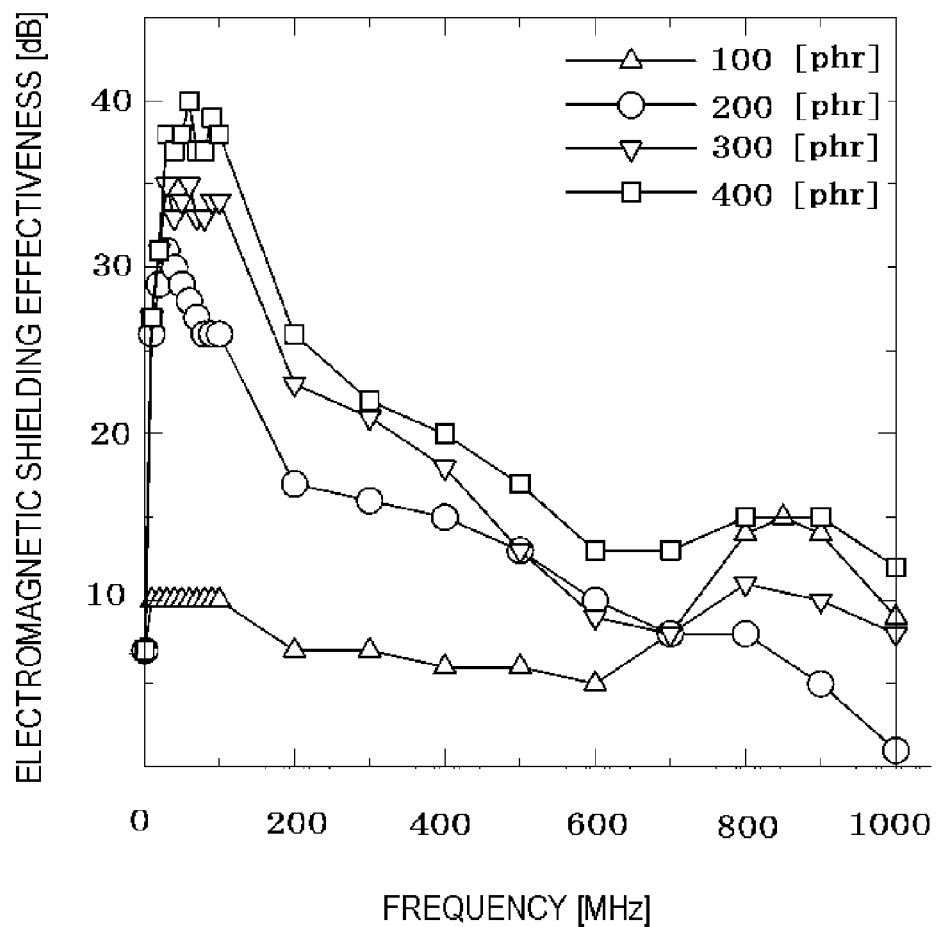
FIG. 24 shows a chart indicating the measurement results of the electromagnetic shielding characteristics shown in FIG. 1 with an expanded measurement range.
Figure 25:
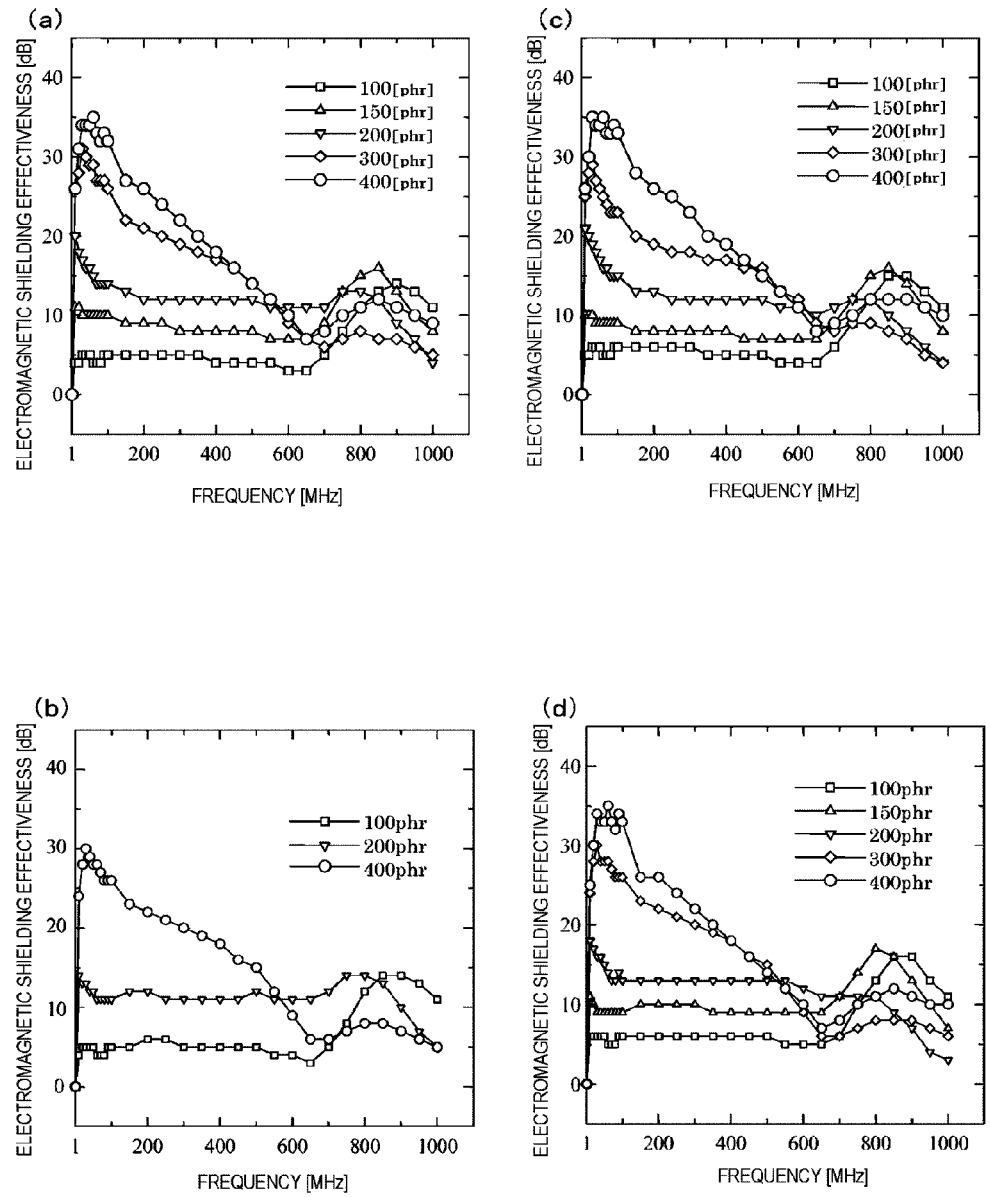
FIG. 25 shows charts indicating the measurement results of the electromagnetic shielding characteristics of the burned materials of rapeseed meal, sesame meal, cotton seed meal and cotton hulls.

FIG. 24 shows a chart indicating the measurement results of the electromagnetic shielding characteristics shown in FIG. 1 with an expanded measurement range. In FIG. 24, the lateral axis and vertical axis indicate frequency [MHz] and electromagnetic shielding effectiveness [dB] respectively. The measurement range of FIG. 1 is a frequency band of up to 500 [MHz], while the measurement range of FIG. 24 is a frequency band of up to 1000 [MHz]. As the measuring object, raw soybeans were burned without containing a resol-type phenolic resin.

First, paying attention to the frequency band of up to 500 [MHz], it is found that a measurement result with an electromagnetic shielding effectiveness similar to the chart in FIG. 1 has been obtained. In contrast, paying attention to the frequency band from 500 [MHz] to 1000 [MHz], the electromagnetic shielding effectiveness decreases for all measuring objects up to 600 [MHz].

However, the electromagnetic shielding effectiveness increases for most of the measuring objects up to the frequency band of around 800 [MHz]. Then the electromagnetic shielding effectiveness decreases again from approx. 900 [MHz] to approx. 1000 [MHz].

FIG. 25(a)-FIG. 25(d) show a chart indicating the measurement results of the electromagnetic shielding characteristics of the burned materials of rapeseed meal, sesame meal, cotton seed meal and cotton hulls. In FIG. 25(a)-FIG. 25(d), the lateral axis and vertical axis indicate frequency [MHz] and electromagnetic shielding effectiveness [dB] respectively. FIG. 25(a), FIG. 25(b), FIG. 25(c) and FIG. 25(d) indicate the measurement result of the electromagnetic shielding characteristics of rapeseed meal, sesame meal, cotton seed meal and cotton hulls respectively.

Rapeseed meal, sesame meal, cotton seed meal and cotton hulls were burned at a burning temperature of 900 [° C.] and the obtained burned materials were ground and sieved with a 106 µm by 106 µm mesh, and thus the median diameters were respectively approx. 48 µm, approx. 61 µm, approx. 36 µm and approx. 34 µm. Therefore, hereinafter, when the burning temperature of rapeseed meal etc. is clearly specified as 900 [° C.], it means that the burned material of rapeseeds etc. has a median diameter of approx. 48 µm, etc.

First, as comparing FIG. 25(a)-FIG. 25(d) and FIG. 24 with each other, a similar tendency is found between the electromagnetic shielding characteristics of those. Specifically, all charts show a tendency of improving its electromagnetic shielding effectiveness up to approx. 500 [MHz] as the content of burned material against rubber increases.

In addition, when the content of burned plant material is 400 [phr], it is found that the electromagnetic shielding effectiveness exceeds 30 [dB] as the maximum value in all charts. Furthermore, it is also found that the electromagnetic shielding effectiveness shows a small peak in the frequency band of 700 [MHz]-1000 [MHz].

FIG. 26(a)-FIG. 26(c) show a chart indicating the measurement results of the electromagnetic shielding characteristics when the production conditions etc. for the burned material of soybean hulls have been changed. In FIG. 26(a)-FIG. 26(c), the lateral axis and vertical axis indicate frequency [MHz] and electromagnetic shielding effectiveness [dB] respectively.

Figure 26:
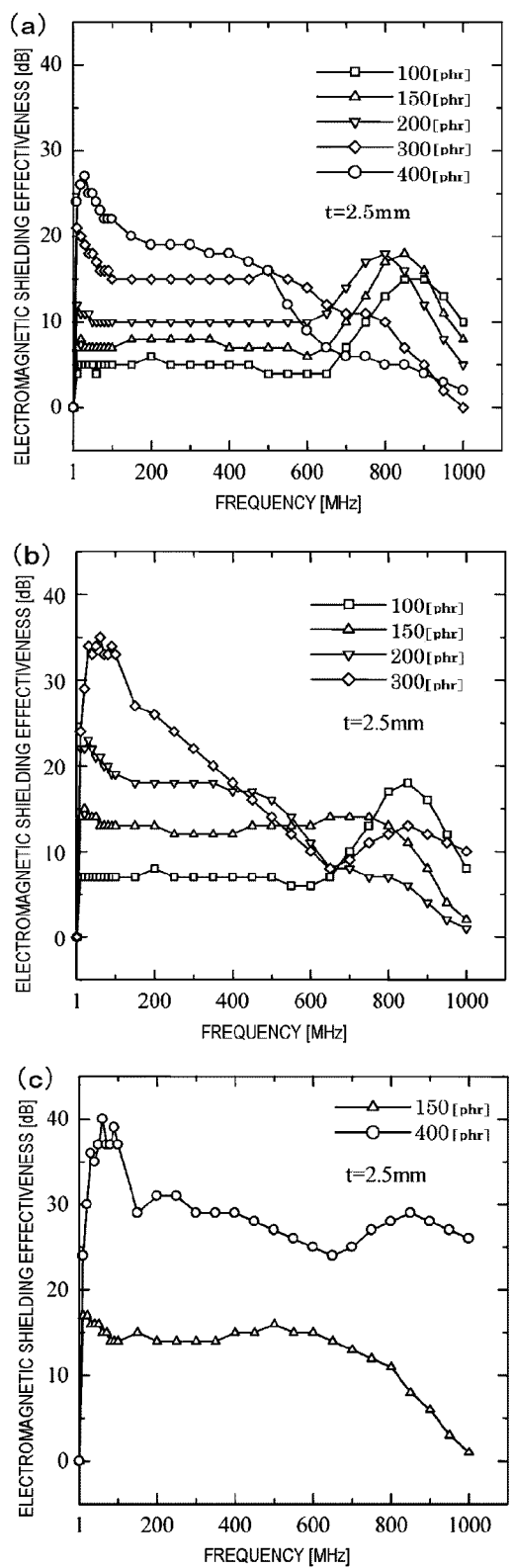
FIG. 26 shows charts indicating the measurement results of the electromagnetic shielding characteristics when the production conditions etc. for the burned material of soybean hulls have been changed.

FIG. 26(a) shows a chart in which the burning temperature stayed at 900 [° C.] and then the burned material of soybean hulls was pulverized, while FIG. 26(b) shows a chart in which the burning temperature for soybean hulls was set to 1500 [° C.] (to be exact, the material was once burned at 900 [° C.], and then burned again at 1500 [° C.]. Otherwise the same) and was not pulverized, and while FIG. 26 (c) shows a chart in which the burning temperature for soybean hulls was set to 3000 [° C.] (to be exact, the material was once burned at 900 [° C.], and then burned again at 3000[° C.]. Otherwise the same) and was not pulverized.

As shown in FIG. 26(a), when the burned material of soybean hulls was pulverized, the electromagnetic shielding effectiveness generally tends to be reduced in comparison with those not pulverized regardless of the content of burned material against rubber. As seen in detail, when the content of burned plant material against rubber was 400 [phr], it was found that the electromagnetic shielding effectiveness only reaches about 25 [dB] as the maximum value. In contrast, those burned at 900° C. and not pulverized as shown in FIG. 1 exceeds 40 [dB]. Therefore, you could say that the electromagnetic shielding effectiveness improves as the grain size of burned material increases.

As shown in FIG. 26(b), when the burning temperature for soybean hulls was set to 1500 [° C.], it was confirmed that the electromagnetic shielding effectiveness is similar to the case of setting the burning temperature for soybean hulls shown in FIGS. 24 to 900 [° C.]. In other words, even if the burning temperature for soybean hulls was set to 1500 [° C.], no significant improvement was observed in the electromagnetic shielding effectiveness.

As shown in FIG. 26(c), when the burning temperature for soybean hulls was set to 3000 [° C.], it was confirmed that setting the content of the burned material of soybean hulls against rubber to 400 [phr] allows to obtain a stable electromagnetic shielding effectiveness. That means, the electromagnetic shielding effectiveness was significantly reduced from approx. 150 [MHz] towards approx. 600 [MHz] in the chart of FIG. 24, while only a gentle reduction (may be seen as almost level) was confirmed in the chart of FIG. 26. As more easily seen in comparison with the chart in FIG. 26(b), it was confirmed that the electromagnetic shielding effectiveness improves when the content of the burned material is set to 150 [phr] against rubber.

Furthermore, according to FIG. 26(c), it is worth noting that an electromagnetic shielding effectiveness of over approx. 25 [dB] is obtained in a wide frequency band up to 1000 [MHz]. As described above, the electromagnetic shielding effectiveness of existing general products mostly falls in the range of 5 [dB]-25 [dB]. However, existing products can achieve the electromagnetic shielding effectiveness of 25 [dB] only in a limited frequency band, and none of those can achieve it in a wide frequency band up to 1000 [MHz]. Thus, the electrically conductive composition of this embodiment performs a significant effect.

Hereinafter, the electrically conductive composition of this embodiment is described in further detail.

Figure 2:
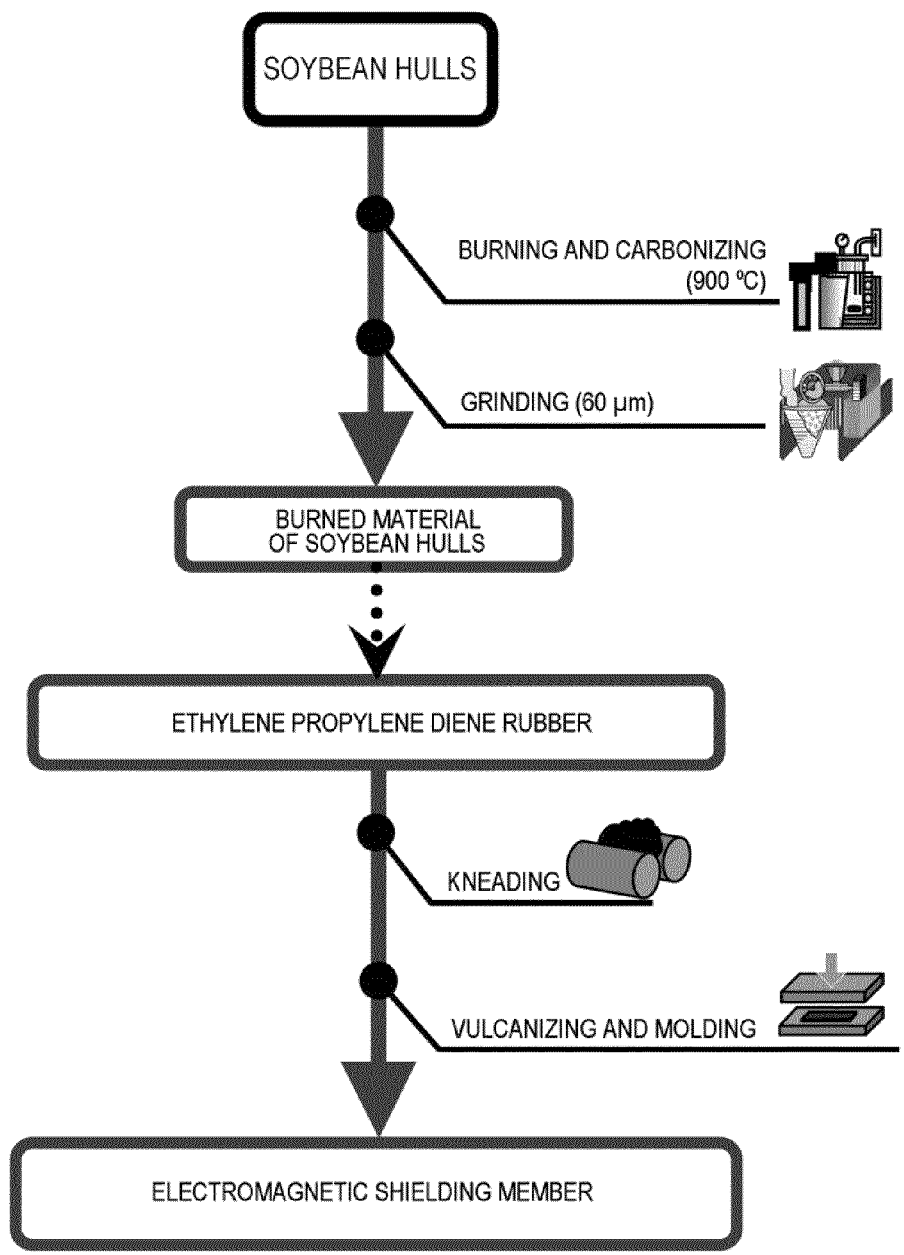
FIG. 2 shows a schematic production process diagram of the electrically conductive composition of this embodiment.

FIG. 2 shows a schematic production process diagram of the electrically conductive composition of this embodiment. First, raw soybean hulls caused by producing a food oil etc. are set in a carbonization apparatus, and are then heated at the rate of approx. 2 [° C.] per minute in a nitrogen gas atmosphere to reach a prescribed temperature such as 700 [° C.]-1500[° C.] (for example, 900 [° C.]). Then the carbonization process is provided for about 3 hours at the attained temperature.

Next, the burned soybean hulls are ground and sieved to obtain a burned material of soybean hulls with a median diameter of, for example, approx. 4 µm to approx. 80 µm (for example, 60 µm). Subsequently, the burned material of soybean hulls and ethylene propylene diene rubber are set in a kneading machine together with various additives and are then given a kneading process. Then, the kneaded material is given a molding process, and is then given a vulcanization process. In this way, the production of electrically conductive composition completes.

Here, the electromagnetic shielding member of this embodiment can be formed by using a metal mold with a required shaped etc. Therefore, even if an electronic substrate mounted on an electronic appliance requires an electromagnetic shielding member and does not have a planer shape, an electromagnetic shielding member corresponding to the shape of the electronic substrate can be produced.

However, the electromagnetic shielding member of this embodiment also has a degree of freedom to process cutting and vending, etc. This point is also advantageous in the production of electromagnetic shielding members.

Today, due to space-saving inside the case of electronic appliance accompanied by the downsizing of electronic appliances in late years, there are problems such as a difficulty in using a platy electromagnetic shielding member, or necessity for a layout of electronic appliance considering the space allocation for a platy electromagnetic shielding member. Since the electromagnetic shielding member of this embodiment can be formed into a shape corresponding to the shape of the space inside electronic appliance, it also causes a secondary effect of not requiring a product layout etc. considering the space allocation for a platy electromagnetic shielding member.

The electrically conductive composition of this embodiment can be preferably used for electronic appliance, inspection apparatus for electronic appliance and building material, etc. That means, the electrically conductive composition of this embodiment can be provided for a communication terminal body such as a mobile phone and PDA (Personal Digital Assistant), etc., or can be mounted on an electronic substrate built in a communication terminal body, or can be provided for a so-called shield box, or can be provided for roof material, floor material or wall material, etc., or can be used for a part of work shoes and work clothes as an anti-static material due to its conductivity.

As a result of this, there are advantageous effects of making it possible to eliminate a cause for concern about adverse impact on human body from the electromagnetic waves generated from mobile phones etc. or power cables etc. around houses, to provide a light-weight shield box, and to provide work shoes etc. having anti-static capability.

Figure 13:
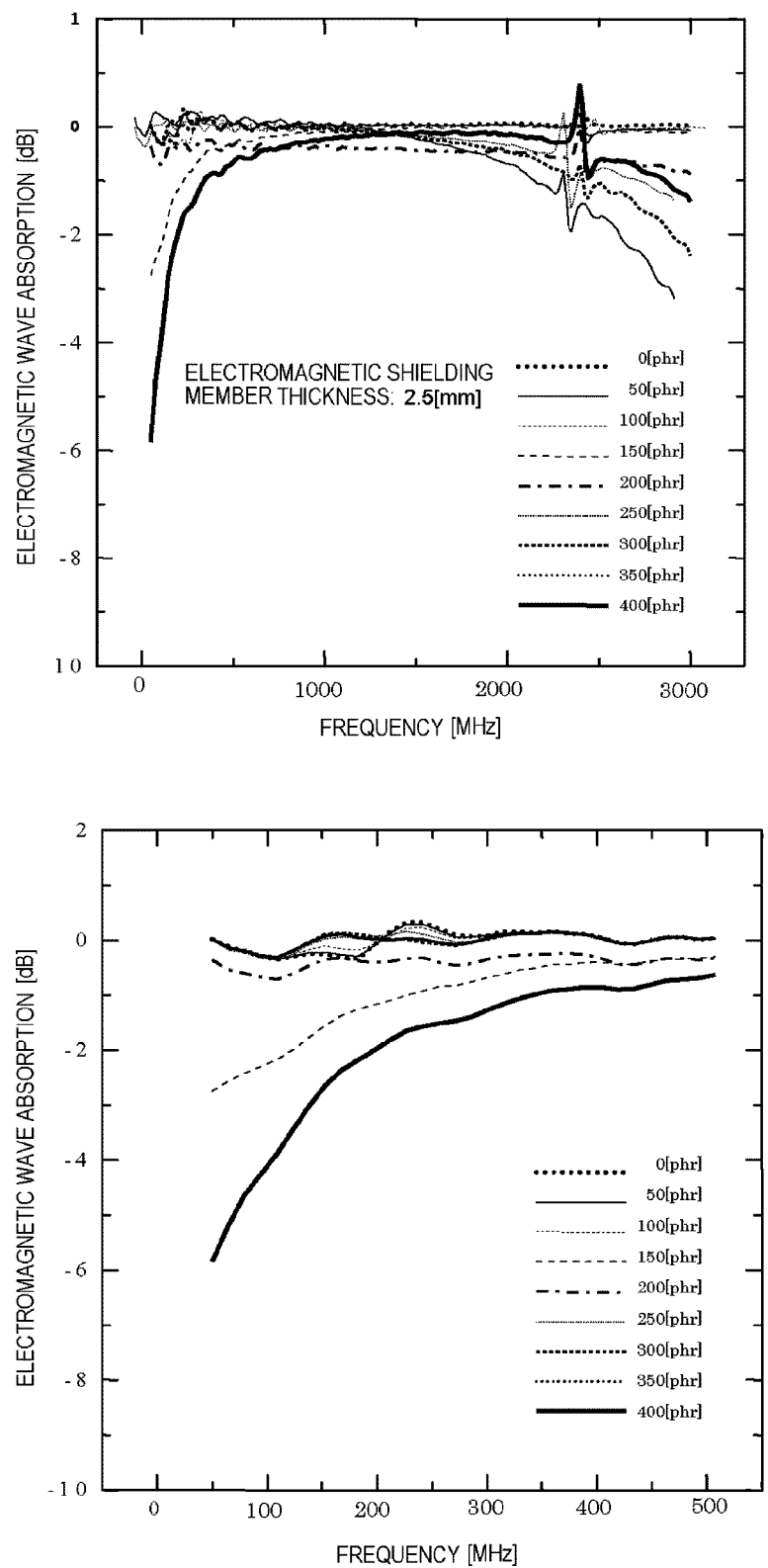
FIG. 13 shows a chart indicting the electromagnetic wave absorption characteristics of the "electrically conductive composition".

More specifically, as shown in FIG. 13, the electrically conductive composition of this embodiment can obtain excellent electromagnetic wave absorption characteristics, for example, in a frequency band of around 50 [MHz]-300 [MHz] by accordingly adjusting the production conditions.

In addition, as shown in FIG. 1, the electrically conductive composition of this embodiment can achieve an electromagnetic shielding effectiveness of over 20 [dB] in a frequency band of 500 [MHz] and below by accordingly adjusting the production conditions. Thus, there is an advantageous effect of making it possible to provide a shield box useful in the frequency band of 500 [MHz] and below.

Next, the following measurements etc. have been carried out for "raw soybean hulls", "burned material of soybean hulls", and "electrically conductive composition".

(1) Component analysis of the "raw soybean hulls" and "burned material of soybean hulls", (2) Tissue observation of the "raw soybean hulls" and "burned material of soybean hulls", (3) Conductivity test for the "burned material of soybean hulls", (4) Regarding the "electrically conductive composition", measurement of the surface resistivity by different burning temperatures or median diameters for the electrically conductive composition of the test object.

Figure 3:
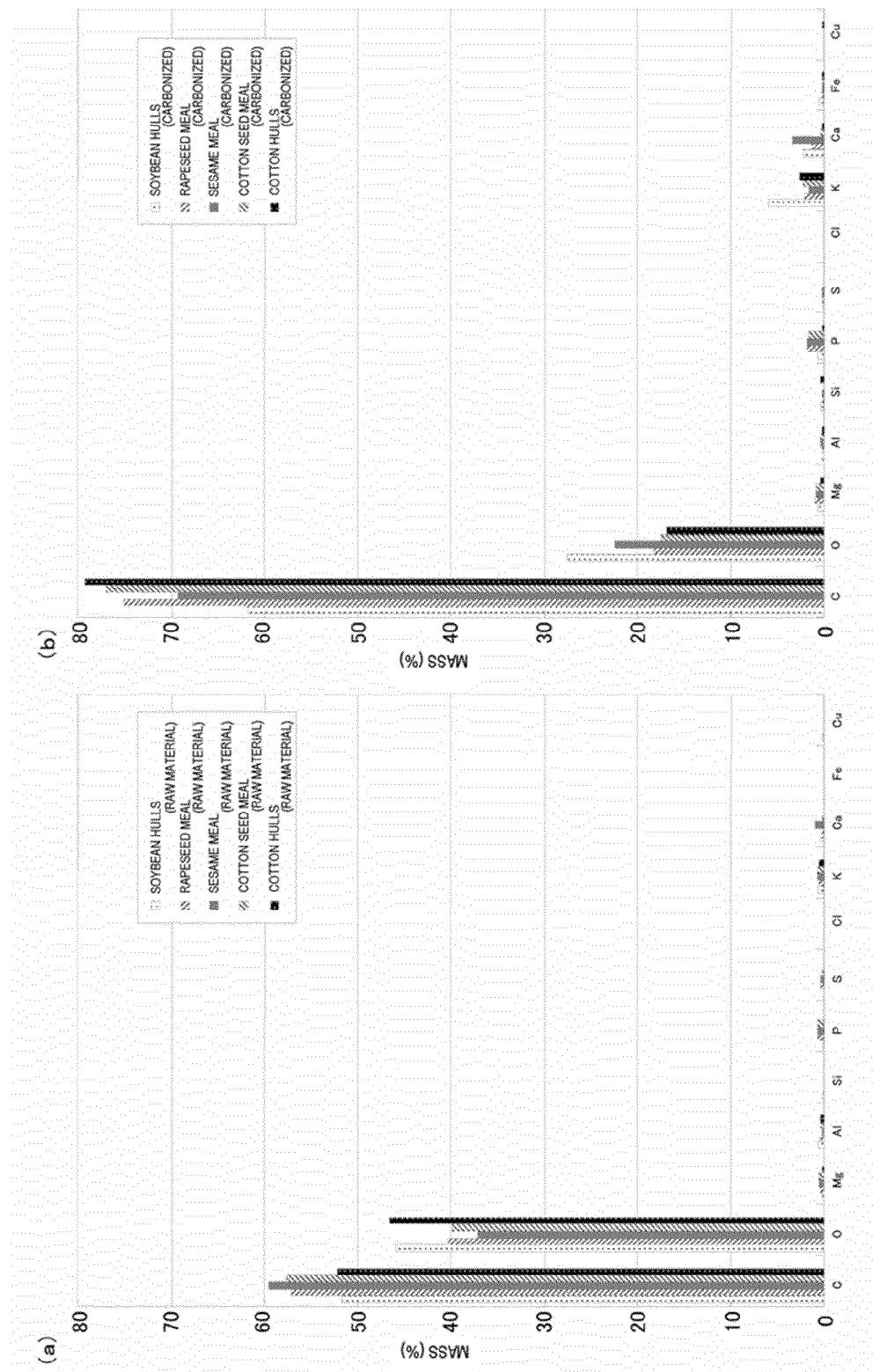
FIG. 3 shows charts indicating the results of component analysis based on the ZAF quantitative analysis method for soybean hulls etc. before and after burning.

FIG. 3(*a*) shows a chart indicating the result of the component analysis based on the ZAF quantitative analysis method for soybean hulls, rapeseed meal, sesame meal, and cotton seed meal, and cotton hulls before burning. FIG. 3(*b*) shows a chart indicating the result of the component analysis based on the ZAF quantitative analysis method for soybean hulls etc. shown in FIG. 3(*a*) after burning. Although the production conditions for the burned material of soybean hulls etc. are as shown in FIG. 2, the "prescribed temperature" and "median diameter" were respectively set to 900 [° C.] and approx. 30 μm-approx. 60 μm. Since it has been said that the ZAF quantitative analysis method is quantitatively less reliable regarding C, H and N elements in comparison with the organic element analysis method, an analysis based on the organic element analysis method was also performed separately in order to perform a highly reliable analysis regarding C, H and N elements. The details of this point are described later.

The soybean hulls before burning shown in FIG. 3(*a*) are composed of the carbon (C) component and oxygen (O) component roughly half-and-half, respectively at 51.68% and 45.98%. Inorganic components etc. account for the rest of 2.35%.

Similar to the soybean hulls before burning, the rapeseed meal etc. before burning are composed of the carbon (C) component and oxygen (O) component roughly half-and-half. As seen in detail, it has been found that "C" shown in FIG. 3(*a*) accounts for 50%-60% for all plants. It has also been found that these five kinds of plants are rich in "O" second only to "C".

In addition, as shown in FIG. 3(*b*), the soybean hulls after burning had its carbon (C) component increased by a factor of nearly 1.5 from those before burning. Specifically, it became 61.73% in the soybean hulls after burning.

In addition, the oxygen (O) component in the soybean hulls after burning was decreased to nearly half by burning. Although others have been variously changed (ranging from that reduced to half to that increased by a factor of 5), any of the changes were within several % of the total. It has also been read that the rapeseed meal etc. after burning somewhat tends to increase the carbon (C) component and to reduce the oxygen (O) component just like the soybean hulls after burning. Regarding the measurement target elements, none of them showed a distinctive change in quantity except for "C" and "O" for all plants, just like the case of soybean hulls.

Regarding soybean hulls, when the burning temperature was set to 1500 [° C.], "C" was increased to 75.25%, "H" was decreased to 0.51%, and "N" was decreased to 0.96%. Furthermore, regarding soybean hulls, when the burning temperature was set to 3000 [° C.], "C" was increased to 99.92%, "H" was decreased to 0.00%, and "N" was decreased to 0.03%.

However, the results of the component analysis shown in FIG. 3 are from those produced in the procedure and conditions shown in FIG. 2, and thus it should be noted that the carbon content etc. also varies depending on the burning temperature for soybean hulls etc. as shown in the above example. The details of this point are described later.

Figure 28:
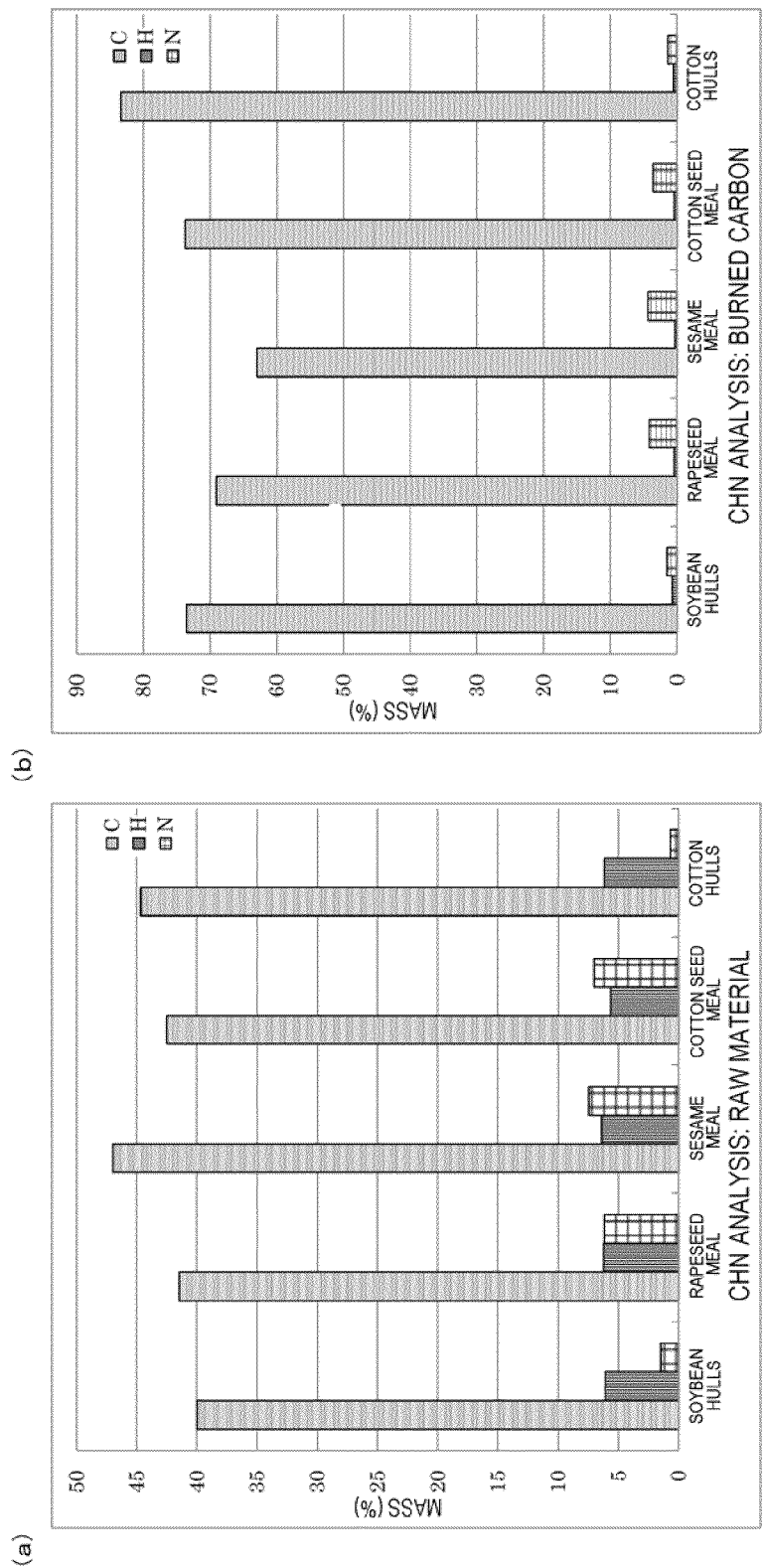
FIG. 28 shows charts indicating the result of the component analysis based on the organic element analysis method corresponding to FIG. 3.

FIG. 28(*a*) shows a chart indicating the result of the component analysis based on the organic element analysis method corresponding to FIG. 3(*a*). FIG. 28(*b*) shows a chart indicating the result of the component analysis based on the organic element analysis method corresponding to FIG. 3(*b*).

As seen in FIG. 28(*a*) and FIG. 28(*b*), the ratios of organic elements included in five kinds of plants can generally be evaluated as similar to each other. This is considered to be attributable to the fact that soybean hulls and rapeseed meal etc. are no more than plants. However, since rapeseed meal, sesame meal and cotton seed meal have the common feature of being oil meal, it is perceived that those charts are similar to each other. Specifically, it is perceived that "N" is relatively high while the increase rate in "C" before and after burning is relatively low.

In contrast, since soybean hulls and cotton hulls have the common feature of being hulls, it is perceived that those charts are similar to each other. Specifically, it is perceived that "N" is relatively low while the increase rate in "C" before and after burning is relatively high. In addition, in terms of "C", cotton hulls are the highest (approx. 83%), while sesame meal is the lowest (approx. 63%).

As individually seen, according to the component analysis based on the organic trace element analysis method, the soybean hulls before burning had the carbon (C) component, hydrogen (H) component and nitrogen (N) component of respectively 39.98%, 6.11% and 1.50%. Thus, it has been found that the soybean hulls before burning are essentially rich in the carbon component. In addition, it is seen in FIG. 28(*a*) that other plants such as rapeseed meal etc. are also essentially rich in the carbon component before burning.

In contrast, according to the component analysis based on the organic trace element analysis method, the soybean hulls after burning had the carbon (C) component, hydrogen (H) component and nitrogen (N) component of respectively 73.57%, 0.70% and 1.55%. Thus, it has been found that the carbon component has been increased by burning. In addition, it is seen in FIG. 28(*b*) that other plants such as rapeseed meal etc. also have increased the carbon component by burning.

Mainly regarding rice bran and rice hulls explained in the after-mentioned Embodiment 2, the component analysis was carried out for those before and after burning. In comparison with soybean hulls, rice bran contains K, Ca and P as an inorganic component, while rice hulls contain Si as an inorganic component.

Figure 4:
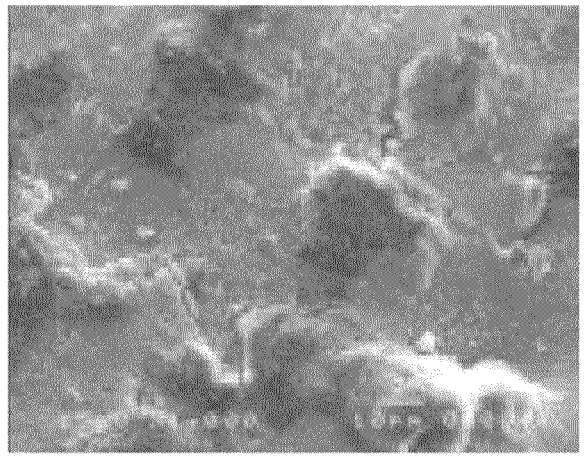
FIG. 4 shows SEM pictures indicating the result of the tissue observation of "raw soybean hull".
Figure 4:
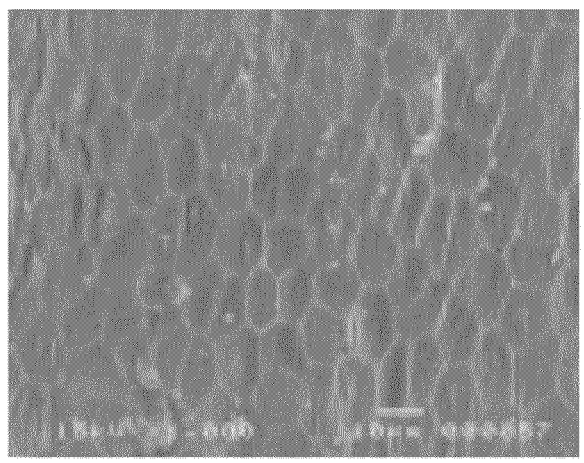
Figure 4:
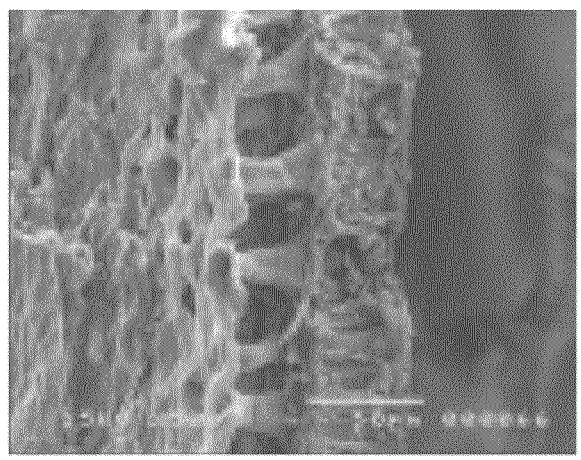

FIG. 4 shows Scanning Electron Microscope (SEM) pictures indicating the result of the tissue observation of "raw soybean hull". FIG. 4(a)-FIG. 4(c) respectively show a picture of the outer skin of a "raw soybean hull" taken at a magnification of 1000, a picture of the inner skin taken at a magnification of 1000, and a picture of the cross-section taken at a magnification of 500. The cross-section refers to an approximately orthogonal cross-section near the boundary face between the outer skin and the inner skin.

The outer skin of the raw soybean hull shown in FIG. 4(a) functions to somehow block the moisture between the outside and the inner skin. As far as this picture of the outer skin is seen, depressions and projections seem to be scattered around the surface in the overall shape.

The inner skin of the raw soybean hull shown in FIG. 4(b) has a net-like structure. As long as this picture of the inner skin is seen, a gentle undulation with less elevation differences is seen in the overall shape.

As far as this picture of the cross-section is seen, the cross-section of the raw soybean hull shown in FIG. 4(c) seems to have a plurality of columnar structures wherein one end is attached to the outer skin and the other end is attached to the inner skin.

Figure 5:
FIG. 5 shows SEM pictures indicating the result of the tissue observation of the "burned material of soybean hull".
Figure 5:
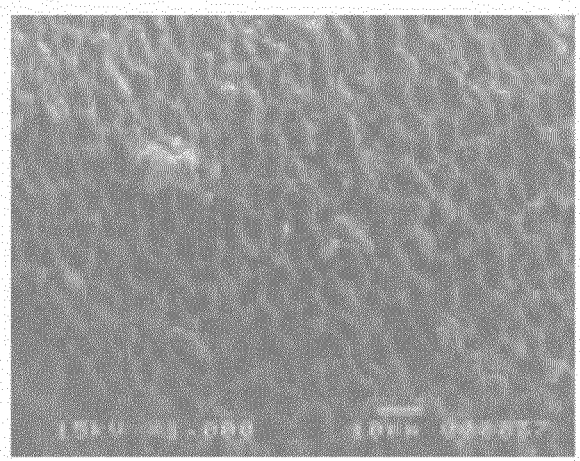
Figure 5:
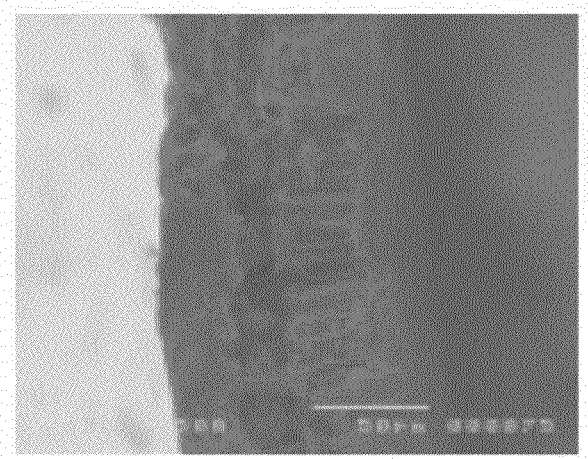

FIG. 5 shows SEM pictures indicating the result of the tissue observation of the "burned material of soybean hull". FIG. 5(a)-FIG. 5(c) respectively show a picture of the outer skin of the "burned material of soybean hull" taken at a magnification of 1000, a picture of the inner skin taken at a magnification of 1000, and a picture of the cross-section taken at a magnification of 500. Here, this soybean hull was burned at a burning temperature of 900 [° C.].

As in the overall shape, the outer skin of the burned material of soybean hull shown in FIG. 5(a) seems to have no depressions and projections, which have been seen in the "raw soybean hull". However, the outer skin of the "burned material of soybean hull" was rough.

Although the inner skin of the burned material of soybean hull shown in FIG. 5(b) still shows a net-like structure, the net became finer due to the moisture loss. The inner skin of the "burned material of soybean hull" can also be evaluated as having a squashed net-like structure.

Although the cross-section of the burned material of soybean hull shown in FIG. 5(c) still shows columnar structures, each columnar part has been narrowed with a reduced height, and the gaps have been significantly decreased. The columnar parts also seem to be squashed and changed into a fiber-like form.

Figure 29:
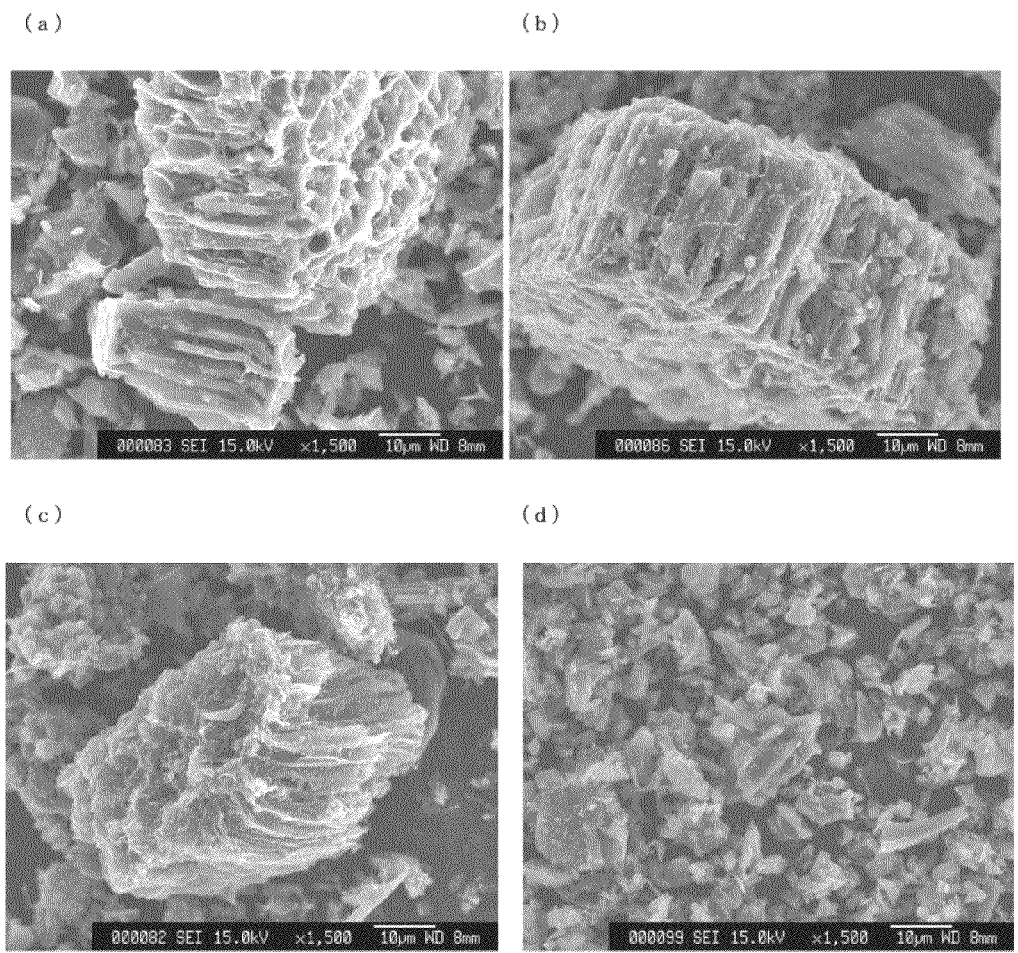
FIG. 29 shows SEM pictures of the "burned material of soybean hull".

FIG. 29 shows SEM pictures of the "burned material of soybean hull". FIG. 29(a)-FIG. 29(c) show an SEM picture of the "burned material of soybean hulls" that was burned at a burning temperature of 900 [° C.], 1500[° C.] and 3000 [° C.] respectively, while FIG. 29(d) shows a SEM picture of the "burned material of soybean hulls" that was burned at a burning temperature of 900 [° C.] and was then pulverized. All of SEM pictures were taken at a magnification of 1500.

As shown in FIG. 29(a)-FIG. 29 (c), all of these pictures indicate a columnar structure, that is, porous structure, in the "burned material of soybean hull". However, as an impression, each columnar part seems to be thinner and shrunk as the burning temperature increases. This is considered to be attributable to the fact that the carbonization progresses as the burning temperature increases.

As shown in FIG. 29(d), the pulverized burned material of soybean hulls mostly has a particle size of approx. 10 μm or below. This corresponds to the condition that the median diameter of the pulverized burned material of soybean hulls becomes approx. 1/10 of the median diameter before pulverization. Specifically, the burned material shown in FIG. 29(d) had a median diameter of approx. 6.9 μm.

Figure 27:
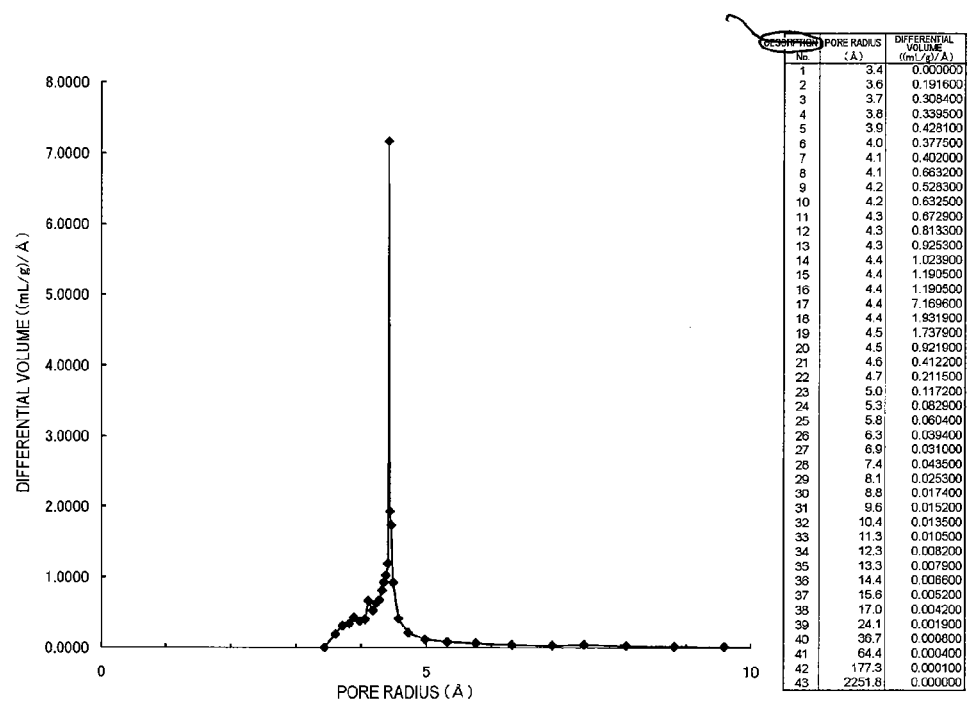
FIG. 27 shows a chart of the pore size distribution curve in the gas adsorption process for the burned material of soybean hulls burned at a temperature of 900 [° C.].

FIG. 27 shows a chart of the pore size distribution curve in the gas adsorption process for the burned material of soybean hulls burned at a temperature of 900 [° C.]. The lateral axis and vertical axis of FIG. 27 respectively represent the pore radius (Å) and the differential volume ((mL/g)/Å). The median diameter of the burned material of soybean hulls was approx. 34 μm.

It should be noted that the burned material of soybean hulls at least shows a sole sharp peak in the differential volume at a specific pore radius that is rarely seen in the burned materials of other plants in consideration of the verification results for the burned material of soybean hulls that was burned at a temperature of 1500 [° C.] or 3000 [° C.] as described below.

Normally, the burned materials of other plants rarely show a single sharp peak at a specific pore radius in the differential volume, and rather the chart of the pore size distribution curve results in broad, or several peaks appear in the chart of the pore size distribution curve.

The pore size of the burned material of soybean hulls burned at a temperature of 900 [° C.] as shown FIG. 27 shows a sharp peak in the differential volume at a pore radius of approx. 4.42 Å. See the chart in FIG. 27 for the detailed measurement results about other pore radiuses and differential volumes. In addition, the burned material of soybean hull still has a porous structure with a large specific surface area even after the graphitization process.

Figure 41:
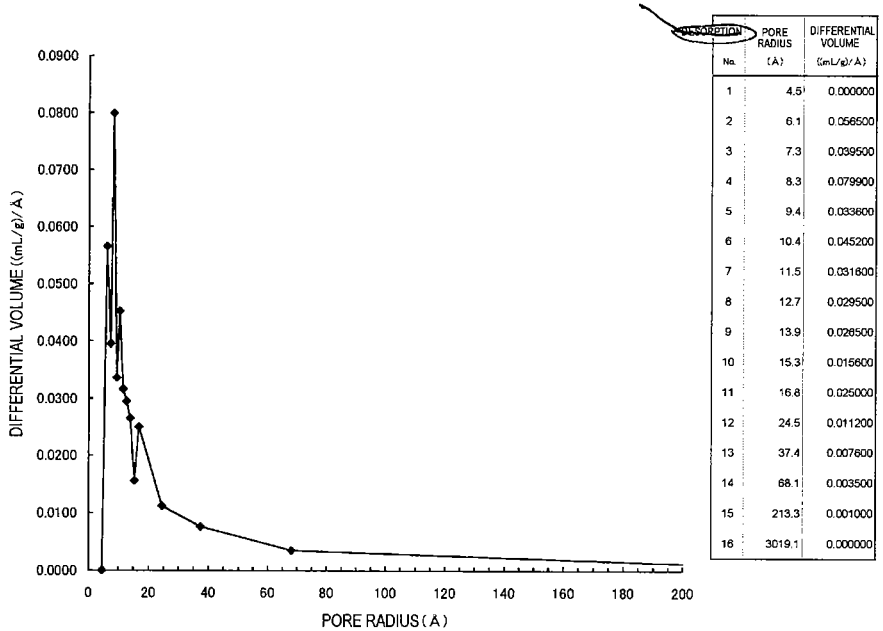
FIG. 41 shows a chart of the pore size distribution curve in the gas adsorption process for the burned material of soybean hulls burned at a temperature of 1500 [° C.].

FIG. 41 shows a chart of the pore size distribution curve in the gas adsorption process for the burned material of soybean hulls burned at a temperature of 1500 [° C.]. The lateral axis and vertical axis of FIG. 41 respectively represent the pore radius (Å) and the differential volume ((mL/g)/Å). The median diameter of the burned material of soybean hulls was approx. 27 μm.

Here, the differential volume also shows a peak at a specific pore radius.

The pore size of the burned material of soybean hulls burned at a temperature of 1500 [° C.] showed a less sharp peak in the differential volume at a pore radius of approx. 8.29 Å, but the peak was still somewhat sharp. However, the pore distribution has become wider in the range of about 30 Å. See the chart in FIG. 41 for the detailed measurement results.

Figure 42:
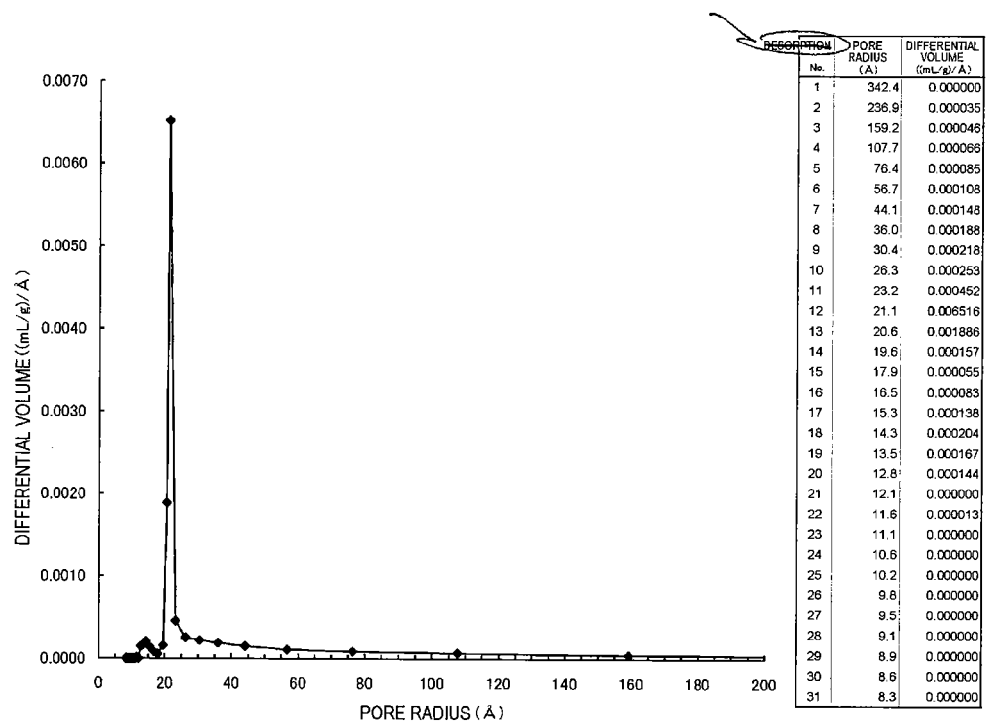
FIG. 42 shows a chart of the pore size distribution curve in the gas desorption process for the burned material of soybean hulls burned at a temperature of 3000 [° C.].

FIG. 42 shows a chart of the pore size distribution curve in the gas desorption process for the burned material of soybean hulls burned at a temperature of 3000 [° C.]. The lateral axis and vertical axis of FIG. 42 respectively represent the pore radius (Å) and the differential volume ((mL/g)/Å). The median diameter of the burned material of soybean hulls was approx. 24 μm. Here, the differential volume also shows a sharp peak at a specific pore radius. In the case of gas adsorption process, it was found that the pore size of the burned material of soybean hulls burned at a temperature of 3000 [° C.] showed a sharp peak in the differential volume at a pore radius of approx. 4.41 Å. However, in the case of gas adsorption process, a broad small peak was found at a pore radius of around 14.3 Å. See the chart in FIG. 42 for the detailed measurement results.

Figure 43:
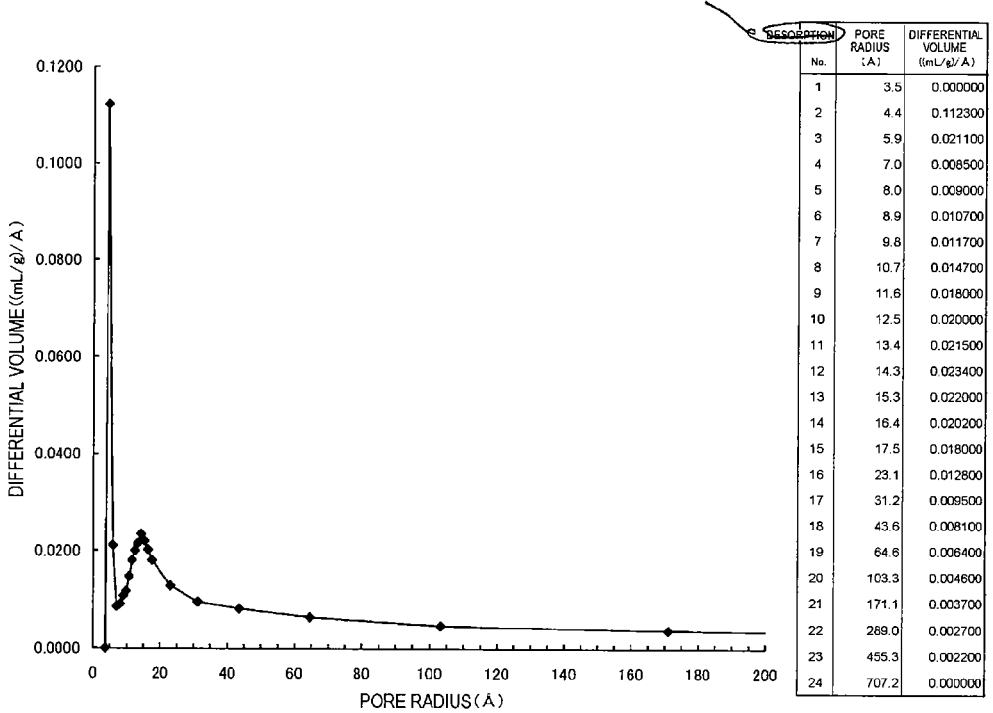
FIG. 43 shows a chart of the pore size distribution curve in the gas adsorption process for the burned material of soybean hulls burned at a temperature of 3000 [° C.].

FIG. 43 shows a chart of the pore size distribution curve in the gas adsorption process for the burned material of soybean hulls burned at a temperature of 3000 [° C.]. Here, the differential volume also shows a sharp peak at a specific pore radius. In the case of gas desorption process, it was found that the pore size of the burned material of soybean hulls burned at a temperature of 3000 [° C.] showed a sharp peak in the differential volume at a pore radius of approx. 21.1 Å. See the chart in FIG. 43 for the detailed measurement results.

As described above, it is found that the burned material of soybean hulls has a very rare characteristic of showing a peak in the differential volume at a specific pore radius regardless of the burning temperature.

Figure 30:
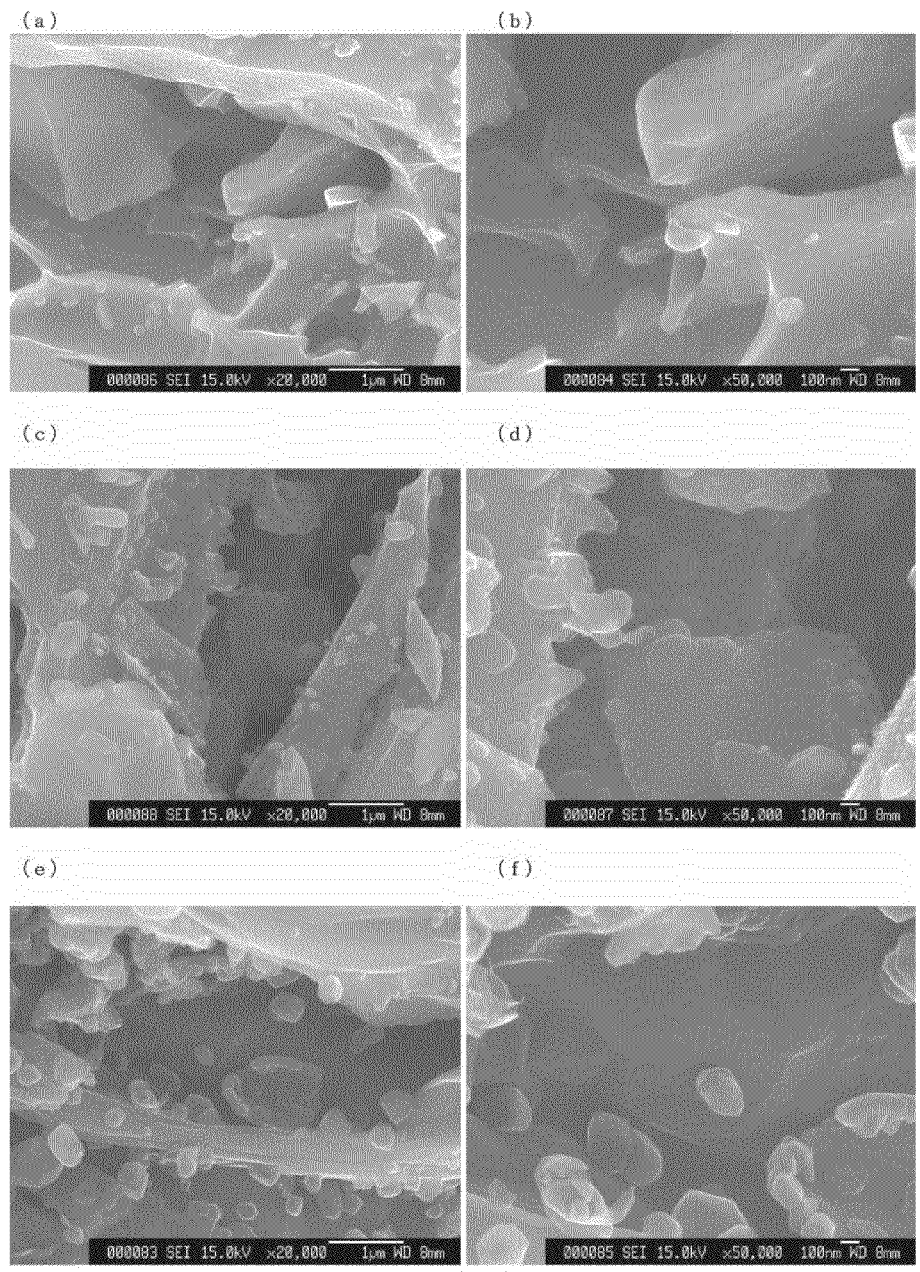
FIG. 30 shows SEM pictures of the "burned material of soybean hulls" according to FIG. 29 at a magnification of 20,000 and 50,000 respectively.

FIG. 30(a) and FIG. 30(b) show a SEM picture of the "burned material of soybean hulls" according to FIG. 29(a) at a magnification of 20,000 and 50,000 respectively. FIG. 30(c) and FIG. 30(d) show a SEM picture of the "burned material of soybean hulls" according to FIG. 29(b) at a magnification of 20,000 and 50,000 respectively. FIG. 30(e) and FIG. 30(f) show a SEM picture of the "burned material of soybean hulls" according to FIG. 29(c) at a magnification of 20,000 and 50,000 respectively.

Interestingly, the burned material of soybean hulls has granular substances attached to the surface. Furthermore, these substances increase the number and the size as the burning temperature for the burned material of soybean hulls increases. It could not be specified that whether these substances were something like crystal growth, or something like carbon nanotubes, or otherwise neither of these, and this kind of phenomenon has not been confirmed in any other plants.

In addition, as seen in FIG. 30(a)-FIG. 30(f), the burned material of soybean hulls clearly shows a porous structure. When the crystallite size of the burned material of soybean hulls was measured by X-ray diffraction, it was found that the one in FIG. 29(a) had approx. 1 nm-approx. 3 nm, and the one in FIG. 29(b) and FIG. 29(c) had approx. 20 nm.

Figure 6:
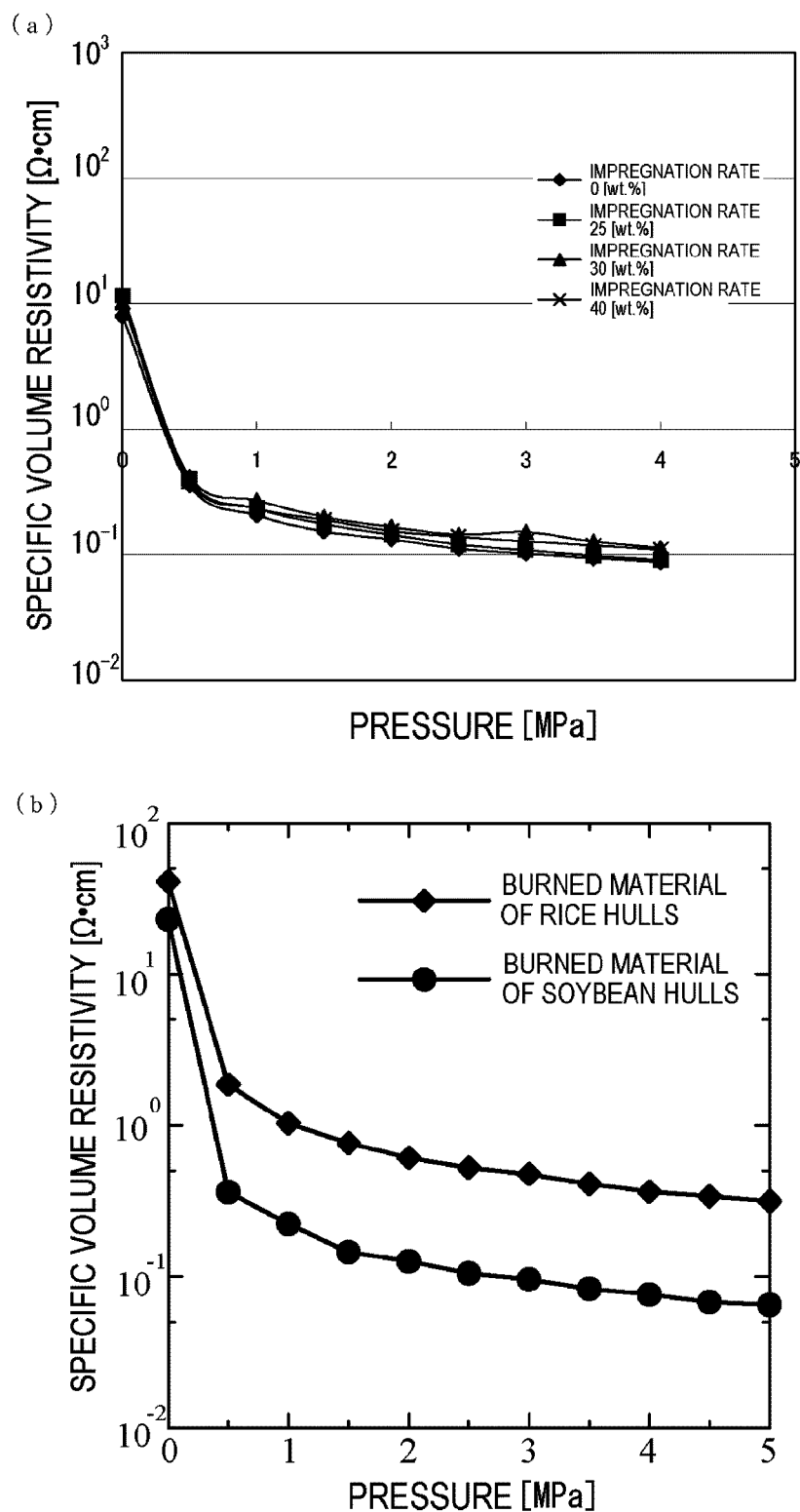
FIG. 6 shows charts indicating the test results of the conductivity test regarding the "burned material of soybean hulls".

FIG. 6 shows charts indicating the test results of the conductivity test regarding the "burned material of soybean hulls". The lateral axis and vertical axis of FIG. 6 respectively represent the pressure [MPa] applied to the burned material of soybean hulls and the specific volume resistivity [Ω·cm]. As comparative examples, the impregnation rate of phenol resin to raw soybean hulls was set to 0 [wt. %], 25 [wt. %], 30 [wt. %] and 40[wt. %], and the burned materials of respective soybean hulls were used as test objects. FIG. 6(b) shows a test result of rice hulls burned material as another embodiment, along with the conductivity test for the burned material of soybean hulls. The conductivity test was carried out in compliance with JIS-K7194. The production conditions for both "burned material of soybean hulls" and burned material of rice hulls in FIG. 6(a) and FIG. 6(b) were set as a burning temperature of 900[° C.] and a median diameter of 60 μm.

The method employed was that, 1 g of the powdered "burned material of soybean hulls" as a measuring object was put in a cylindrical container with an inner diameter of approx. 25Φ, and a cylindrical brass with a diameter of approx 25Φ was aligned to the opening part of the above container, and then a press machine (MP-SC manufactured by Toyo Seiki Seisaku-Sho, Ltd.) was used to apply pressure to the burned material of soybean hulls by pressing via the brass from 0 [MPa] to 4 [MPa] or 5 [MPa] with an increment of 0.5 [MPa] so that the specific volume resistivity was measured by bringing the side part and bottom part of the brass into contact with a probe of a low resistivity meter (Loresta-GP MCP-T600 manufactured by DIA Instruments Co. Ltd.) while the burned material of soybean hulls was pressured.

When a cylindrical container with approx. 10Φ was used instead of the cylindrical container with approx. 25Φ, and a cylindrical brass with a diameter of approx. 10Φ was used instead of the cylindrical container with a diameter of approx. 25Φ, and when the rest of the conditions were the same as above, an equivalent test result was obtained by the conductivity test.

According to the test result shown in FIG. 6(a), it is found that the burned material of soybean hulls reduces its specific volume resistivity (that is, increasing the conductivity) as the pressure increases, regardless of high or low of the impregnation rate of phenol resin to raw soybean hulls.

Furthermore, according to the test result of FIG. 6(a), the conductivity of the burned material of soybean hulls is not much affected by the impregnation rate of phenol resin. Furthermore, when the burned material of soybean hulls is under no pressure (0 [MPa]), its specific volume resistivity is approx. $10^{1.0}$[Ω·cm], while it is under a pressure of 0.5 [MPa], its specific volume resistivity is approx. $10^{-0.4}$[Ω·cm], and subsequently even if it is under a pressure of up to 4.0 [MPa], its specific volume resistivity stays at approx. $10^{-1.0}$ [Ω·cm]. Therefore, the burned material of soybean hulls can be evaluated as reducing the specific volume resistivity provided that a certain pressure is applied, however it is not showing enough reduction to say significant in the specific volume resistivity by the further pressure increase.

According to FIG. 6(b), it is found that the specific volume resistivity of the burned material of soybean hulls is lower than that of the burned material of rice hulls both under no pressure and under pressure, while the burned material of soybean hulls is lower in conductivity. The conductivity of the burned material of soybean hulls shown in FIG. 6(b) is about the same as that of carbon black.

In fact, although there is exactly three times difference, for example, between the specific volume resistivity of $1.0 \times 10^{-1}$[Ω·cm] and the specific volume resistivity of $3.0 \times 10^{-1}$ [Ω·cm], such a degree of exactness is not required in the measurement results of the specific volume resistivity as it is clearly known by those skilled in the art. Thus, since the specific volume resistivity of $1.0 \times 10^{-1}$[Ω·cm] and the specific volume resistivity $3.0 \times 10^{-1}$[Ω·cm] both are on the same order of "$10^{-1}$", those can be evaluated as equivalent to each other.

In addition, in view of the evaluation of FIG. 6, since there is a possibility that phenol resin does not effectively impregnate into soybean hulls, there is room to improve the conductivity of the burned material of soybean hulls by applying a pre-processing such as provisional burning for soybean hulls or pulverizing prior to phenol resin impregnation for raw soybean hulls etc. so as to facilitate the permeation of phenol resin into soybean hulls.

As a summary of the above, it is found that the burned plant material of this embodiment has a characteristic of increasing its conductivity by applying a pressure of, for example, 0.5 [MPa] or above.

Figure 31:
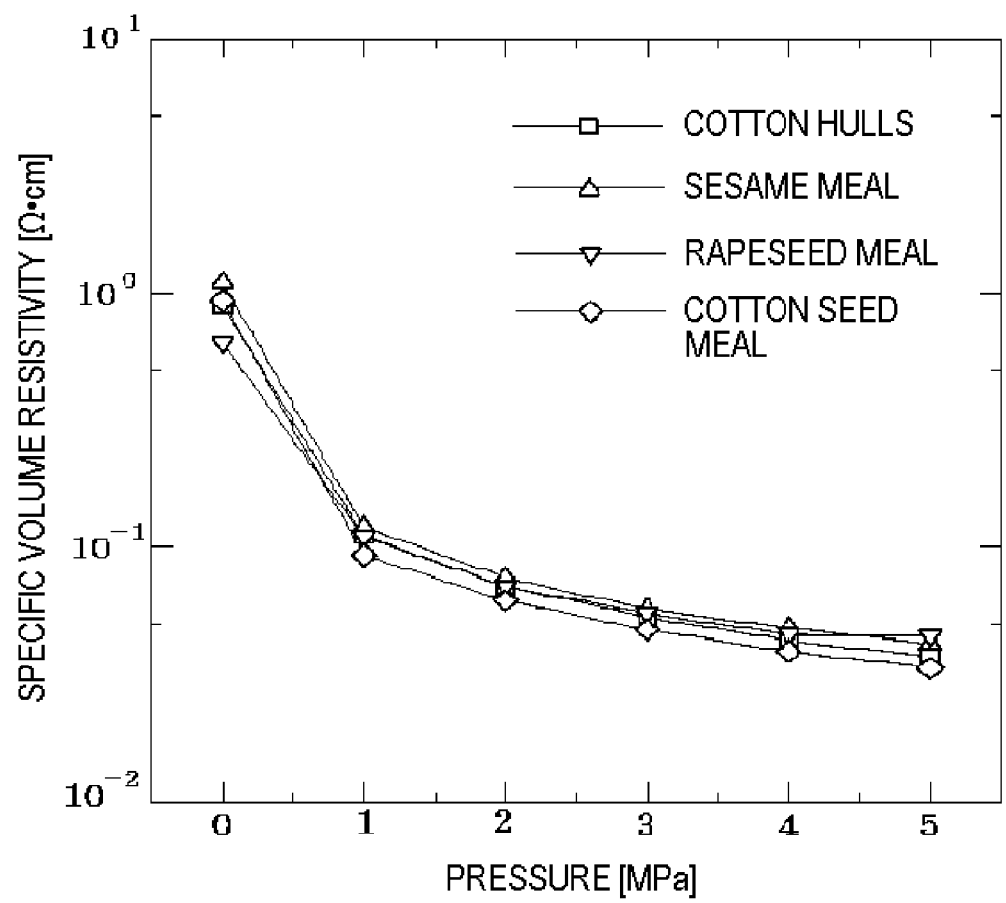
FIG. 31 shows a chart indicating the test results of the conductivity test regarding the burned materials of cotton hulls, sesame meal, rapeseed meal and cotton seed meal.

FIG. 31 shows a chart indicating the test results of the conductivity test regarding the burned materials of cotton hulls, sesame meal, rapeseed meal and cotton seed meal. The lateral axis of FIG. 31 represents the pressure [MPa] applied to the burned materials of cotton hulls etc. burned at a burning temperature of 900 [° C.], and the vertical axis represents the specific volume resistivity [Ω·cm]. Here, this conductivity test was performed by the same method as the case explained for FIG. 6.

As clearly seen in comparison with FIG. 6(b), it is found that the conductivity regarding cotton hulls, sesame meal, rapeseed meal and cotton seed meal has a specific volume resistivity approximately equivalent to that of the burned material of soybean hulls.

Specifically, the specific volume resistivity of cotton hulls was $3.74 \times 10^{-2}$[Ω·cm], and the specific volume resistivity of sesame meal was $4.17 \times 10^{-2}$[Ω·cm], and the specific volume resistivity of rapeseed meal was $4.49\times10^{-2}$[Ω·cm], and the specific volume resistivity of cotton seed meal was $3.35\times10^{-2}$[Ω·cm]

Figure 32:
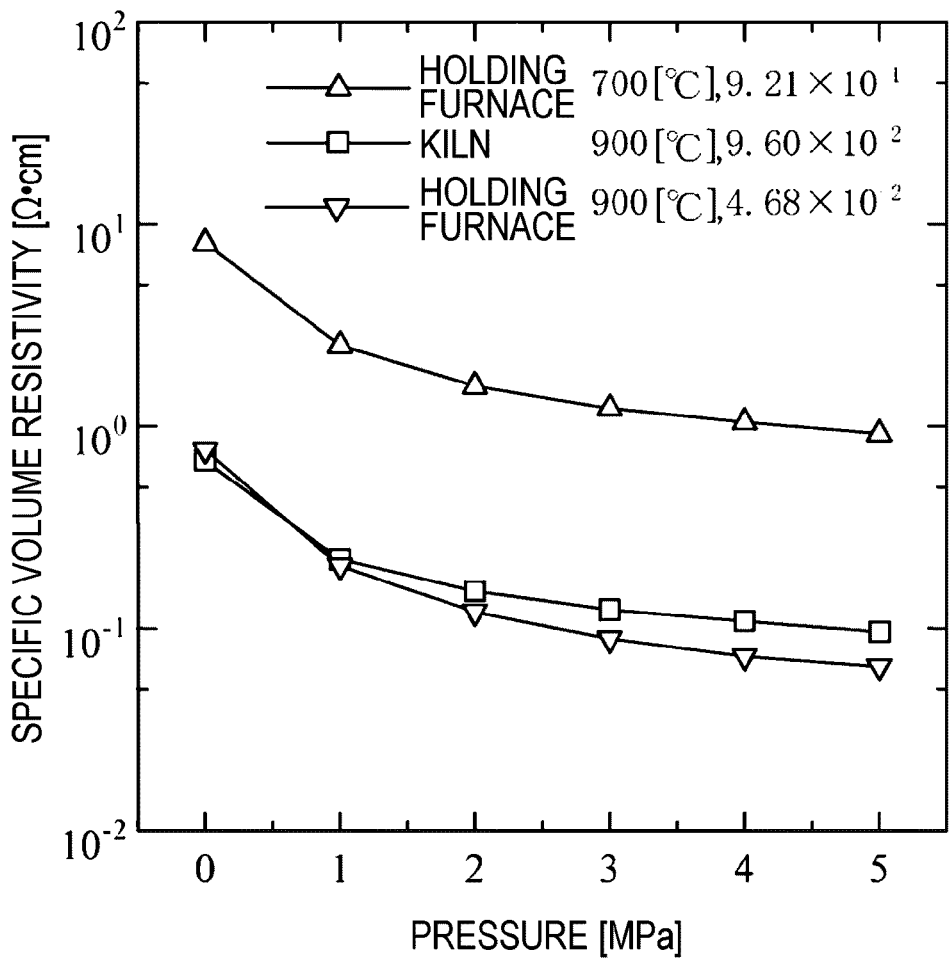
FIG. 32 shows a chart indicating the test results of the conductivity test regarding the burned material of soybean hulls, wherein the burning furnace and burning temperature were changed.

FIG. 32 shows a chart indicating the test results of the conductivity test regarding the burned material of soybean hulls, wherein the burning furnace and burning temperature were changed. The lateral axis and vertical axis of FIG. 32 respectively represent the pressure [MPa] applied to the burned material of soybean hulls and the specific volume resistivity [Ω·cm]. The one under the conditions corresponding to those shown in FIG. 6 is indicated by a chart plotted with □.

First, as comparing the case that a holding furnace was chosen as the burning furnace and the burning temperature stayed at 900 [° C.] (plotted with ∇) with the case that a rotary kiln was chosen as the burning furnace and the burning temperature stayed at 900 [° C.] (plotted with □), there is not much difference in specific volume resistivity between those. Specifically, the specific volume resistivity of the chart plotted with ∇ is $4.68\times10^{-2}$[Ω·cm], while the specific volume resistivity of the chart plotted with □ is $9.60\times10^{-2}$[Ω·cm], and therefore, both are in common with being on the order of "$10^{-2}$". Thus, it can be said that the selection of the burning furnace for soybean hulls is most unlikely to affect the specific volume resistivity.

In contrast, when a rotary kiln was chosen as the burning furnace and the burning temperature was lowered to 700 [° C.] (plotted with Δ), the specific volume resistivity was increased in comparison with the case of setting the burning temperature to 900 [° C.] in a holding furnace (plotted with ∇). Thus, it can be said that the burning temperature for soybean hulls affects the specific volume resistivity.

Hence, the specific volume resistivity was measured further at different burning temperatures for soybean hulls. In addition, the specific volume resistivity was also measured for a pulverized burned material of soybean hulls.

Figure 33:
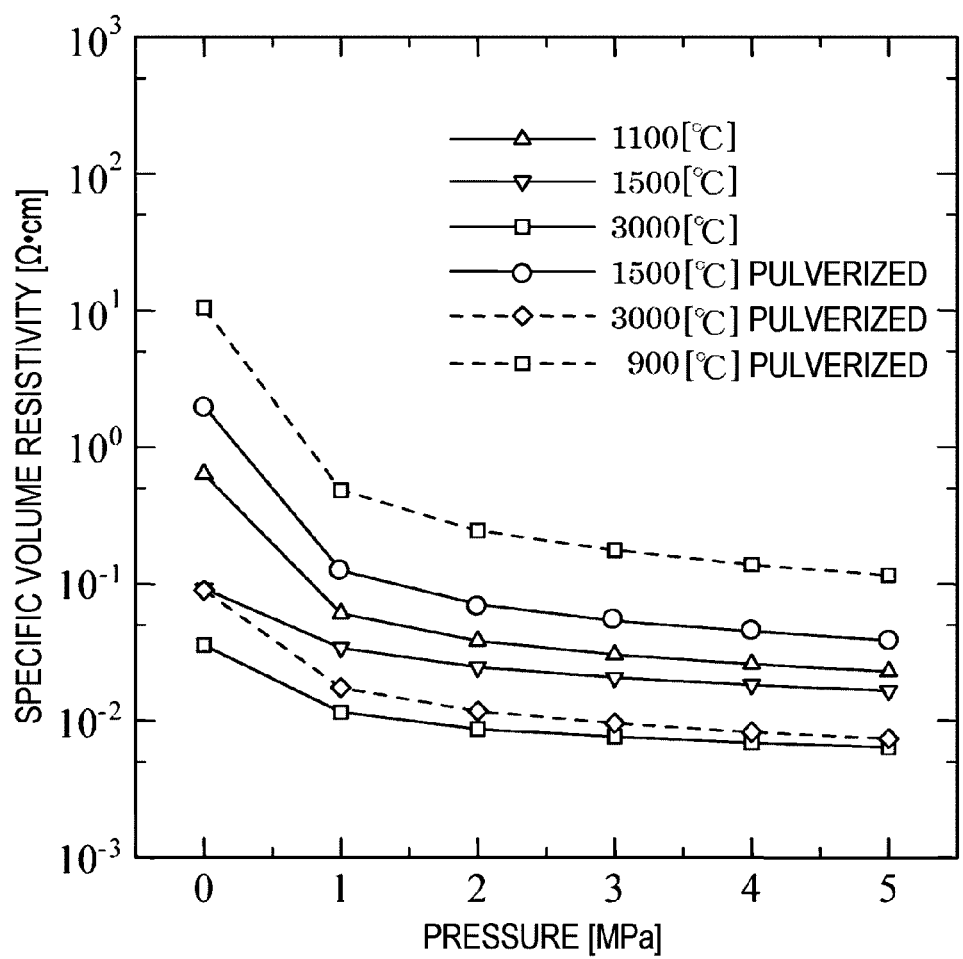
FIG. 33 shows a chart indicating the test results of the conductivity test regarding the burned material of soybean hulls, wherein the burning temperature etc. was changed.

FIG. 33 shows a chart indicating the test results of the conductivity test regarding the burned material of soybean hulls, wherein the burning temperature etc. was changed. The lateral axis and vertical axis of FIG. 33 respectively represent the pressure [MPa] applied to the burned material of soybean hulls and the specific volume resistivity [Ω·cm].

FIG. 33 shows charts respectively in the case that the burning temperature was set to 1100 [° C.] (plotted with Δ), in the case that the burning temperature was set to 1500 [° C.] (plotted with ∇), in the case that the burning temperature was set to 3000 [° C.] (solid line, plotted with □), in the case that the burning temperature was set to 1500 [° C.] and the burned material was pulverized (plotted with ○), in the case that the burning temperature was set to 3000 [° C.] and the burned material was pulverized (plotted with ◇), and in the case that the burning temperature stayed at 900 [° C.] and the burned material was pulverized (dotted line, plotted with □).

As clearly seen in FIG. 33, the one in the case that the burning temperature stayed at 900 [° C.] and the burned material was pulverized (dotted line, plotted with □) shows the highest specific volume resistivity among these. As comparing this specific volume resistivity with the chart in FIG. 6, it is found that the pulverized burned material has a slightly higher specific volume resistivity.

The chart with the second highest specific volume resistivity is from the case that the burning temperature was set to 1500 [° C.] and the burned material was pulverized (plotted with ○). The reason for the high specific volume resistivity can be evaluated to be attributable to the relatively lower burning temperature. In addition, as comparing the case that the burning temperature was set to 1500 [° C.] and the burned material was pulverized (plotted with ○) with the case that the burning temperature was set to 1500[° C.] (plotted with ∇), the pulverized burned material has a higher specific volume resistivity.

As described above, the same tendency is observed in the burned material at a burning temperature of 900 [° C.], and is also observed in the burned material at a burning temperature of 3000 [° C.] as explained below. Therefore, it can be said that the burned material of soybean hulls increases its specific volume resistivity when pulverized.

In addition, paying attention to the burning temperature, the burned material of soybean hulls by a burning temperature of 1500 [° C.] (plotted with ∇) has a specific volume resistivity lower than that of the one by a burning temperature of 1100 [° C.] (plotted with Δ), and further the one by a burning temperature of 3000 [° C.] (dotted line, plotted with □) has an even lower specific volume resistivity, and thus it can be said that the specific volume resistivity decreases as the burning temperature increases. This relationship between burning temperature and specific volume resistivity also fits to the case of pulverizing the burned materials.

Next, when measuring the specific volume resistivity of the burned material of soybean hulls, some parameters were changed. The pressure condition was the same at 0.5 [MPa].

(2) Change in the Median Diameter of the Burned Material of Soybean Hulls

The median diameter of the burned material of soybean hulls was changed to approx. 15 μm and to approx. 30 μm by the previously-mentioned sieving followed by grinding etc. However, those values of the specific volume resistivity are both around approx. $10^{-1.0}$[Ω·cm] showing no significant difference.

In contrast, when the median diameter of the burned material of soybean hulls was changed to approx. 4 μm and to approx. 8 μm by the previously-mentioned sieving followed by grinding etc., the specific volume resistivity slightly increased to around approx. $10^{-0.7}$-0.8[Ω·cm]. In the case of these values, it is speculated that it is due to almost no columnar or net-like structure in the cell layer that is unique to soybean hulls in spite of the change in the median diameter of the burned material of soybean hulls.

(3) Change in the Burning Temperature for Soybean Hulls

When the burning temperature for soybean hulls was changed, an interesting measurement result was obtained. More specifically, the burning temperature for soybean hulls was changed to approx. 500 [° C.], approx. 700 [° C.], approx. 1100 [° C.] and approx. 1500 [° C.]. The measuring object was prepared at a phenol resin impregnation rate of 25 [wt. %] for raw soybean hulls and under the pressure condition of 5 [MPa] for the burned material of soybean hulls.

Figure 7:
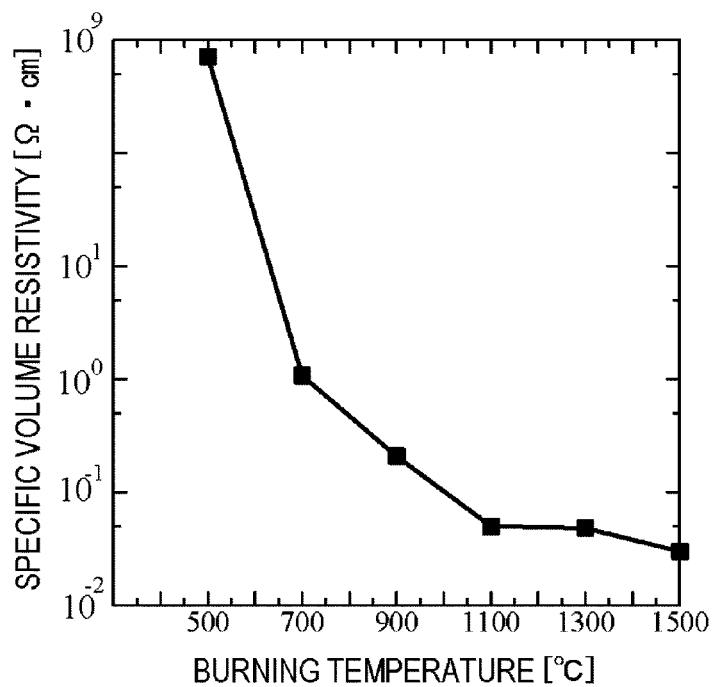
FIG. 7 shows a chart indicating the relationship between the burning temperature for soybean hulls and the specific volume resistivity.

FIG. 7 shows a chart indicating the relationship between the burning temperature for soybean hulls and the specific volume resistivity. The lateral axis and vertical axis of FIG. 7 respectively represent the burning temperature [° C.] for soybean hulls and the specific volume resistivity [Ω·cm]. According to FIG. 7, as the burning temperature for soybean hulls increases, the specific volume resistivity drastically decreases. It is highly likely that this is attributable to the improved carbon content in the burned material of soybean hulls.

In contrast, when the burning temperature for soybean hulls becomes approx. 1100 [° C.] or above, it is found that there is not much change in the specific volume resistivity. It can be considered that this is due to almost no change in the carbon content and other component contents in the burned material of soybean hulls.

In particular, a larger change is seen where the burning temperature for soybean hulls is between approx. 500 [° C.] and approx. 700[° C.]. It can be considered that this is due to a large change in the carbon content in the burned material of soybean hulls. When the burning temperature for soybean hulls was approx. 1500 [° C.], the specific volume resistivity was as very small as approx. $10^{-1.5}$[Ω·cm].

As a summary of the above, it is found that the electrically conductive composition of this embodiment has a characteristic of increasing its conductivity when the burning temperature for soybean hulls is, for example, 700 [° C.] or above.

(4) Other Changes

In addition to changing either the median diameter of the burned material of soybean hulls or the burning temperature for soybean hulls, the content ratio of the burned material of soybean hulls against ethylene propylene diene rubber was changed.

Figure 8:
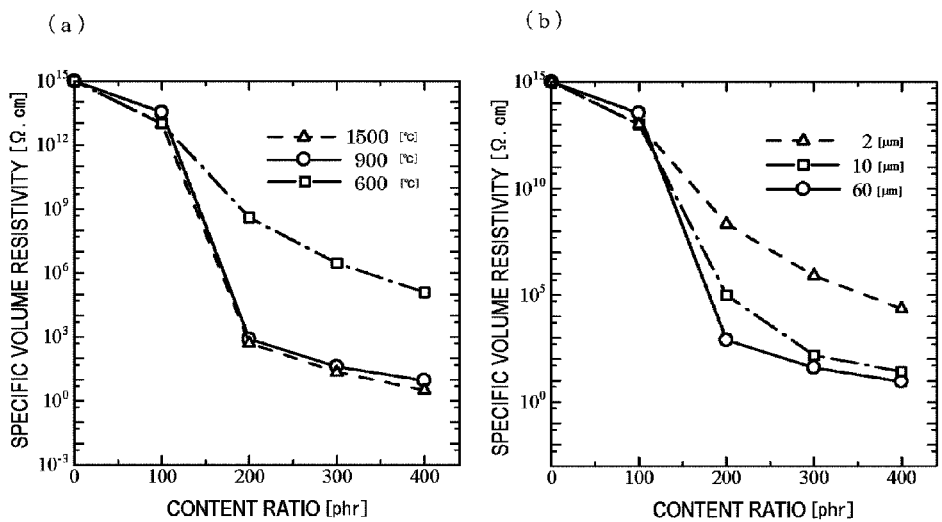
FIG. 8 shows a chart indicating the relationship between the content ratio of the burned material of soybean hulls and the specific volume resistivity.

FIG. 8 shows a chart indicating the relationship between the content ratio of the burned material of soybean hulls and the specific volume resistivity. FIG. 8(a) shows measurements at a burning temperature for soybean hulls of 600 [° C.], 900 [° C.] and 1500 [° C.] respectively. The lateral axis and vertical axis of FIG. 8(a) respectively represent the content ratio [phr] of the burned material of soybean hulls and the specific volume resistivity [Ω·cm]. In both cases, the median diameter of the burned material of soybean hulls was set to 60 μm, and the thickness of the electrically conductive composition was set to 2.5 [mm]. The plotted numeric in FIG. 8 is an average of measurements at 9 arbitrarily chosen points in the electrically conductive composition.

As shown in FIG. 8(a), regardless of the burning temperature for soybean hulls, the specific volume resistivity decreases as the content ratio of the burned material of soybean hulls increases. When the burning temperature was relatively high such as the burning temperature for soybean hulls of 900 [° C.] and 1500 [° C.], no significant difference was observed regardless of the content ratio of the burned material of soybean hulls. The specific volume resistivity is reduced as the content ratio of the burned material of soybean hulls increases, and in particular, an abrupt fall is seen in the content ratio of the burned material of soybean hulls around approx. 100 [phr]-approx. 200 [phr].

In contrast, when the burning temperature was relatively low such as the burning temperature for soybean hulls of 600 [° C.], the specific volume resistivity still decreased as the content ratio of the burned material of soybean hulls increased, however the fall in the specific volume resistivity was more linear in comparison with the case of the relatively higher burning temperature for soybean hulls. Thus, no abrupt fall was observed unlike in the case of the burning temperature for soybean hulls of 900 [° C.] etc.

Therefore, the reason for different measurement results depending on a relatively high or low burning temperature for soybean hulls is considered as follows: That is, organic components with insulation properties essentially exist inside soybean hulls, and when the burning temperature for soybean hulls is relatively low, it is considered that those largely remain without carbonization or pyrolysis in comparison with the case of the relatively high burning temperature for soybean hulls.

It is considered that the reason why the case of the burning temperatures of soybean hulls of 900 [° C.] and the case of 1500 [° C.] show almost the same measurement result is that there is no significant change in the component constitution of soybean hulls, that is, the carbon content when the burning temperature is 900 [° C.] or above.

Figure 44:
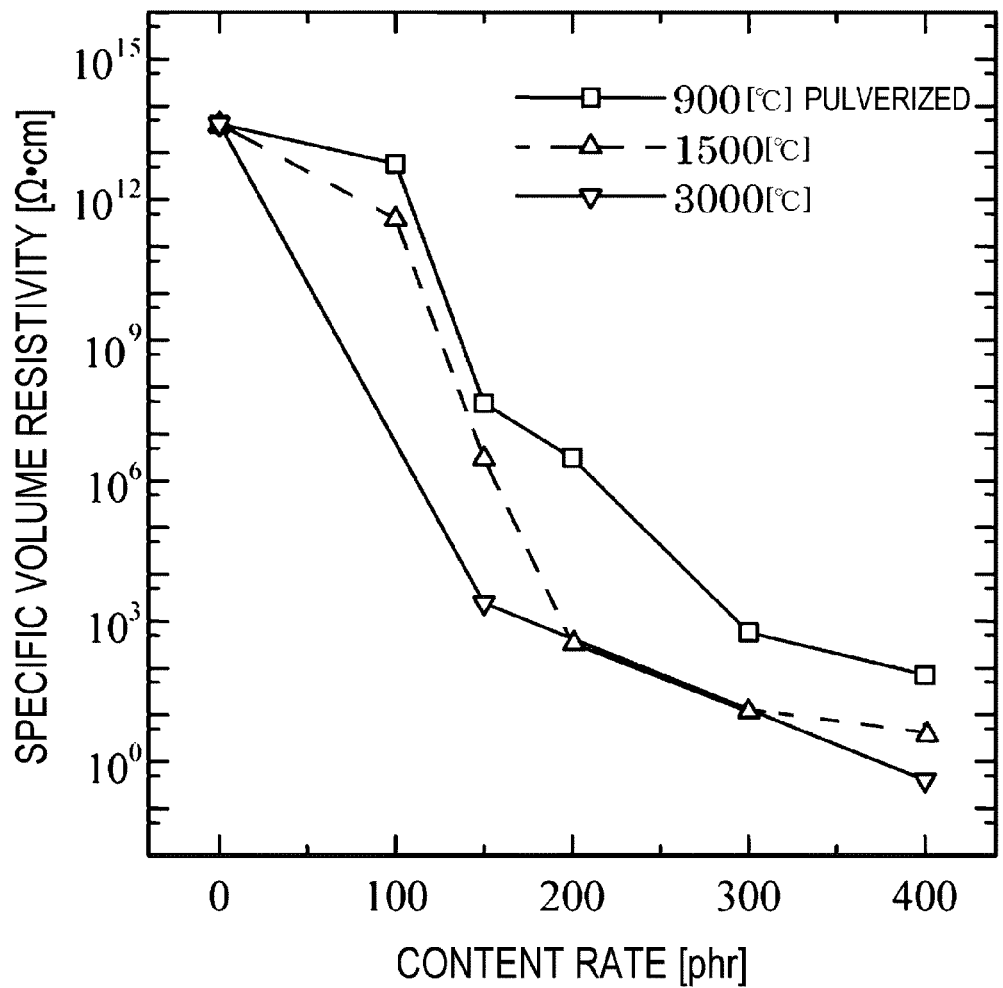
FIG. 44 shows a chart indicating the specific volume resistivity regarding the burned material of soybean hulls, wherein the burning temperature etc. was changed.

FIG. 44 shows a chart indicating the specific volume resistivity regarding the burned material of soybean hulls, wherein the burning temperature etc. was changed. FIG. 44 shows respective measurement results for the burned material of soybean hulls that was burned at 900 [° C.] and was then pulverized, and the burned material of soybean hulls that was burned at 3000 [° C.] and was not pulverized. For reference, it also includes the measurement result for the burned material of soybean hulls that was burned at 1500 [° C.] and was not pulverized shown in FIG. 8(a).

First, in the case of the burned material of soybean hulls that was burned at 3000[° C.], when the content ratio of the burned material of soybean hulls is 0 [phr], the measurement result is almost the same as the case of the burned material of soybean hulls that was burned at 900[° C.].

However, in the case of the burned material of soybean hulls that was burned at 3000[° C.], when the content ratio of the burned material of soybean hulls is 150 [phr] and 400 [phr], it is confirmed that the specific volume resistivity is about $3.0 \times 10^3$[Ω·cm] and $80 \times 10^{-1}$[Ω·cm] respectively.

According to the measurement result shown in FIG. 44 regarding the burned material of soybean hulls that was burned at 3000[° C.] and the measurement result shown in FIG. 8(a), when the burning temperature exceeds a certain temperature of 1500[° C.] or above, it is found that a significant change is caused in the carbon content of the burned material of soybean hulls, showing a change in the specific volume resistivity.

In addition, according the measurement result shown in FIG. 44, it can be generally said that the higher the burning temperature becomes, the higher the conductivity becomes, and also the higher the content ratio of the burned material of soybean hulls against rubber becomes, the more the conductivity improves.

Furthermore, according to the measurement result shown in FIG. 44, when the burned material of soybean hulls is pulverized, the conductivity somewhat decreases. Thus, it is found that the grain size of the burned material of soybean hulls affects the high or low of the conductivity. However, when the burned material of soybean hulls is pulverized, it is found that the specific volume resistivity changes more gently as the content ratio of the burned material of soybean hulls against rubber changes. This is prominently seen when the content rate of the burned material of soybean hulls is changed from 150 [phr] to 300 [phr]. Thus, it can be said that pulverizing the burned material of soybean hulls has an advantageous effect of making it easy to control its specific volume resistivity.

FIG. 8(b) shows measurement results of the specific volume resistivity at the median diameter of the burned material of soybean hulls of 2 μm, 10 μm and 60 μm respectively. The lateral axis and vertical axis of FIG. 8(b) respectively represent the content ratio [phr] of the burned material of soybean hulls and the specific volume resistivity [Ω·cm]. In all cases, the burning temperature for soybean hulls was set to 900[° C.], and the thickness of the electrically conductive composition was set to 2.5 [mm].

As shown in FIG. 8(b), it is found that the specific volume resistivity decreases as the content ratio of the burned material of soybean hulls increases regardless of the median diameter of the burned material of soybean hulls. In addition, it is found that the specific volume resistivity decreases as the median diameter of the burned material of soybean hulls increases. It is considered that this is because the burned material of soybean hulls is getting harder to form clusters inside rubber as the median diameter of the burned material decreases.

Here, the cluster is formed by the burned materials of soybean hulls linking with each other and forming a current pathway. Therefore, when it is hard for clusters to be formed, it is hard for electrical current to flow. Corresponding to the increased content ratio of the burned material of soybean hulls, the specific volume resistivity gently decreases, making it easy for electrical current to flow. In contrast, when an excess amount of clusters have been formed, the specific volume resistivity abruptly falls even if the content ratio of the burned material of soybean hulls is low.

As a summary of the above, it is found that the electrically conductive composition of this embodiment has a characteristic of increasing its conductivity when the median diameter of the burned material of soybean hulls is, for example, 10 μm or above.

Figure 34:
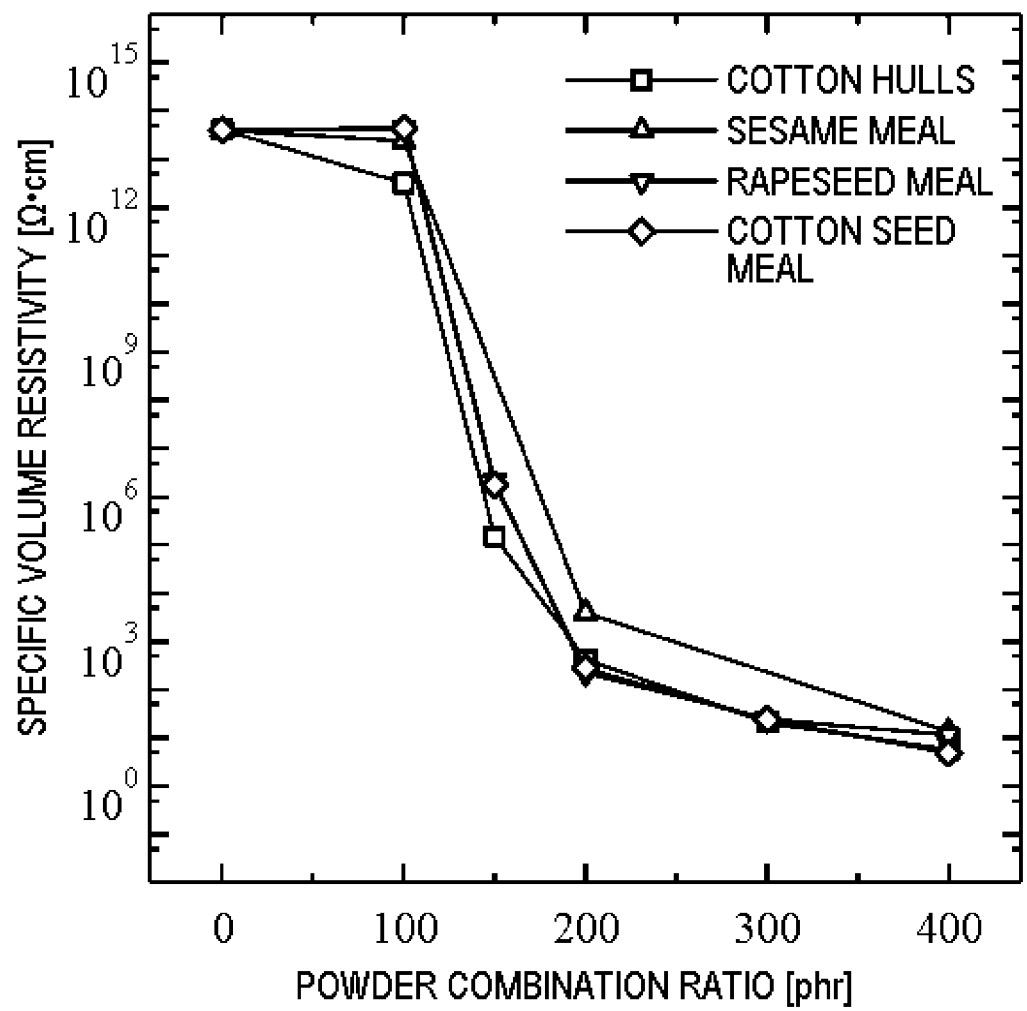
FIG. 34 shows a chart indicating the relationship between the content ratio of the burned material of cotton hulls, sesame meal, rapeseed meal or cotton seed meal, and the specific volume resistivity.

FIG. 34 shows a chart indicating the relationship between the content ratio of the burned material of cotton hulls, sesame meal, rapeseed meal or cotton seed meal, and the specific volume resistivity. The lateral axis and vertical axis of FIG. 34 respectively represent the content ratio [phr] of the burned material of cotton hulls etc. and the specific volume resistivity [Ω·cm]. In the burned material of any plants, the burning temperature was set to 900[° C.], and the thickness of the electrically conductive composition was set to 2.5 [mm]. The plotted numeric in FIG. 34 is an average of measurements at 9 arbitrarily chosen points in the electrically conductive composition.

As shown in FIG. 34, each specific volume resistivity of cotton hulls, sesame meal, rapeseed meal and cotton seed meal had a measurement result similar to each other. It can be said that these specific volume resistivities are also similar to the specific volume resistivity of soybean hulls shown in FIG. 8(b).

Figure 9:
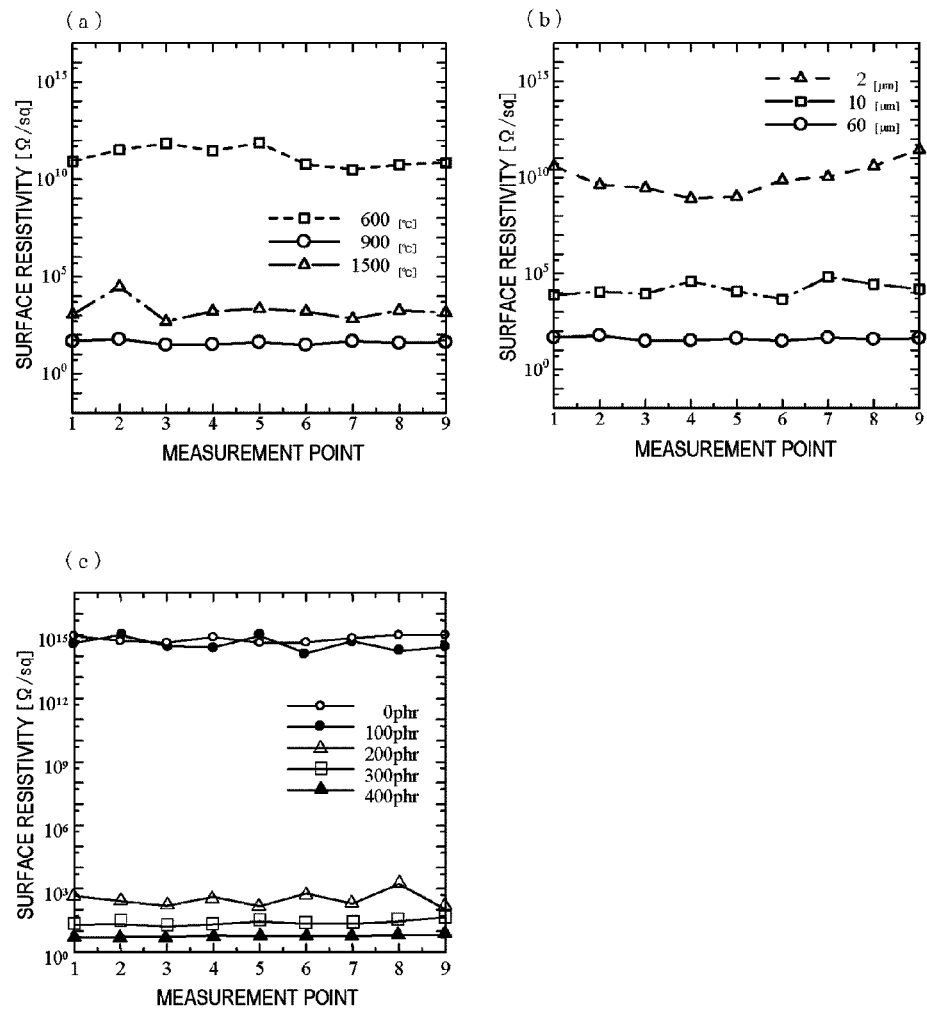
FIG. 9 shows charts indicating the measurement results of the "surface resistivity" of the electrically conductive composition of the test object.

FIG. 9 shows charts indicating the measurement results of the "surface resistivity" of the electrically conductive composition of the test object. When measuring the surface resistivity, the burning temperature for soybean hulls, the median diameter of soybean hulls, and the content ratio of the burned material of soybean hulls against rubber were changed.

FIG. 9(a) shows a chart indicating the measurement results of the "surface resistivity" by different burning temperatures for obtaining the electrically conductive composition of the test object. The lateral axis and vertical axis of FIG. 9(a) respectively represent the measurement point in the electrically conductive composition and the surface resistivity [Ω/sq]. Here, the electrically conductive composition was measured at 9 arbitrarily chosen points in each case of the burning temperature for soybean hulls of 600[° C.], 900[° C.] and 1500[° C.]. In all cases, the median diameter of the burned material of soybean hulls was set to 60 μm, the content ratio of the burned material of soybean hulls against the base material was set to 200 [phr], and the thickness of the electrically conductive composition was set to 2.5 [mm].

According to the measurement results shown in FIG. 9(a), the surface resistivity did not show a significant difference depending on the position in the electromagnetic shielding member regardless of high or low of the burning temperature. However, when the burning temperature is higher, the fluctuations in the surface resistivity seem to be slightly reduced. It is considered that this is due to correction of non-uniformity in the component constitution of soybean hulls since the carbonization of soybean hulls progresses as the burning temperature increases.

FIG. 9(b) shows a chart indicating the measurement results of the "surface resistivity" by different median diameters of the burned material of soybean hulls regarding the electrically conductive composition of the test object. The lateral axis and vertical axis of FIG. 9(b) respectively represent the measurement point in the electrically conductive composition and the surface resistivity [Ω/sq]. Here, the electrically conductive composition was measured at 9 arbitrarily chosen points in each case of the median diameter of the burned material of soybean hulls of 2 μm, 10 μm and 60 μm. In all cases, the burning temperature for soybean hulls was set to 900[° C.], the content ratio of the burned material of soybean hulls against the base material was set to 200 [phr], and the thickness of the electrically conductive composition was set to 2.5 [mm].

According to the measurement results shown in FIG. 9(b), the surface resistivity did not show a significant difference depending on the position in the electrically conductive composition regardless of large or small of the median diameter of the burned material of soybean hulls. However, when the median diameter of the burned material of soybean hulls is larger, the fluctuations in the surface resistivity seem to be slightly reduced, and also the surface resistivity seems to be reduced.

FIG. 9(c) shows a chart indicating the measurement results of the "surface resistivity" by different content ratio of the burned material of soybean hulls against rubber. The lateral axis and vertical axis of FIG. 9(c) respectively represent the measurement point in the electrically conductive composition and the surface resistivity [Ω/sq]. Here, the electrically conductive composition was measured at 9 arbitrarily chosen points in each case that the content ratio of the burned material of soybean hulls against rubber was 0 [phr], 100 [phr], 200 [phr], 300 [phr] and 400 [phr]. In all cases, the median diameter of the burned material of soybean hulls was set to 60 μm, the burning temperature for soybean hulls was set to 900[° C.], and the thickness of the electrically conductive composition was set to 2.5 [mm].

According to the measurement results shown in FIG. 9(c), the surface resistivity did not show a significant difference depending on the position in the electrically conductive composition regardless of high or low of the content ratio of the burned material of soybean hulls against rubber. However, when the content ratio of the burned material of soybean hulls against rubber is higher, the fluctuations in the surface resistivity seem to be slightly reduced, and also the surface resistivity seems to be reduced.

As a summary of the above, it is found that the electrically conductive composition of this embodiment has a characteristic of increasing its conductivity by setting the content ratio of the burned material of soybean hulls against rubber to 200 [phr] or above, and increasing the burning temperature, and increasing the grain size.

FIG. 35(a)-FIG. 35(h) show a chart indicating the measurement results of the specific volume resistivity and surface resistivity of the electrically conductive composition of the burned materials of rapeseed meal, sesame meal, cotton seed meal and cotton hulls, and each of these corresponds to FIG. 9(c). The burning temperature for rapeseed meal etc. was set to 900[° C.].

In FIG. 35(a), FIG. 35(c), FIG. 35(e) and FIG. 35(g), the lateral axis and vertical axis respectively represent the measurement point in the electrically conductive composition and the specific volume resistivity [Ω·cm]. In FIG. 35(b), FIG. 35(d), FIG. 35(f) and FIG. 35(h), the lateral axis and vertical axis respectively represent the measurement point in the electrically conductive composition and the surface resistivity [Ω/sq].

FIG. 35(a) and FIG. 35(b) show a chart of the specific volume resistivity and surface resistivity respectively, regarding the electrically conductive composition of the burned material of rapeseed meal. According to FIG. 35(a) and FIG. 35(b), it is found to have a characteristic of increasing the conductivity when the content ratio of the burned material of rapeseed meal against rubber is set to 200 [phr] or above. When the content ratio of the burned material of rapeseed meal against rubber was set to 400 [phr], the specific volume resistivity was 11.5[Ω·cm] and the surface resistivity was 46.3[Ω/sq].

Figure 35:
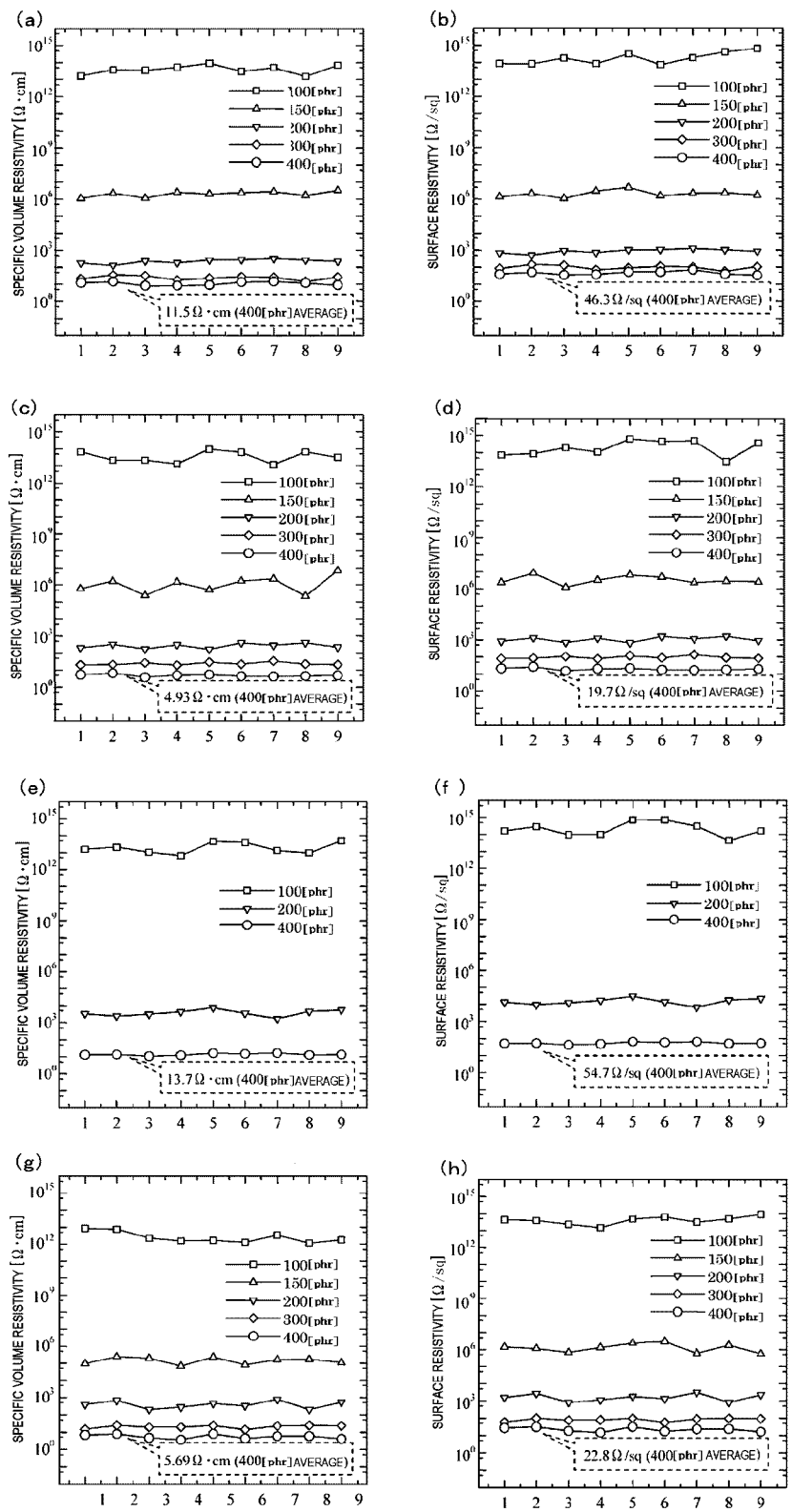
FIG. 35 shows charts indicating the measurement results of the specific volume resistivity and surface resistivity of the electrically conductive composition formed by the burned materials of rapeseed meal, sesame meal, cotton seed meal and cotton hulls.

FIG. 35(c) and FIG. 35(d) show a chart of the specific volume resistivity and surface resistivity respectively, regarding the electrically conductive composition of the burned material of cotton seed meal. According to FIG. 35(c) and FIG. 35(d), it is found to have a characteristic of increasing the conductivity also when the content ratio of the burned material of cotton seed meal against rubber is set to 200 [phr] or above. When the content ratio of the burned material of cotton seed meal against rubber was set to 400 [phr], the specific volume resistivity was 4.93[Ω·cm] and the surface resistivity was 19.7[Ω/sq], both indicating the best result among those shown in FIG. 35.

FIG. 35(e) and FIG. 35(f) show a chart of the specific volume resistivity and surface resistivity respectively, regarding the electrically conductive composition of the burned material of sesame meal. According to FIG. 35(e) and FIG. 35(f), it is found to have a characteristic of increasing the conductivity also when the content ratio of the burned material of sesame meal against rubber is set to 200 [phr] or above. When the content ratio of the burned material of cotton seed meal against rubber was set to 400 [phr], the specific volume resistivity was 13.7[Ω·cm] and the surface resistivity was 54.7[Ω/sq].

FIG. 35(g) and FIG. 35(h) show a chart of the specific volume resistivity and surface resistivity respectively, regarding the electrically conductive composition of the burned material of cotton hulls. According to FIG. 35(e) and FIG. 35(f), it is found to have a characteristic of increasing the conductivity also when the content ratio of the burned material of cotton hulls against rubber is set to 200 [phr] or above. When the content ratio of the burned material of cotton hulls against rubber was set to 400 [phr], the specific volume resistivity was 5.69[Ω·cm] and the surface resistivity was 22.8[Ω/sq].

From the above consideration, it can be said that it has a characteristic of increasing the conductivity when the content ratio of the burned material of the plant against rubber is set to 200 [phr] or above, which is just like the case of the burned material of soybean hulls.

Regarding only to the respective burned materials of soybean hulls, rapeseed meal, sesame meal and cotton seed meal and cotton hulls, when the content ratio of the burned material of the plant against rubber is set to 200 [phr] or above, it is found that the surface resistivity significantly decreases in all cases in contrast to the case that the content ratio is set to 150 [phr] or below. In addition, when the content ratio is 200 [phr] or above, each specific volume resistivity significantly decreases in contrast to the case that the content ratio is set to 150 [phr] or below.

FIG. 36(a)-FIG. 36(f) show a chart indicating the measurement results of the specific volume resistivity and surface resistivity of the electrically conductive composition of the burned materials of soybean hulls, and each of these corresponds to FIG. 9(c). The median diameter of the burned material of soybean hulls was set to 60 μm.

Figure 36:
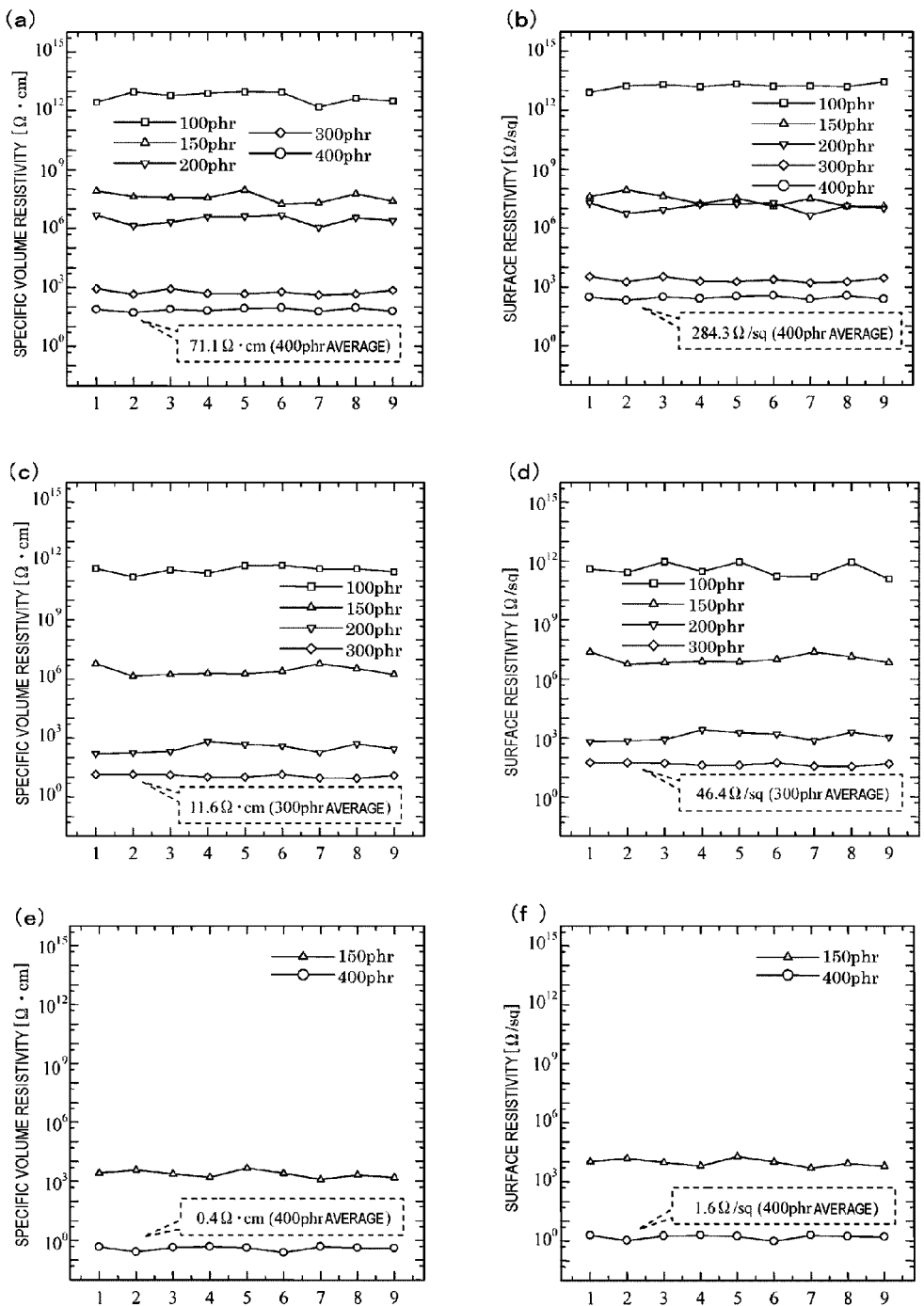
FIG. 36 shows charts indicating the measurement results of the specific volume resistivity and surface resistivity of the electrically conductive composition formed by the burned material of soybean hulls.

In FIG. 36(a), FIG. 36(c) and FIG. 36(e), the lateral axis and vertical axis respectively represent the measurement point in the electrically conductive composition and the specific volume resistivity [Ω·cm]. In FIG. 36(b), FIG. 36(d) and FIG. 36(f), the lateral axis and vertical axis respectively represent the measurement point in the electrically conductive composition and the surface resistivity [Ω/sq].

FIG. 36(a) and FIG. 36(b) respectively show a chart of the specific volume resistivity and surface resistivity of the electrically conductive composition of the pulverized burned material at the burning temperature for soybean hulls of 900[° C.], and FIG. 36(c) and FIG. 36(d) respectively show a chart of the specific volume resistivity and surface resistivity of the electrically conductive composition at the burning temperature for soybean hulls of 1500[° C.], and FIG. 36(e) and FIG. 36(f) respectively show a chart of the specific volume resistivity and surface resistivity of the electrically conductive composition at the burning temperature for soybean hulls of 3000[° C.].

First, as the charts are compared with each other, it is found that both specific volume resistivity and surface resistivity decrease as the burning temperature increases as described above. In addition, as the measurement results are compared with each other, it is also found that both specific volume resistivity and surface resistivity decrease not only as the burning temperature increases but also as the content ratio of the burned material of soybean hulls against rubber increases.

Figure 10:
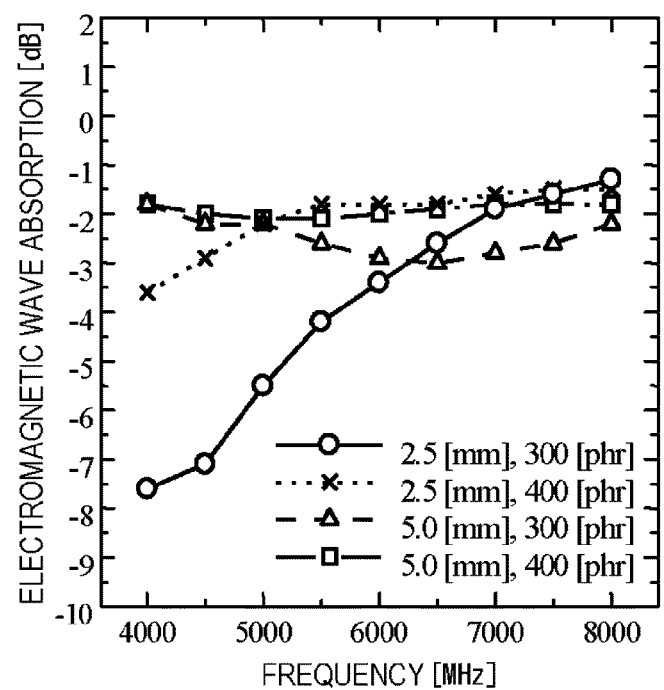
FIG. 10 shows a chart indicting the electromagnetic wave absorption characteristics of the "electrically conductive composition".
Figure 11:
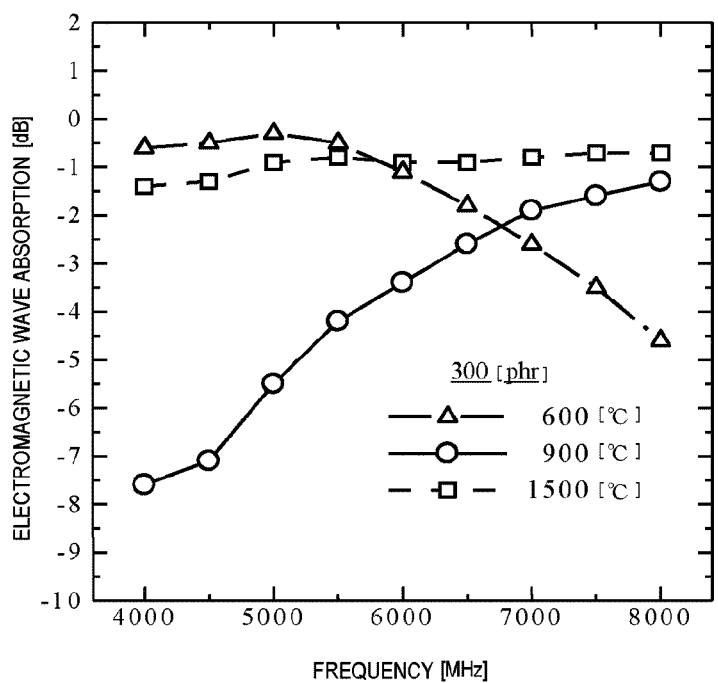
FIG. 11 shows a chart indicting the electromagnetic wave absorption characteristics of the "electrically conductive composition".
Figure 12:
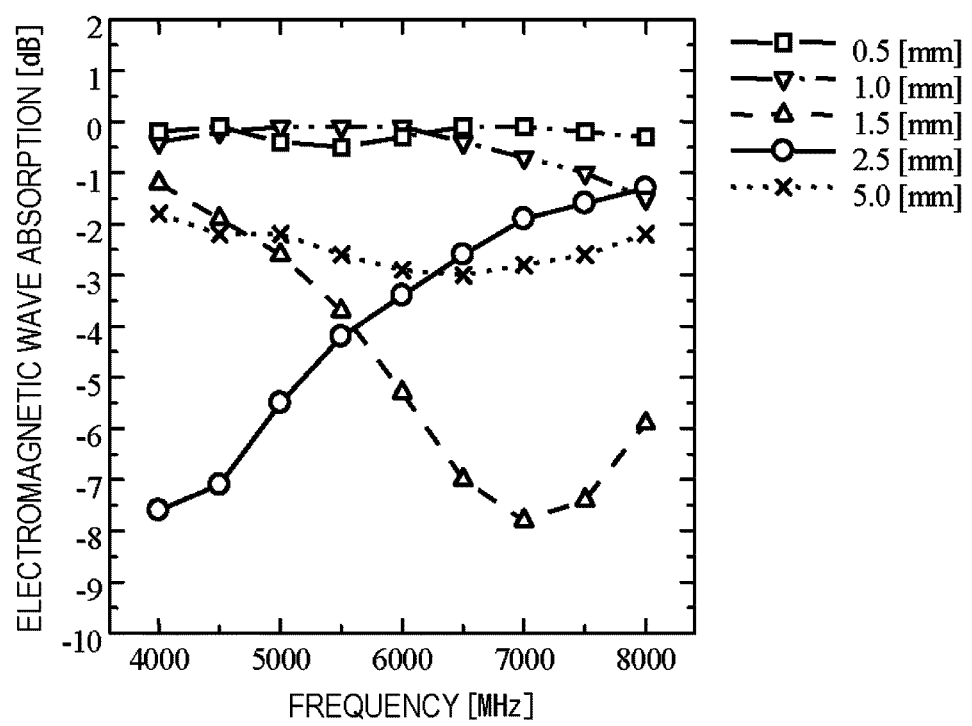
FIG. 12 shows a chart indicting the electromagnetic wave absorption characteristics of the "electrically conductive composition".

FIG. 10-FIG. 12 show a chart indicting the electromagnetic wave absorption characteristics of the "electrically conductive composition". The lateral axis and vertical axis of FIG. 10 etc. respectively represent frequency [Hz] and electromagnetic wave absorption [dB]. For calculating the electromagnetic wave absorption characteristics shown in FIG. 10 etc., the electrically conductive composition with a size of 300 [mm]×300 [mm] was mounted on a metallic plate with the same size, and the electrically conductive composition was irradiated with incident waves at frequencies plotted in FIG. 10 etc. so as to measure the energy of the reflected waves from the electrically conductive composition, thus the energy difference between the incident wave and the reflected wave, that is, the electromagnetic wave absorption (energy loss) was calculated. The measurement was carried out based on the arch test method by using an arch type electromagnetic wave absorption measuring apparatus.

Here, Samples 1-4 with the following conditions were prepared. The prepared samples were as follows:

Sample 1: Thickness of the electrically conductive composition of 2.5 [mm], Content ratio of the burned material of soybean hulls against rubber of 300 [phr]

Sample 2: Thickness of the electrically conductive composition of 2.5 [mm], Content ratio of the burned material of soybean hulls against rubber of 400 [phr]

Sample 3: Thickness of the electrically conductive composition of 5.0 [mm], Content ratio of the burned material of soybean hulls against rubber of 300 [phr]

Sample 4: Thickness of the electrically conductive composition of 5.0 [mm], Content ratio of the burned material of soybean hulls against rubber of 400 [phr]

All of Samples 1-4 were prepared under the following conditions:

Burning temperature for soybean hulls to obtain electrically conductive composition: 900[° C.]

Median diameter of the burned material of soybean hulls: 60 μm

According to FIG. 10, it is found that Samples 1, 2 having a less thick electrically conductive composition (plotted with ○, x in the figure) show a relatively higher electromagnetic wave absorption around the frequency band of 4000 [MHz] to 6000 [MHz], and show a relatively lower electromagnetic wave absorption around the frequency band of 6000 [MHz] to 8000 [MHz]. In contrast, it is found that Samples 3, 4 having a thick electrically conductive composition (plotted with Δ, □ in the figure) show less fluctuations in the electromagnetic wave absorption and also show a relatively lower electromagnetic wave absorption in the frequency band of 4000 [MHz] to 8000 [MHz].

In addition, it is found that Samples 2, 4 having a higher content ratio of the burned material of soybean hulls against rubber (plotted with x, □ in the figure) shows a less electromagnetic wave absorption than Samples 1, 3 having a lower content ratio of the burned material of soybean hulls against rubber (plotted with ○, Δ in the figure) do.

Regarding FIG. 11, the following Samples 5-7 were prepared. The prepared samples were as follows:

Sample 5: Burning temperature for soybean hulls to obtain electrically conductive composition: 600[° C.]
Sample 6: Burning temperature for soybean hulls to obtain electrically conductive composition: 900[° C.] (Sample 1)
Sample 7: Burning temperature for soybean hulls to obtain electrically conductive composition: 1500[° C.]

All of Samples 5-7 were prepared under the following conditions:
Median diameter of the burned material of soybean hulls: 60 μm
Thickness of electrically conductive composition: 2.5 [mm]
Content ratio of the burned material of soybean hulls against rubber: 300 [phr]

According to FIG. 11, the electromagnetic wave absorption regarding Sample 7 (plotted with □ in the figure) is almost constant regardless of the frequency band, however, it can be said that the electromagnetic wave absorption in the lower frequencies is more than that in the higher frequencies.

In contrast, it is found that Sample 5 (plotted with Δ in the figure) increases the electromagnetic wave absorption as the frequency increases. In contrast, it is found that Sample 6 (plotted with ○ in the figure) reduces the electromagnetic wave absorption as the frequency increases.

Regarding FIG. 12, the follows Samples 8-12 were prepared. The prepared samples were as follows:

Sample 8: Thickness of electrically conductive composition: 0.5 [mm]
Sample 9: Thickness of electrically conductive composition: 1.0 [mm]
Sample 10: Thickness of electrically conductive composition: 1.5 [mm]
Sample 11: Thickness of electrically conductive composition: 2.0 [mm] (Sample 4)
Sample 12: Thickness of electrically conductive composition: 5.0 [mm] (Sample 3)

All of Samples 8-12 were prepared under the following conditions:
Burning temperature for soybean hulls to obtain electrically conductive composition: 900[° C.]
Median diameter of the burned material of soybean hulls: 60 μm
Content ratio of the burned material of soybean hulls against rubber: 300 [phr]

According to FIG. 12, the electromagnetic wave absorption regarding Samples 8, 9, 12 (plotted with □, ∇, x) is almost constant generally regardless of the frequency band. However, the electromagnetic wave absorption of Sample 12 (plotted with x in the figure) is more than that of Samples 8, 9 (plotted with □, ∇ in the figure). In contrast, Sample 10, 11 (plotted with Δ, ○ in the figure) show a change in the electromagnetic wave absorption depending on high or low of the frequency.

Figure 14:
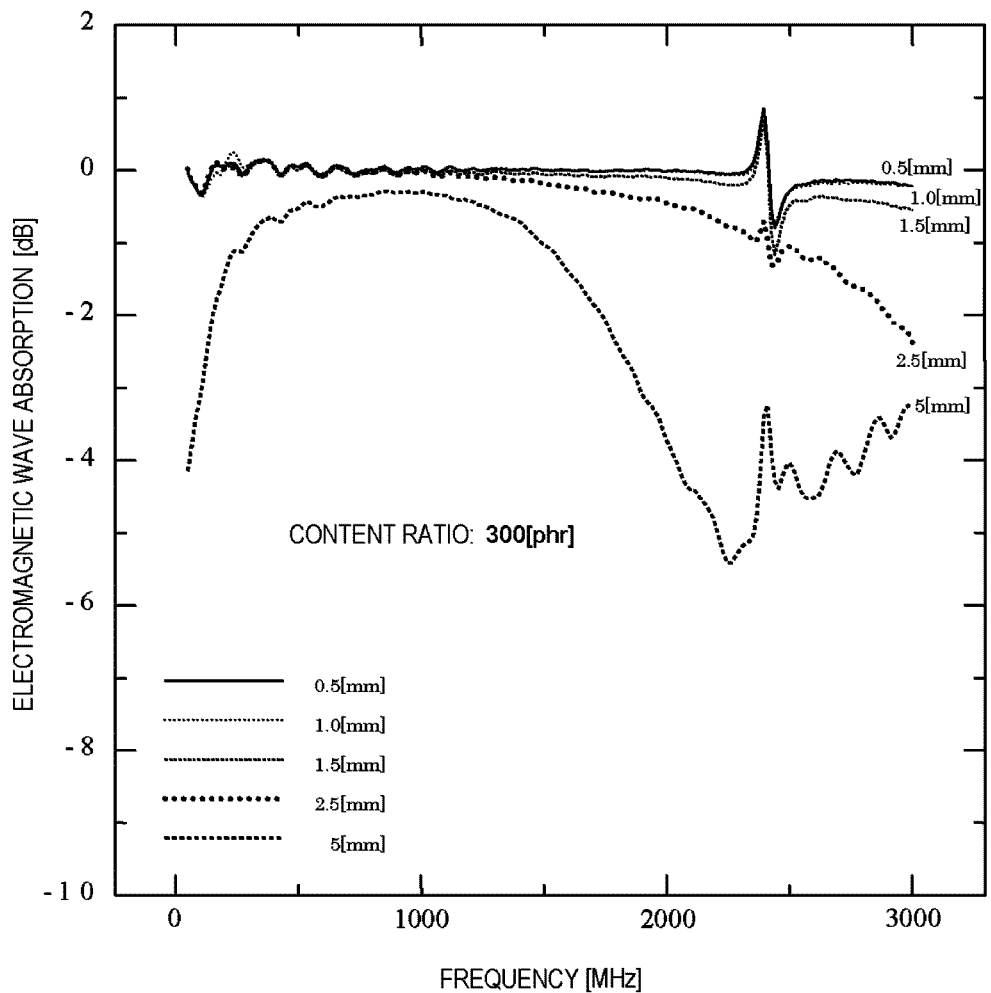
FIG. 14 shows a chart indicting the electromagnetic wave absorption characteristics of the "electrically conductive composition".

FIG. 13-FIG. 14 show a chart indicting the electromagnetic wave absorption characteristics of the "electrically conductive composition". The lateral axis and vertical axis of FIG. 13 etc. respectively represent frequency [Hz] and electromagnetic wave absorption [dB]. Furthermore, FIG. 13 also shows an enlarged view for the frequency band up to 500 [MHz].

The electromagnetic wave absorption characteristics shown in FIG. 13 and FIG. 14 were measured by so-called S-parameter method. Specifically, a toroidal-shaped electrically conductive composition with an outer diameter of approx. 20Φ and inner diameter of 8.7Φ was mounted on the bottom of a cylindrical test container with an inner diameter of approx. 20Φ, and the electrically conductive composition was irradiated from the opening end of the test container with incident waves at frequencies plotted in FIG. 13 and FIG. 14 so as to measure the energy of the reflected waves from the electrically conductive composition, thus the electromagnetic wave absorption was calculated. For the electrically conductive composition, the content ratio of the burned material of soybean hulls against rubber has been changed from 0 [phr] to 400 [phr] with an increment of 50 [phr]. In all cases, the burning temperature for soybean hulls was set to 900[° C.], and the median diameter of the burned material of soybean hulls was set to 60 μm.

According to FIG. 13, the electromagnetic wave absorption is approx. 0 [dB] with little fluctuations around 500 [MHz]-2300 [MHz] regardless of high or low of the content ratio of the burned material of soybean hulls. The fluctuations seen from 2300 [MHz] to 2400 [MHz] are caused by noises during the measurement. In contrast, in the range of 2400 [MHz] and above, when the content ratio of the burned material of soybean hulls is 150 [phr] or below, the electromagnetic wave absorption is approx. 0 [dB] with little fluctuations, and when the content ratio of the burned material of soybean hulls is 200 [phr] or above, the electromagnetic wave absorption increases to some extent.

According to the enlarged view of FIG. 13, at around 50 [MHz], when the content ratio of the burned material of soybean hulls is 150 [phr] and 400 [phr], the electromagnetic wave absorption is found to be −3 [dB] and −6 [dB] respectively, however, at other content ratios, the electromagnetic wave absorption stays within −1.0 [dB] even though it shows more fluctuations.

Here, paying attention to the burned material of soybean hulls with the content ratio of 400 [phr], the electromagnetic wave absorber of this embodiment has an electromagnetic wave shielding effect of 40 [dB] at the frequency band of around 50 [MHz] as shown in FIG. 2, while having an electromagnetic wave absorption of −6 [dB] as shown in FIG. 13, and thus it is considered to be causing a reflection of 34 [dB]. In addition, based on the chart shown in FIG. 13, it is preferred to be used as an electromagnetic wave reflector in the frequency band of 50 [MHz]-100 [MHz].

FIG. 14 shows a relationship between frequency and electromagnetic wave absorption, wherein the thickness of the electrically conductive composition is changed from 0.5 [mm] to 5.0 [mm] with an increment of 0.5 [mm]. Here, the content ratio of the burned material of soybean hulls was set to 300 [phr].

According to FIG. 14, except for the cases that the thickness of the electrically conductive composition has been set to 2.5 [mm] and 5.0 [mm], it is found that the results of the electromagnetic wave absorptions are approximately similar to each other. That means, when the thickness of the electrically conductive composition is 0.5 [mm]-1.5 [mm], the electromagnetic wave absorption is approx. 0 [dB] with little fluctuations around 500 [MHz]-2300 [MHz]. Although there is some difference based on the different thickness of the electrically conductive composition, the electromagnetic wave absorption increases to some extent from 2400 [MHz] and above, while the electromagnetic wave absorption stays within −1.0 [dB] from 500 [MHz] and below even though it shows more fluctuations. The fluctuations seen from 2300 [MHz] to 2400 [MHz] are caused by noises.

In contrast, when the thickness of the electrically conductive composition is 5.0 [mm], the electromagnetic wave absorption is relatively high at any point in the frequency band up to 3000 [MHz]. In addition, when the thickness of the electrically conductive composition is 2.5 [mm], the electromagnetic wave absorption increases around over 1200 [MHz].

Here, according to this test result, the electromagnetic wave absorption with the thickness of the electrically conductive composition of 2.5 [mm] is somewhat different from the one with the thickness of the electrically conductive composition of 5.0 [mm] in the frequency band of 2400 [MHz] and above.

However, it is worth noting that when the thickness of the electrically conductive composition is 5.0 [mm], the absorption characteristic of about −4 [dB] has been obtained at the frequency of 50 [MHz] and the absorption characteristic of about maximum −5 [dB] has been obtained in the frequency band of 2000 [MHz]-2500 [MHz].

FIG. 37(a)-FIG. 37(h) show a chart indicating the electromagnetic wave absorption characteristics of the electrically conductive compositions formed from the burned material of rapeseed meal, sesame meal, cotton seed meal and cotton hulls respectively. In FIG. 37(a)-FIG. 37(h), the lateral axis and vertical axis indicate frequency [MHz] and electromagnetic wave absorption [dB] respectively. Here, the thickness of the electrically conductive composition was set to 2.5 [mm] and 5.0 [mm], and the content ratio of the burned material of rapeseed meal etc. against rubber was changed.

Figure 37:
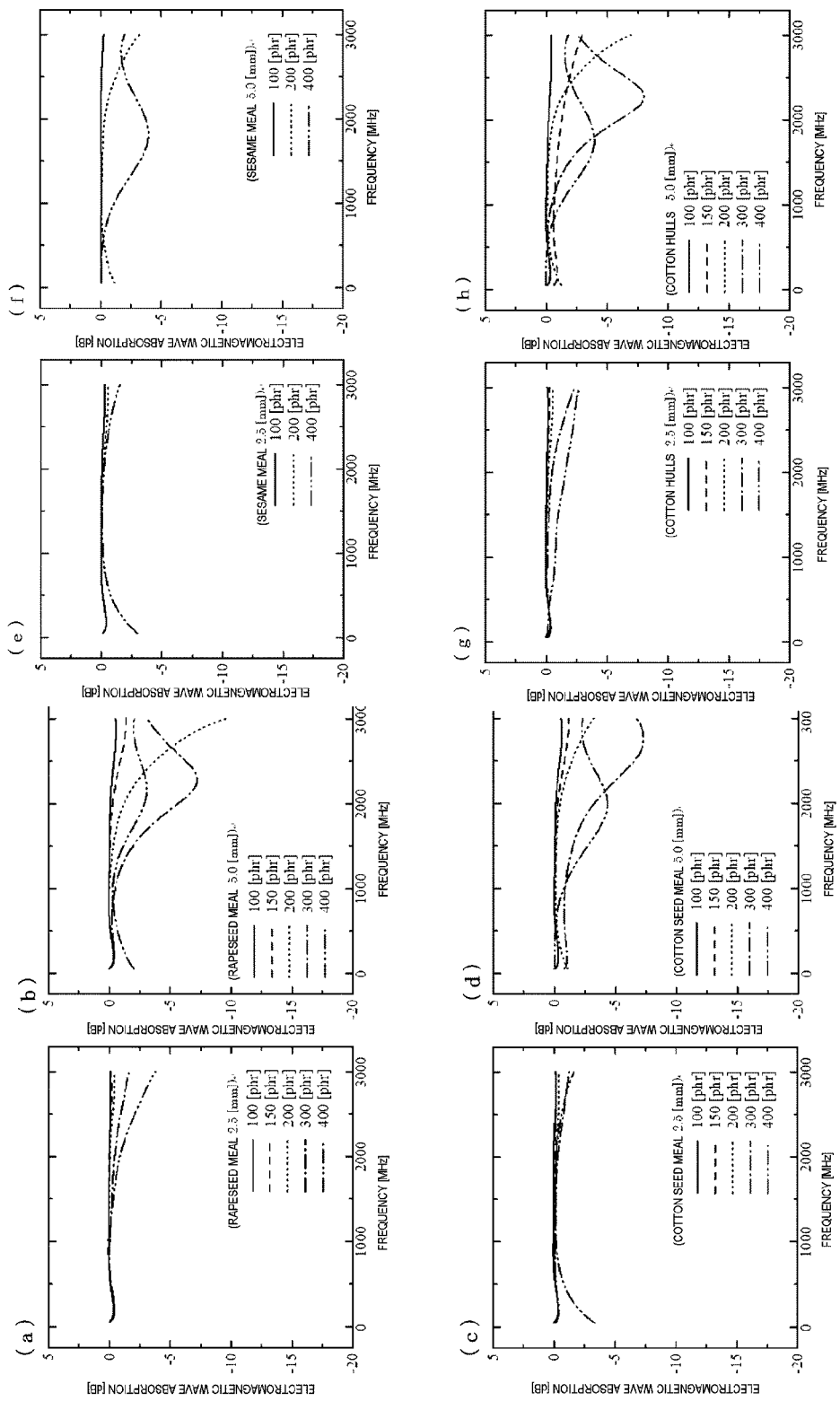
FIG. 37 shows charts indicating the electromagnetic wave absorption characteristics of the electrically conductive composition formed by the burned materials of rapeseed meal, sesame meal, cotton seed meal and cotton hulls.

FIG. 37(a) shows electromagnetic wave absorption characteristics of the electrically conductive composition with a thickness of 2.5 [mm], wherein the burned material of rapeseed meal was burned at a burning temperature of 900[° C.], and FIG. 37(b) shows electromagnetic wave absorption characteristics of the electrically conductive composition with a thickness of 5.0 [mm], wherein the burned material of rapeseed meal was burned at a burning temperature of 900[° C.].

FIG. 37(c) shows electromagnetic wave absorption characteristics of the electrically conductive composition with a thickness of 2.5 [mm], wherein the burned material of cotton seed meal was burned at a burning temperature of 900[° C.], and FIG. 37(d) shows electromagnetic wave absorption characteristics of the electrically conductive composition with a thickness of 5.0 [mm], wherein the burned material of cotton seed meal was burned at a burning temperature of 900[° C.].

FIG. 37(e) shows electromagnetic wave absorption characteristics of the electrically conductive composition with a thickness of 2.5 [mm], wherein the burned material of sesame meal was burned at a burning temperature of 900[° C.], and FIG. 37(f) shows electromagnetic wave absorption characteristics of the electrically conductive composition with a thickness of 5.0 [mm], wherein the burned material of sesame meal was burned at a burning temperature of 900[° C.].

FIG. 37(g) shows electromagnetic wave absorption characteristics of the electrically conductive composition with a thickness of 2.5 [mm], wherein the burned material of cotton hulls was burned at a burning temperature of 900[° C.], and FIG. 37(h) shows electromagnetic wave absorption characteristics of the electrically conductive composition with a thickness of 5.0 [mm], wherein the burned material of cotton hulls was burned at a burning temperature of 900[° C.].

Whenever the burned material of any one of plants such as rapeseed meal is used, when the thickness of the electrically conductive composition is 2.5 [mm], the absorption characteristic of about maximum −5 [dB] has been obtained in the frequency band of 3000 [MHz] and below, and when 5.0 [mm], the absorption characteristic of about maximum −8 [dB] has been obtained.

Although it has not been determined (regarding sesame meal, we could not carry out a measurement for the case containing 300 [phr] of the burned material against rubber) it may be said that the burned material of any one of plants such as rapeseed meal has an effective frequency absorption characteristic in the frequency band of 2000 [MHz]-3000 [MHz] when containing 300 [phr] against rubber.

Figure 38:
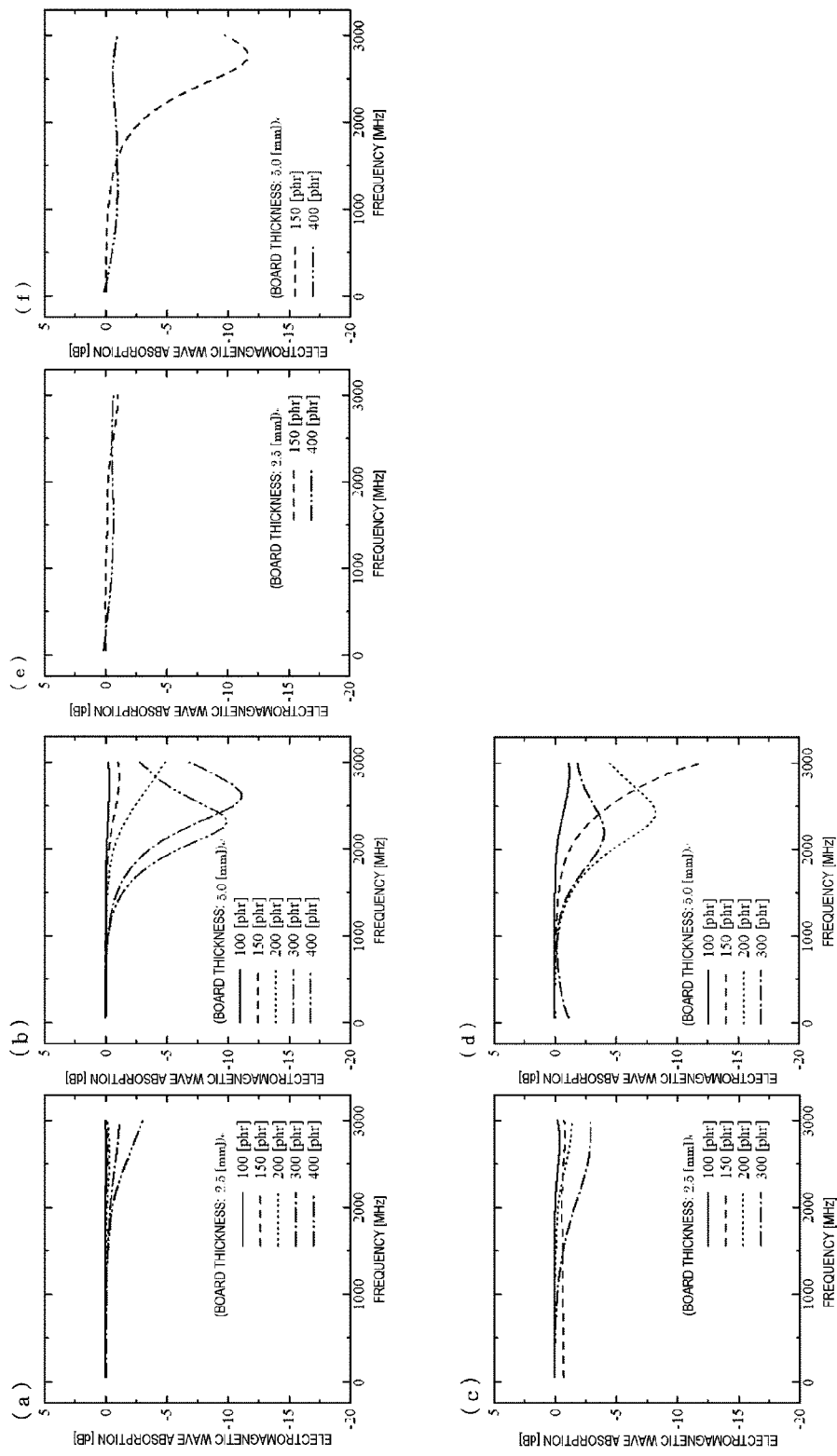
FIG. 38 shows charts indicating the electromagnetic wave absorption characteristics regarding the burned material of soybean hulls, wherein the burning temperature etc. was changed.

FIG. 38 shows a chart indicating the electromagnetic wave absorption characteristics regarding the burned material of soybean hulls, wherein the burning temperature etc. was changed, and it corresponds to FIG. 13. In FIG. 38(a)-FIG. 38(f), the lateral axis and vertical axis indicate frequency [MHz] and electromagnetic wave absorption [dB] respectively. Here, the thickness of the electrically conductive composition was set to 2.5 [mm] and 5.0 [mm], and the measurement was carried out for both cases.

FIG. 38(a) shows electromagnetic wave absorption characteristics of the electrically conductive composition with a thickness of 2.5 [mm], wherein the "burned material of soybean hulls" was burned at a burning temperature of 900[° C.] an was then pulverized, and FIG. 38(b) shows electromagnetic wave absorption characteristics of the electrically conductive composition with a thickness of 5.0 [mm], wherein the "burned material of soybean hulls" was burned at a burning temperature of 900[° C.] and was then pulverized.

FIG. 38(c) shows electromagnetic wave absorption characteristics of the electrically conductive composition with a thickness of 2.5 [mm], wherein the "burned material of soybean hulls" was burned at a burning temperature of 1500[° C.], and FIG. 38(d) shows electromagnetic wave absorption characteristics of the electrically conductive composition with a thickness of 5.0 [mm], wherein the "burned material of soybean hulls" was burned at a burning temperature of 1500[° C.].

FIG. 38(e) shows electromagnetic wave absorption characteristics of the electrically conductive composition with a thickness of 2.5 [mm], wherein the "burned material of soybean hulls" was burned at a burning temperature of 3000[° C.], and FIG. 38(f) shows electromagnetic wave absorption characteristics of the electrically conductive composition with a thickness of 5.0 [mm], wherein the "burned material of soybean hulls" was burned at a burning temperature of 3000[° C.].

First, it was confirmed from all of the measurement results of FIG. 38(a)-FIG. 38(f) that the electrically conductive composition with a thickness of 5.0 [mm] has an electromagnetic wave absorption of about maximum 10 [dB] in the frequency band of 2000 [MHz]-3000 [MHz], while such an electromagnetic wave absorption was not confirmed in the case of the electrically conductive composition with a thickness of 2.5 [mm].

In addition, as comparing FIG. 38-FIG. 38(f) with each other, it was confirmed that the frequency band at which the maximum electromagnetic wave absorption can be obtained varies depending on the burning temperature for the burned material of soybean hulls to obtain the electrically conductive composition, the thickness of the electrically conductive composition, the content of the burned material of soybean hulls against rubber, and whether or not the burned material of soybean hulls has been pulverized.

Based on the above, in order to obtain an electrically conductive composition preferably used at, for example, around 2500 [MHz], it is understood that:

(1) the conditions may be the burning temperature for the burned material of soybean hulls of 1500[° C.], the thickness of the electrically conductive composition of 5 [mm], the content of the burned material of soybean hulls against rubber of 200 [phr], and not applying pulverization for the burned material of soybean hulls.

(2) the conditions may be the burning temperature for the burned material of soybean hulls of 900[° C.], the thickness of the electrically conductive composition of 5 [mm], the content of the burned material of soybean hulls against rubber of 300 [phr]-400 [phr], and applying pulverization for the burned material of soybean hulls.

Figure 15:
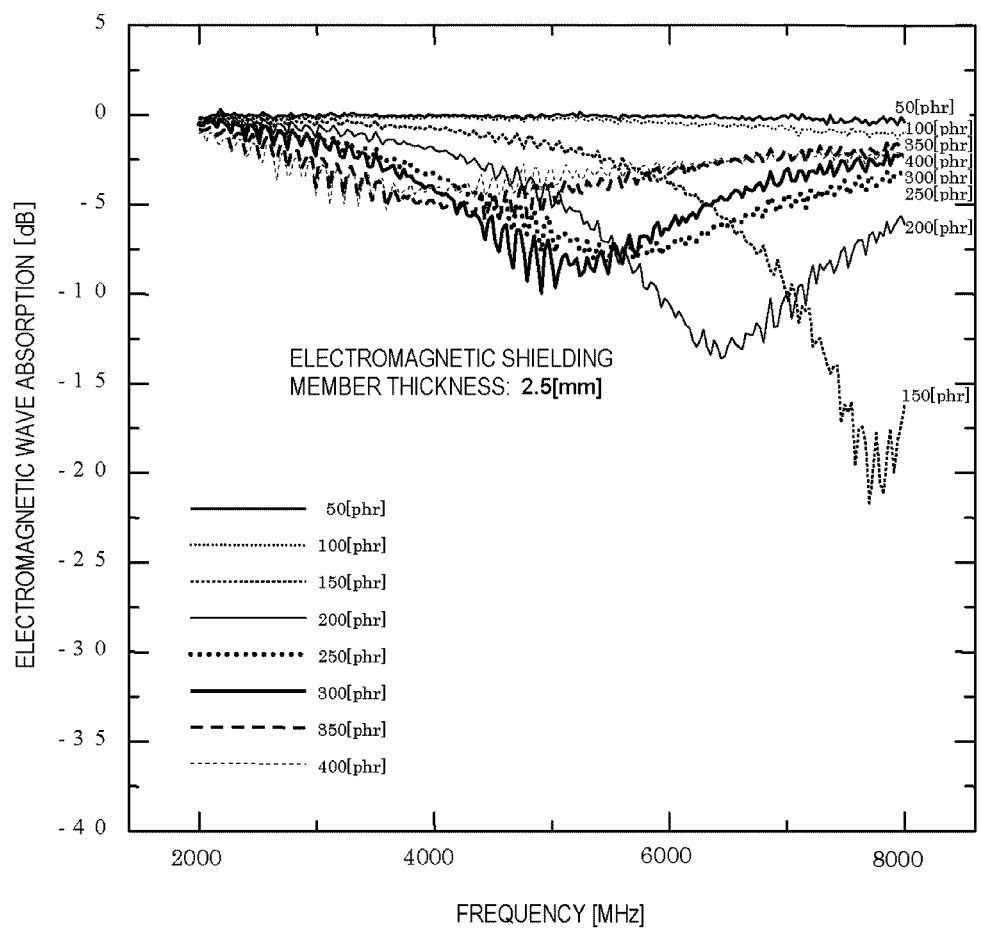
FIG. 15 shows a chart indicating the relationship between frequency and electromagnetic wave absorption characteristics corresponding to FIG. 13.
Figure 16:
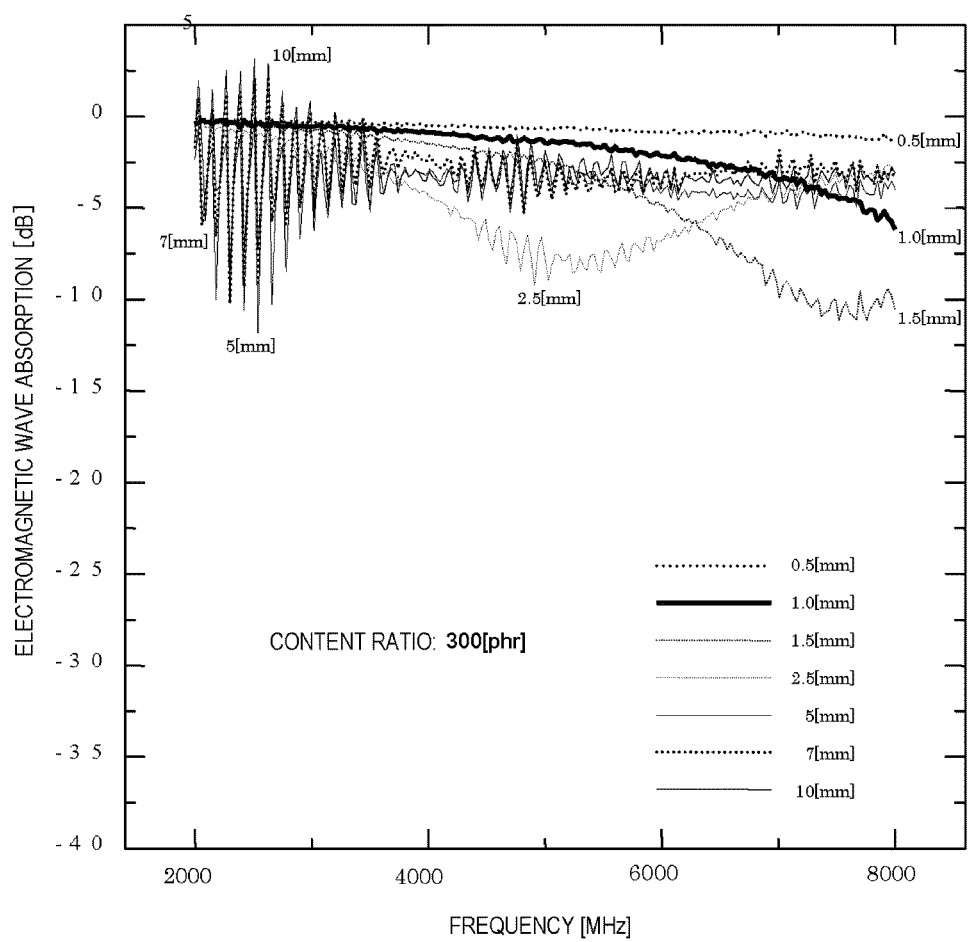
FIG. 16 shows a chart indicating the relationship between frequency and electromagnetic wave absorption characteristics corresponding to FIG. 14.

FIG. 15 and FIG. 16 show a chart indicating the relationship between frequency and electromagnetic wave absorption characteristics corresponding to FIG. 13 and FIG. 14. The electromagnetic wave absorption characteristics in the frequency band of 2000 [MHz]-8000 [MHz] are indicated herein.

As shown in FIG. 15, paying attention to the minimum value of each chart, there seems to be association between the content ratio of the burned material of soybean hulls against ethylene propylene diene rubber and the frequency band. That is, as the content ratio of the burned material of soybean hulls against ethylene propylene diene rubber increases, the electromagnetic wave absorption range shifts to the lower frequency band.

In addition, there also seems to be association between the content ratio of the burned material of soybean hulls against ethylene propylene diene rubber and the absorption itself. That is, as the content ratio of the burned material of soybean hulls against ethylene propylene diene rubber increases, the electromagnetic wave absorption increases except for the cases that the content ratio of the burned material of soybean hulls against ethylene propylene diene rubber is set to 50 [phr] and 100 [phr].

However, when the content ratio of the burned material of soybean hulls is 50 [phr] and 100 [phr] in the sample, the absorption characteristic cannot be obtained. In FIG. 15, it should be noted that when the content ratio of the burned material of soybean hulls was 150 [phr], the absorption characteristic of as much as −20 [dB] was obtained in the frequency band of 7 [GHz]-8 [GHz].

As shown in FIG. 16, there seems to be association between the thickness of the electrically conductive composition and the frequency band. That is, as the thickness of the electrically conductive composition increases, the electromagnetic wave absorption range shifts to the lower frequency band.

Figure 39:
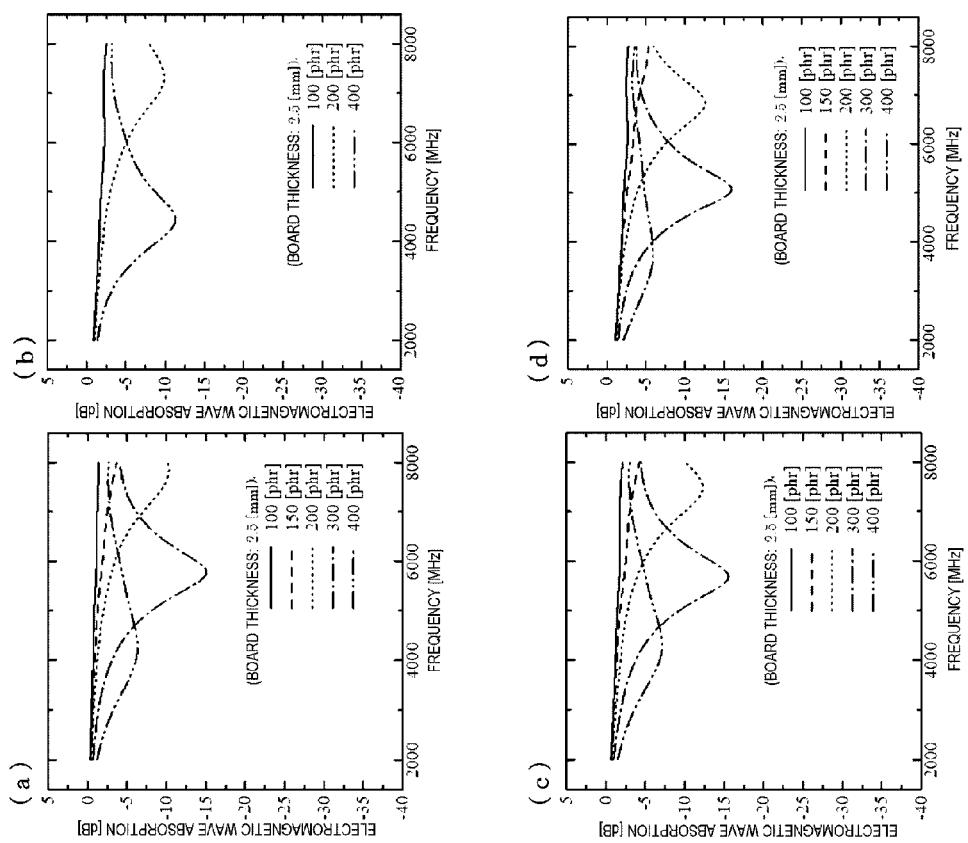
FIG. 39 shows charts indicating the electromagnetic wave absorption characteristics of the electrically conductive composition formed by the burned materials of rapeseed meal, sesame meal, cotton seed meal and cotton hulls.

FIG. 39($a$)-FIG. 39($d$) show a chart indicating the electromagnetic wave absorption characteristics of the electrically conductive compositions formed from the burned material of rapeseed meal, sesame meal, cotton seed meal and cotton hulls respectively, and these correspond to FIG. 15. In FIG. 39($a$)-FIG. 39($d$), the lateral axis and vertical axis indicate frequency [Hz] and electromagnetic wave absorption [dB] respectively. Here, the burning temperature for rapeseeds etc. was set to 900° C., the thickness of the electrically conductive composition was set to 2.5 [mm], and the content ratio of the burned material of rapeseed meal etc. against rubber was changed.

FIG. 39($a$) shows electromagnetic wave absorption characteristics of the electrically conductive composition formed from the burned material of rapeseed meal. FIG. 39($b$) shows electromagnetic wave absorption characteristics of the electrically conductive composition formed from the burned material of sesame meal. FIG. 39($c$) shows electromagnetic wave absorption characteristics of the electrically conductive composition formed from the burned material of cotton seed meal. FIG. 39($d$) shows electromagnetic wave absorption characteristics of the electrically conductive composition formed from the burned material of cotton hulls.

First, looking at FIG. 39($a$)-FIG. 39($d$), it is found that the maximum value of the electromagnetic wave absorption in each burned material of rapeseed meal etc. is about −15 [dB] in the frequency band of 2000 [MHz]-6000 [MHz].

Although it has not been determined (regarding the cotton seed meal shown in FIG. 39($c$), we could not carry out a measurement for the case containing 300 [phr] of the burned material against rubber) it may be said that the burned material of any one of plants such as rapeseed meal has an effective frequency absorption characteristic in the frequency band of 2000 [MHz]-8000 [MHz] when containing 300 [phr] against rubber. The result indicated that the frequency with the maximum electromagnetic wave absorption was around 4000 [MHz]-6000 [MHz].

Figure 40:
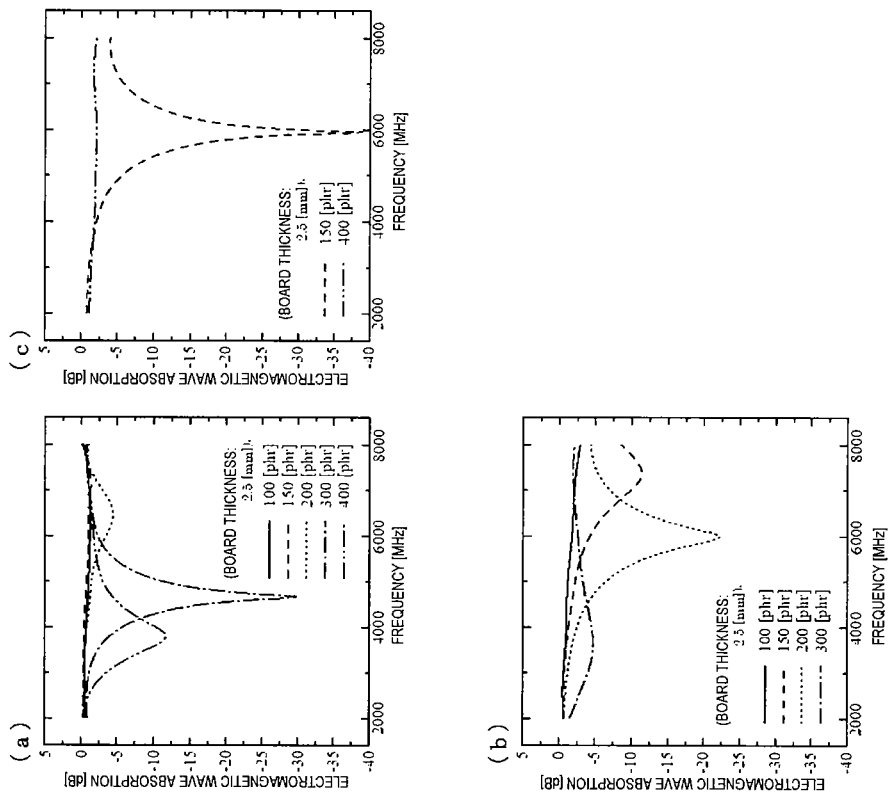
FIG. 40 shows charts indicating the electromagnetic wave absorption characteristics regarding the burned material of soybean hulls, wherein the burning temperature etc. was changed.

FIG. 40 shows a chart indicating the electromagnetic wave absorption characteristics regarding the burned material of soybean hulls, wherein the burning temperature etc. was changed, and it corresponds to FIG. 15. In FIG. 40($a$)-FIG. 40($c$), the lateral axis and vertical axis indicate frequency [MHz] and electromagnetic wave absorption [dB] respectively. Here, the thickness of the electrically conductive composition was set to 2.5 [mm].

FIG. 40($a$) shows electromagnetic wave absorption characteristics of the burned material of soybean hulls that was burned at a burning temperature of 900[° C.] and was then pulverized. FIG. 40($b$) shows electromagnetic wave absorption characteristics of the burned material of soybean hulls that was burned at a burning temperature of 1500[° C.] and was not pulverized. FIG. 40($c$) shows electromagnetic wave absorption characteristics of the burned material of soybean hulls that was burned at a burning temperature of 3000[° C.] and was not pulverized.

In contrast to the case of rapeseed meal etc. shown in FIG. 39, it is confirmed that the burned material of soybean hulls has a strong electromagnetic absorption characteristic of 20 [dB] and above regardless of the burning temperature. In addition, according to these measurement results, it can be said that there is a poor correlation between the maximum value of the electromagnetic wave absorption, the burning temperature for soybean hulls, and the content of the burned material of soybean hulls against rubber.

For example, large electromagnetic wave absorption was obtained at the content of 300 [phr] in the case of the burning temperature of 900[° C.] as shown in FIG. 40($a$), at the content of 200 [phr] in the case of the burning temperature of 1500[° C.] as shown in FIG. 40($b$) and at the content of 150 [phr] in the case of the burning temperature of 3000[° C.] as shown in FIG. 40($c$).

From FIG. 40($a$), an electromagnetic wave absorption of −20 [dB] and above is confirmed in the frequency band of approx. 4200 [MHz] to approx. 4400 [MHz]. Furthermore, from FIG. 40($b$) and FIG. 40 ($c$), an electromagnetic wave absorption of −20 [dB] and above is confirmed in the frequency band of approx. 6000 [MHz]. In particular, the maximum of nearly −40 [dB] of electromagnetic wave absorption is confirmed in FIG. 40($c$).

Figure 17:
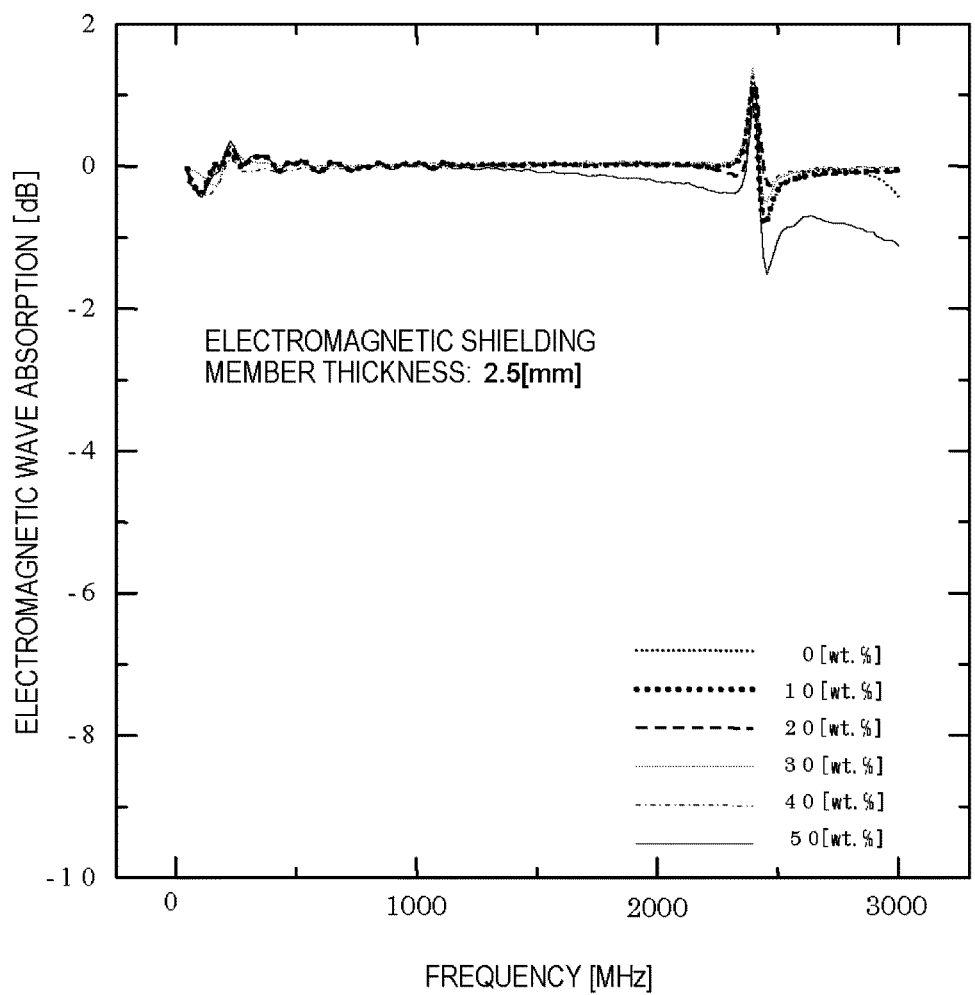
FIG. 17 shows a chart indicating the relationship between frequency and electromagnetic wave absorption in the case that low density polyethylene is used for the base material to be blended with the burned material of soybean hulls.
Figure 18:
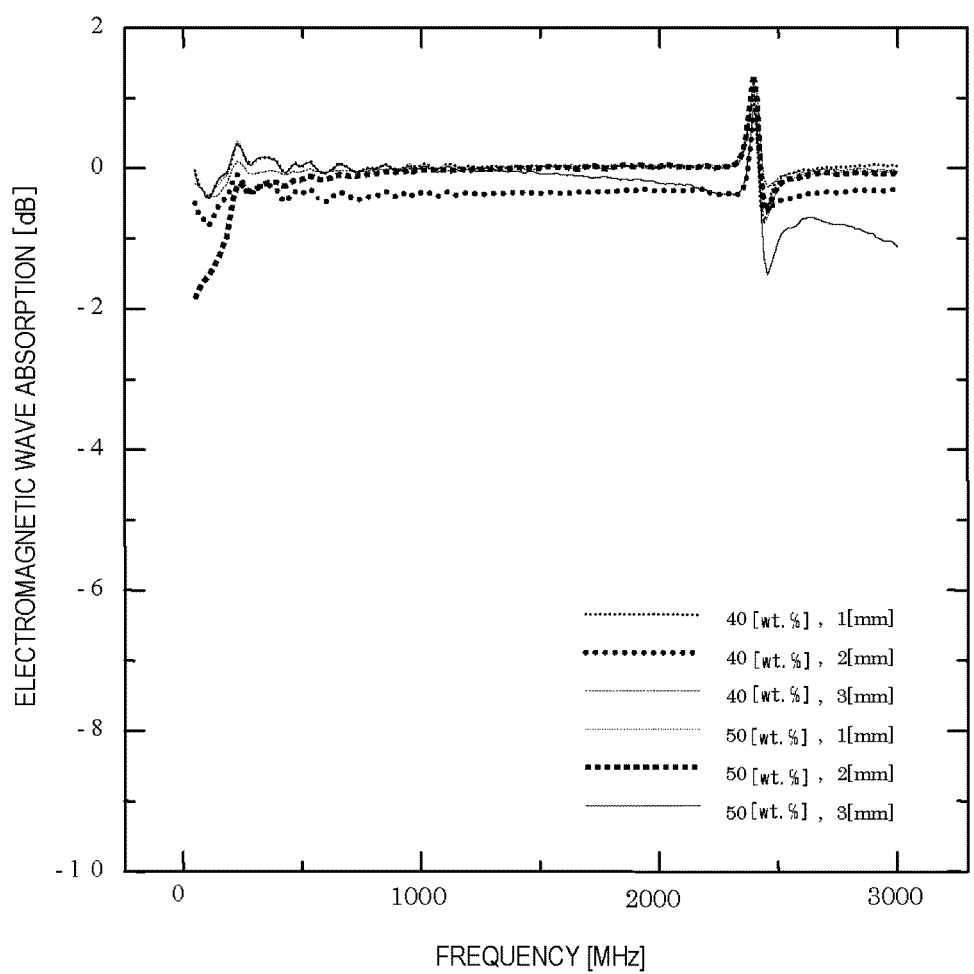
FIG. 18 shows a chart indicating the relationship between frequency and electromagnetic wave absorption in the case that low density polyethylene is used for the base material to be blended with the burned material of soybean hulls.

FIG. 17 and FIG. 18 show a chart indicating the relationship between frequency and electromagnetic wave absorption in the case that low density polyethylene is used for the base material to be blended with the burned material of soybean hulls, instead of using ethylene propylene diene rubber. FIG. 17 shows a chart, wherein the burning temperature for soybean hulls was 900[° C.], the median diameter was approx. 60 μm, the thickness of the electrically conductive composition was 2.5 [mm], and the content ratio of the burned material of soybean hulls against low density polyethylene was changed from 0 to 50 [wt. %] with an increment of 10 [wt. %].

According to FIG. 17, the electromagnetic wave absorption is approx. 0 [dB] with little fluctuations around 500 [MHz]-2300 [MHz] regardless of the content ratio of the burned material of soybean hulls. The electromagnetic wave absorption can be evaluated as somewhat similar to the one shown in FIG. 13 in the frequency bands of 2300 [MHz] and above, and 500 [MHz] and below regardless of the content ratio of the burned material of soybean hulls.

FIG. 18 shows a chart, wherein the content ratio of the burned material of soybean hulls against low density polyethylene was chosen from [wt. %] and 50 [wt. %], and the thickness of the electrically conductive composition was changed to 1, 2 and 3 [mm]. Also in the case of FIG. 18, the electromagnetic wave absorption can generally be evaluated as similar to the one shown in FIG. 17.

However, the electromagnetic wave absorption increases as the thickness of the electrically conductive composition increases, and as the content ratio of the burned material of soybean hulls against low density polyethylene increases. Therefore, when low density polyethylene is used as the base material, it is preferred to increase the content ratio itself of the burned material of soybean hulls in terms of the electromagnetic wave absorption.

What can be said from the charts shown in FIG. 17 and FIG. 18 is that a comparative electromagnetic absorption characteristic cannot be obtained since the content ratio of the burned material of soybean hulls against low density polyethylene cannot exceed the content ratio of the burned material of soybean hulls against ethylene propylene diene rubber due to the structural and characteristic reasons of low density polyethylene. For reference, the content ratio of the burned material of soybean hulls against low density polyethylene is as much as a content ratio of about 50 [wt. %] (=the content ratio of the burned material of soybean hulls: 100 [phr]).

As explained above, it is observed that the electrically conductive composition of this embodiment not only has the anti-charge function and anti-static function, but also has a shielding function. In addition, these functions can be tailored to various applications by changing the production conditions for the burned plant material of soybean hulls etc.

In other words, the electrically conductive composition of this embodiment can be tailored to various applications by adjusting the content ratio of the burned material of soybean hulls, the median diameter of the burned material of soybean hulls, the burning temperature for obtaining the burned material of soybean hulls, and the content ratio of the burned material of soybean hulls for the electrically conductive composition. Consequently, the electrically conductive composition of this embodiment can be used as, for example, conductive filler to the plastic and rubber used in electronic appliances.

Regarding the burned material of soybean hulls according to this embodiment, the following tests and measurements have been carried out. Here, regarding the burned material of soybean hulls, although those with the median diameter of approx. 30 μm and those with the median diameter of approx. 60 μm were used to carry out several tests and measurements, this range of differences in median diameter did not indicate any differences in the test results and measurement results.

(1) Regarding the burned material of soybean hulls according to this embodiment, the physical properties such as bulk specific gravity, BET specific surface area, and crystallite size were measured.

(2) Regarding the burned material of soybean hulls according to this embodiment, whether or not it can be blended with a base material other than ethylene propylene diene rubber, and if possible to blend, the content ratio of the burned material against the rubber were measured.

First, the following measurement results were obtained regarding the physical properties.

BET specific surface area: approx. 4.7 m$^2$/g to approx. 390 m$^2$/g

Crystallite size: approx. 1 nm to approx. 20 nm

As comparing those burned at respective burning temperatures of 900[° C.], 1500[° C.] and 3000[° C.] with each other, it is found that the BET specific surface area varies depending on the burning temperature.

For example, JPA2005-336017 discloses a porous carbon material with a bulk specific gravity of 0.6-1.2 g/cm$^3$. When comparing the above measurement results with those in this publication, the burned material of soybean hulls according to this embodiment has a lower value in the bulk specific gravity. Here, the bulk specific gravity of the burned material of soybean hulls according to this embodiment has been measured in conformity to JIS K-1474.

JPA2007-191389 discloses carbonaceous or graphitic particles for electrodes of non-aqueous secondary battery that have a median diameter of 5-50 μm and a BET specific surface area of 25 m$^2$/g or below.

JPA2005-222933 discloses carbonaceous particles that have a crystallite size of over 100 nm as a negative-electrode material for lithium battery. When comparing the above measurement results with those in this publication, the burned material of soybean hulls according to this embodiment has a smaller crystallite size, and thus it is evaluated as low-crystalline carbon.

Next, the measurement results of whether or not being able to blend with a base material other than ethylene propylene diene rubber, and if possible to blend, the content ratio of the burned material against the rubber were found as follows.

Here, No. 191-TM TEST MIXING ROLL manufactured by Yasuda Seiki Seisakusho Ltd. was used as an open roll (biaxial kneading machine), and TOYO SEIKI mini TEST PRESS 10 was used as a molding process machine (compacting machine).

For comparison, in addition to the burned material of soybean hulls according to this embodiment, (1) coconut shell activated carbon (granular SHIRASAGI WH2C8/32SS Lot No. M957 manufactured by Japan EnviroChemicals. Ltd.), and (2) carbon black (SUNBLACK285, Lot No. 8BFS6 manufactured by ASAHI CARBON CO., LTD.) were used.

For the base material other than ethylene propylene diene rubber, (a) isoprene (IR-2200 manufactured by Kraton JSR Elastomers K.K.), and (b) polyvinyl chloride resin (ZEST1000Z, Lot No. C60211 manufactured by Shin Daiichi Enbi K.K.) were used.

In addition, regarding coconut shell activated carbon and carbon black, whether or not it can be blended with ethylene propylene diene rubber was also checked.

Blending the burned material of soybean hulls according to this embodiment with a base material was the same as explained above with reference to FIG. 2; and generally stated, when isoprene was used as the base material, it was masticated by the open roll preheated to approx. 90[° C.].

When PVC was used as the base material, it was masticated by the open roll preheated to approx. 185[° C.]. Then the burned material of soybean hulls according to this embodiment and others were respectively blended with the base material. This burned material of soybean hulls was the one burned at 900[° C.], and the median diameter was set to 30 µm.

Subsequently, the molding process machine was used to process molding for the base material that had been blended with the burned material of soybean hulls according to this embodiment or others under the pressure of 20 [MPa] for 5 minutes at the temperature of 100[° C.].

Hence, regarding the resultant products, the measurement results of whether or not being able to blend with the base material, and if possible to blend, the content ratio of the burned material against the rubber were found as follows.

1. Regarding the burned material of soybean hulls according to this embodiment,
(1) In the case that isoprene was used as the base material, the content ratio was found to be as much as approx. 600 [phr].
(2) In the case that polyvinyl chloride resin was used as the base material, the content ratio was found to be as much as approx. 350 [phr].

2. Regarding coconut shell activated carbon,
(1) In the case that isoprene was used as the base material, the content ratio was found to be approx. 150 [phr]. However, it was not possible to knead in to 200 [phr] or more.
(2) In the case that ethylene propylene diene rubber was used as the base material, the content ratio was found to be approx. 150 [phr]. However, in this case, when this compressed compact was curved, it caused a crack. Moreover, it was not possible to knead in to 200 [phr] or more.

3. Regarding carbon black,
(1) In the case that isoprene was used as the base material, the content ratio was found to be approx. 100 [phr]. However, in this case, when this compressed compact was curved, it caused a crack. Moreover, it was not possible to knead in to 150 [phr] or more.
(2) In the case that ethylene propylene diene rubber was used as the base material, the content ratio was found to be approx. 100 [phr]. However, in this case, when this compressed compact was curved, it caused a crack. Moreover, it was not possible to knead in to 150 [phr] or more.

As a summary, in contrast to the burned material of soybean hulls according to this embodiment, even though "coconut shell activated carbon" that is in common in terms of being plant-derived carbide and being porous structure was used, a large amount of blending with the base material such as the one obtained by the burned material of soybean hulls according to this embodiment was not recognized. So any one of the burning temperature for the burned material of soybean hulls according to this embodiment, the carbon content attributable thereto, and a lager number of reactive functional residues is possibly contributing to the increased content ratio against the base material.

In the case of petroleum-pitch-derived carbon black, it was found that not only containing the amount of 100 [phr] for ethylene propylene diene rubber causes a reduced flexibility, but also containing the amount of 100 [phr] for isoprene causes a reduced flexibility.

It was confirmed that the burned material of soybean hulls according to this embodiment was able to be blended with a base material even if silicon rubber was used as the base material. When reproducibility tests were selectively carried out for various test results etc. explained in this embodiment, it was confirmed that all of them were reproducible.

Furthermore, each test was selectively carried out by setting the median diameter of the burned material of soybean hulls according to this embodiment to 30 µm. As explained with reference to FIG. 8, when the median diameter was changed to 60 µm, 10 µm and 2 µm, there seems to be differences in the specific volume resistivity, however, no significant difference was observed between the median diameters of 60 µm and 30 µm. Yet another, no significant difference was observed in the "surface resistivity" between the median diameters of 60 µm and 30 µm.

Embodiment 2

In Embodiment 1 according to present invention, the electrically conductive composition using the burned material of soybean hulls was mainly explained. In Embodiment 2 according to present invention, the anti-static material and electromagnetic shielding member using the rice bran or rice hulls is mainly explained.

First, just like Embodiment 1, the electromagnetic wave absorption characteristics of the "electrically conductive composition" using the burned material of rice hulls is explained. The production method and conditions for the electrically conductive composition are the same as the case shown in FIG. 2.

Figure 45:
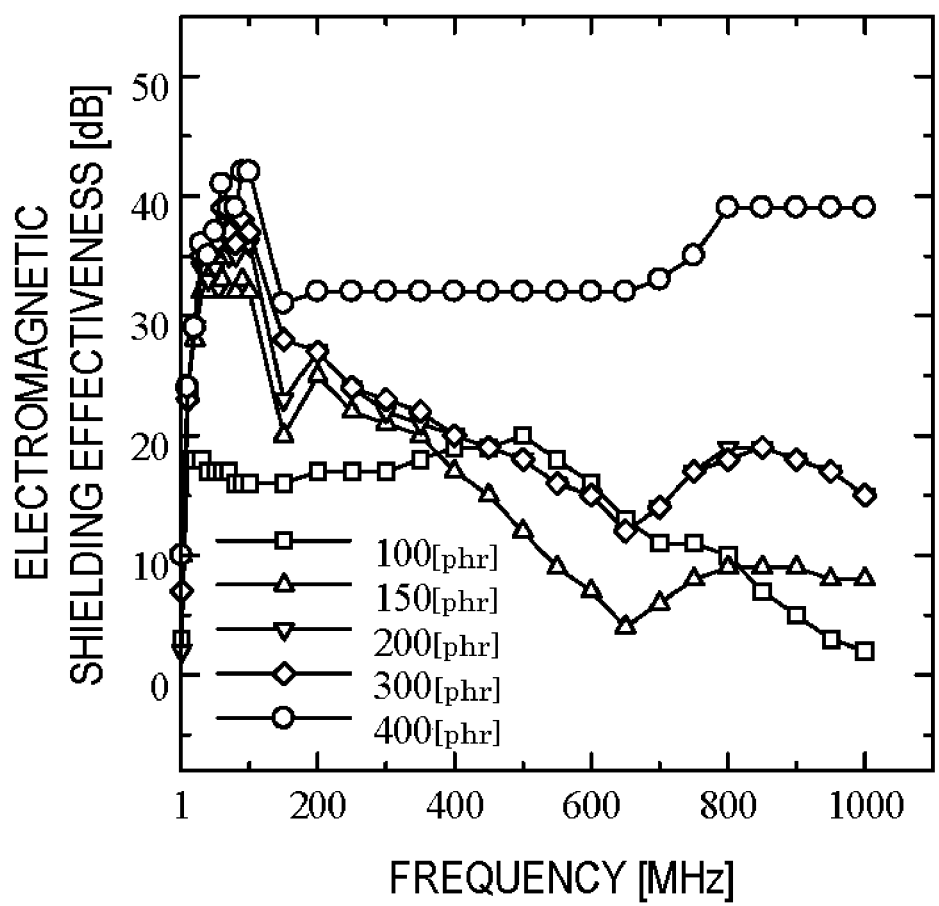
FIG. 45 shows a chart indicating the measurement results of the electromagnetic shielding characteristics of the electrically conductive composition of this embodiment.

FIG. 45 shows a chart indicating the measurement results of the electromagnetic shielding characteristics of the electrically conductive composition of this embodiment, and it corresponds to FIG. 24. In FIG. 45, the lateral axis and vertical axis indicate frequency [MHz] and electromagnetic shielding effectiveness [dB] respectively. Here, the median diameter of the burned material of rice hulls was set to 60 µm, and the thickness of the electrically conductive composition was set to 2.5 [mm]. In addition, rice hulls were burned without containing a resol-type phenolic resin into the rice hulls. The burning temperature for rice hulls was set to 3000[° C.].

As seen in FIG. 45, when the content of the burned material of rice hulls against rubber was set to 400 [phr], it is surprisingly found that the electromagnetic shielding effectiveness of almost over 30 [dB] can be stably obtained up to 1000 [MHz]. Particularly, when it is over 700 [MHz], it is confirmed that the electromagnetic shielding effectiveness stably exceeds 40 [dB].

In addition, when the content of the burned material of rice hulls against rubber was set to 200 [phr] and 300 [phr], it is found that the electromagnetic shielding effectiveness of almost over 25 [dB] can be obtained up to approx. 300 [MHz]. Thus, it is preferred to appropriately choose the content of the burned material of rice hulls against rubber in accordance with the frequency of the electromagnetic wave to be shielded.

Figure 19:
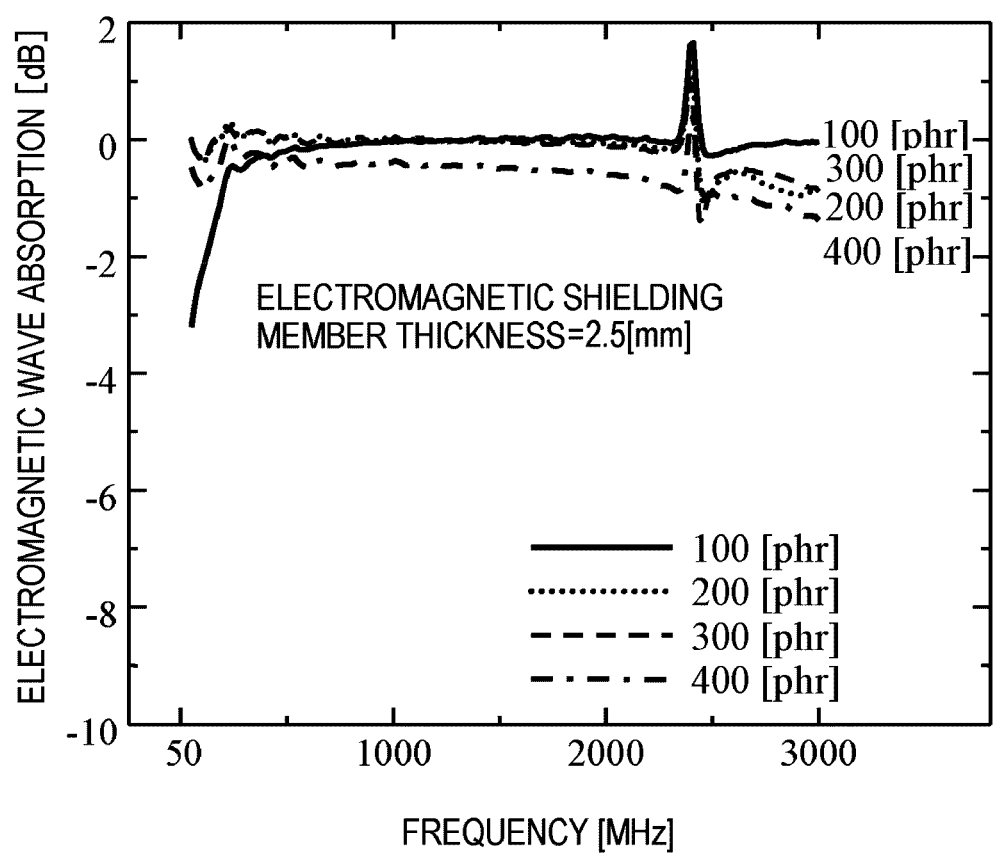
FIG. 19 shows a chart indicating the relationship between frequency and electromagnetic wave absorption characteristics of the electromagnetic shielding member using the burned material of rice hulls.
Figure 20:
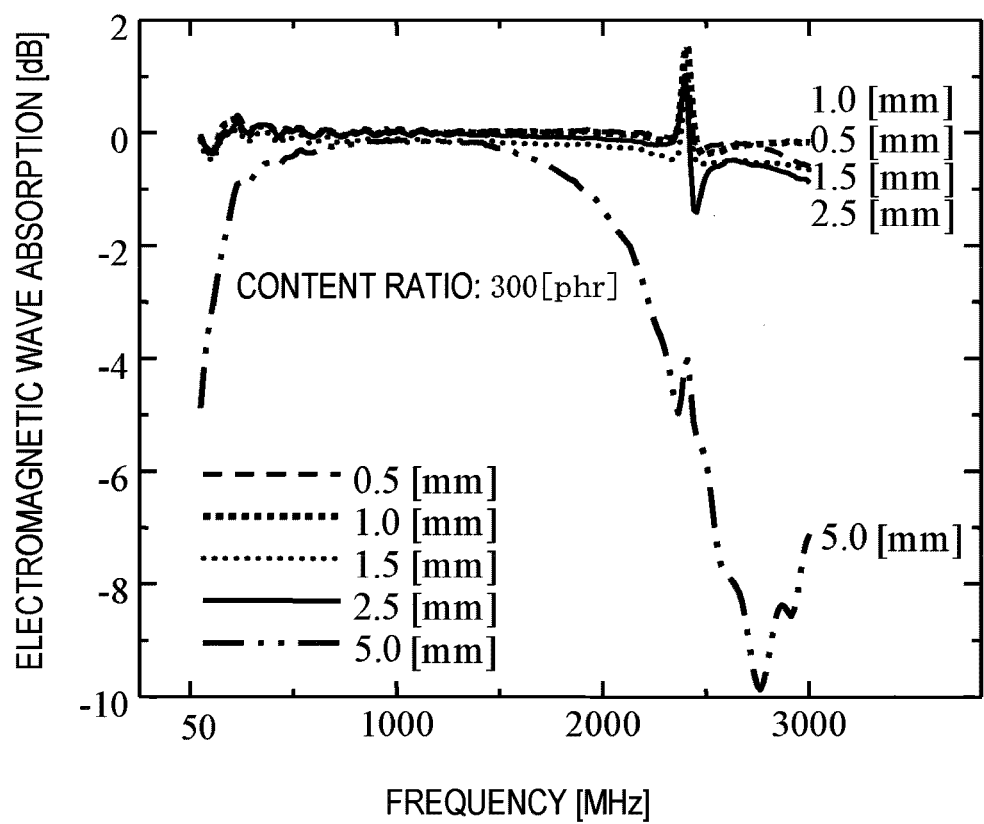
FIG. 20 shows a chart indicating the relationship between frequency and electromagnetic wave absorption characteristics of the electromagnetic shielding member using the burned material of rice hulls.

FIG. 19 and FIG. 20 show a chart indicating the relationship between frequency and electromagnetic wave absorption characteristics regarding the electrically conductive composition using the burned material of rice hulls, and these correspond to FIG. 13 and FIG. 14 respectively. The lateral axis and vertical axis of FIG. 19 respectively represent frequency [Hz] and electromagnetic wave absorption [dB].

The electromagnetic wave absorption characteristics shown in FIG. 19 and FIG. 20 were also measured under conditions similar to those for the electromagnetic wave absorption characteristics shown in FIG. 13 and FIG. 14. Here, the burning temperature for soybean hulls was set to 900[° C.], and the median diameter was set to 60 µm.

According to FIG. 19, the electromagnetic wave absorption is approx. 0 [dB] with little fluctuations around 250

[MHz]-2300 [MHz] regardless of the content ratio of rice hulls, however, the electromagnetic wave absorption slightly increases as the content ratio of rice hulls increases. Noise is observed from 2300 [MHz] to 2400 [MHz]. In contrast, in the range of 2400 [MHz] and above, the electromagnetic wave absorption increases as the content ratio of rice hulls increases. It should be noted that when the blending amount of the burned material of rice hulls was set to 100 [phr], an electromagnetic wave absorption of −3 [dB] was obtained at around 50 [MHz].

According to FIG. 20, except for the case that the thickness of the electrically conductive composition is set to 5.0 [mm], the electromagnetic wave absorption stays within −1.0 [dB] even though it shows more fluctuations. In contrast, when the thickness of the electrically conductive composition is to 5.0 [mm], the electromagnetic wave absorptions of approx. −5 [dB] and approx. −10 [dB] are obtained at around 50 [MHz] and 2.7 [GHz] respectively. Noise is observed from 2300 [MHz] to 2400 [MHz].

Figure 21:
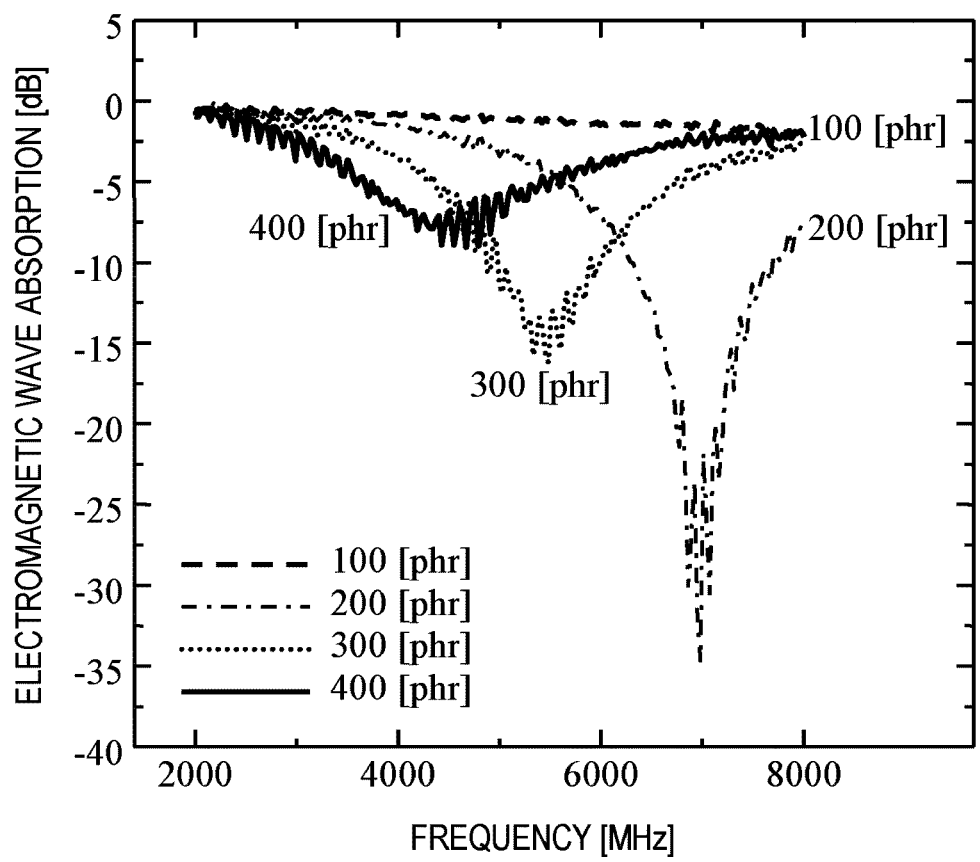
FIG. 21 shows a chart, wherein the frequency conditions for the electromagnetic shielding member shown in FIG. 19 and FIG. 20 have been changed.
Figure 22:
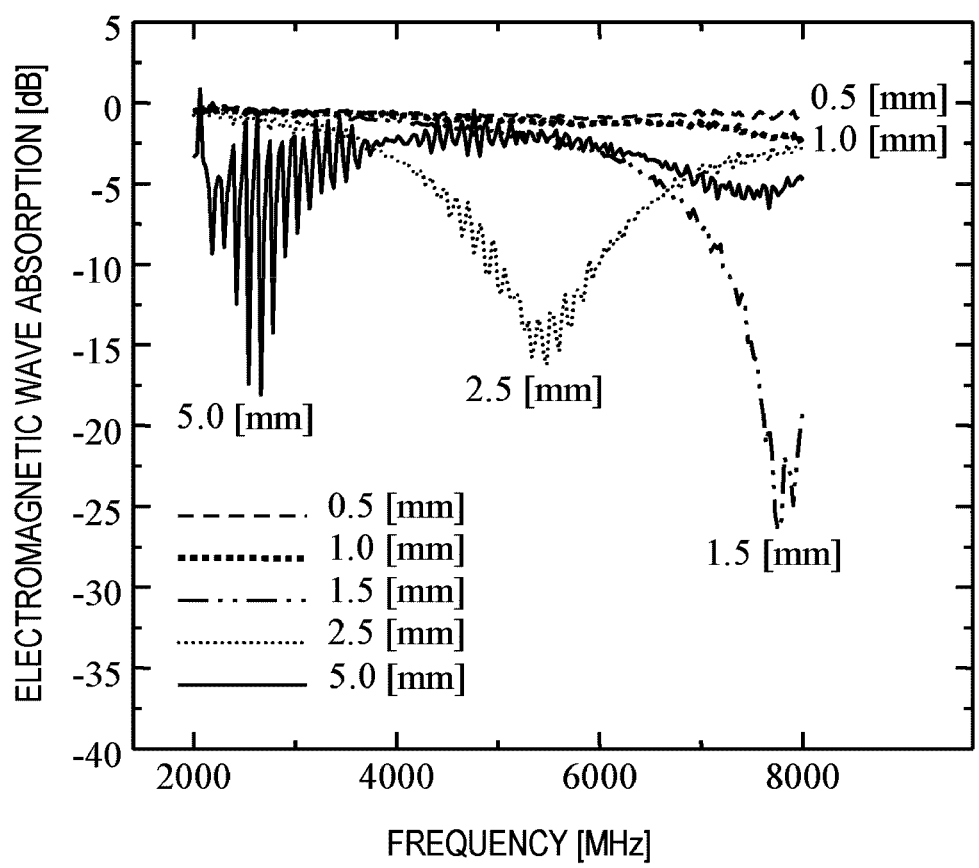
FIG. 22 shows a chart, wherein the frequency conditions for the electromagnetic shielding member shown in FIG. 19 and FIG. 20 have been changed.

FIG. 21 and FIG. 22 are a chart, wherein the frequency conditions for the electrically conductive composition shown in FIG. 19 and FIG. 20 have been changed, and these correspond to FIG. 15 and FIG. 16 respectively.

As shown in FIG. 21, paying attention to the minimum value of each chart, there seems to be association between the content ratio of the burned material of rice hulls against ethylene propylene diene rubber and the frequency band. That is, as the content ratio of the burned material of rice hulls against ethylene propylene diene rubber increases, the electromagnetic wave absorption range shifts to the lower frequency band.

In addition, there also seems to be association between the content ratio of the burned material of rice hulls against ethylene propylene diene rubber and the absorption itself. That is, as the content ratio of the burned material of rice hulls against ethylene propylene diene rubber increases, the electromagnetic wave absorption decreases except for the case that the content ratio of the burned material of rice hulls against ethylene propylene diene rubber is set to 100 [phr].

Specifically, when the content ratio of the burned material of rice hulls was 200 [phr], 300 [phr] and 400 [phr], the electromagnetic wave absorptions of −35 [dB] at around 7 [GHz], −15 [dB] at around [5.3 GHz] and −7 [dB] at around 4.5 [GHz] were obtained respectively. When the content ratio of the burned material of rice hulls was 200, the electromagnetic wave absorption of −20 [dB] and more was obtained around 6.8 [GHz]-7.2 [GHz].

As shown in FIG. 22, there seems to be association between the thickness of the electrically conductive composition and the frequency band. That is, as the thickness of the electrically conductive composition increases, the electromagnetic wave absorption range shifts to the lower frequency band. When the thickness of the electrically conductive composition was 0.5 [mm] and 1.0 [mm], no particular peak was seen in the frequency band of 2 [GHz]-8 [GHz], however, when the thickness of the electrically conductive composition was 1.5 [mm], 2.5 [mm] and 5.0 [mm], the electromagnetic wave absorptions of −25 [dB] at around 8 [GHz], −15 [dB] at around 5.5 [GHz] and −10 [dB] at around 6 [GHz] were obtained respectively.

Next, the anti-static material and electromagnetic shielding member using rice bran or rice hulls are described. Rice hulls are byproducts that are obtained when heads of rice are threshed and turned into brown rice, and approx. 2.6 million tons are produced per year. Among this amount, approx. 1.7 million tons are used for compost, spreading material in livestock barn, and smoking charcoal, and the rest of approx. 0.8 million tons are disposed by incineration etc. Therefore, from the viewpoint of avoiding wasteful disposal processing, a beneficial use of those disposed has been sought.

In addition, the rice hulls are composed of approx. 80% of organic components and approx. 20% inorganic components. The comprising items of the organic components are approx. 43 [wt. %] of alpha cellulose, approx. 22 [wt. %] of lignin and approx. 17 [wt. %] of D-xylose. The inorganic components comprise approx. 95 [wt. %] of silica. Silica is amorphous and is hard to dissolve into acid and alkali. In addition, silica is low in thermal expansion coefficient ($0.5 \times 10^{-6}$), and has high-temperature-tolerance up to about 1200[° C.]. Furthermore, since silica is amorphous, it is expected to be able to obtain a high-strength compound when blended with other materials.

In contrast to this, when rice hulls were burned at a temperature of 3000[° C.], those comprised 99.57% of carbon, 0.21% of aluminum, and 0.15% of copper.

Figure 46:
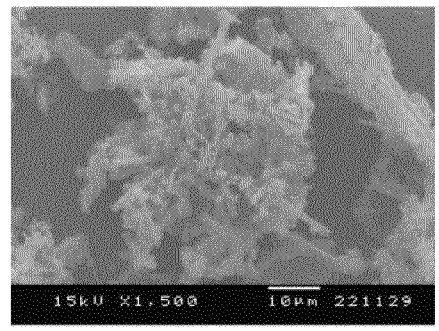
FIG. 46 shows SEM pictures of the burned material of rice hulls burned at a temperature of 3000 [° C.].
Figure 46:
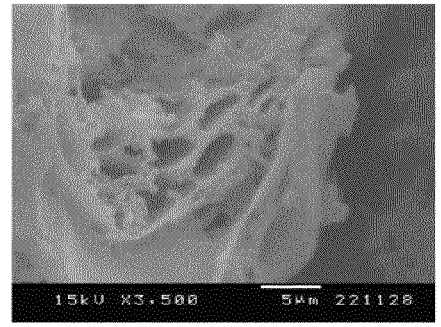
Figure 46:
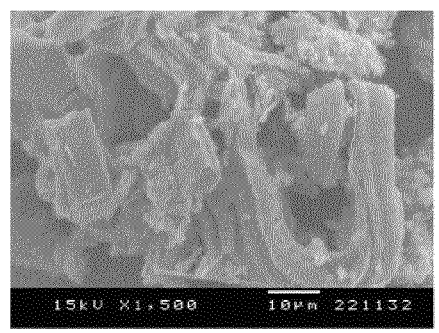
Figure 46:
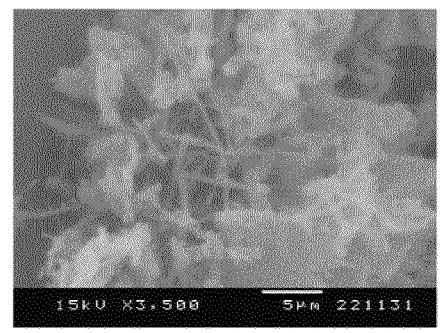
Figure 46:
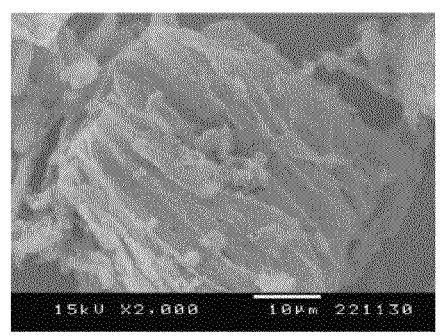

FIG. 46 shows SEM pictures of the burned material of rice hulls burned at a temperature of 3000[° C.]. FIG. 46(a) and FIG. 46(b) show a picture taken at a magnification of 1500, FIG. 46(c) shows a picture taken at a magnification of 2000, and FIG. 46(d) and FIG. 46(e) show a picture taken at a magnification of 3000.

As seen in FIG. 46(a) and FIG. 46(e), the burned material of rice hulls is found to be a mixture of needle-shape parts with a length of about 10 μm, and surrounding granular parts with a size of about 2 μm. In contrast, as seen in FIG. 46(b), the burned material of rice hulls seems to have relatively long and large parts with a size of several tens of μm or more. Furthermore, as seen in FIG. 46(c), the burned material of rice hulls seems to have relatively long needle-shape parts with a size of several tens of μm or more linking with each other. In addition, as seen in FIG. 46(d), the burned material of rice hulls also has porous parts.

Figure 47:
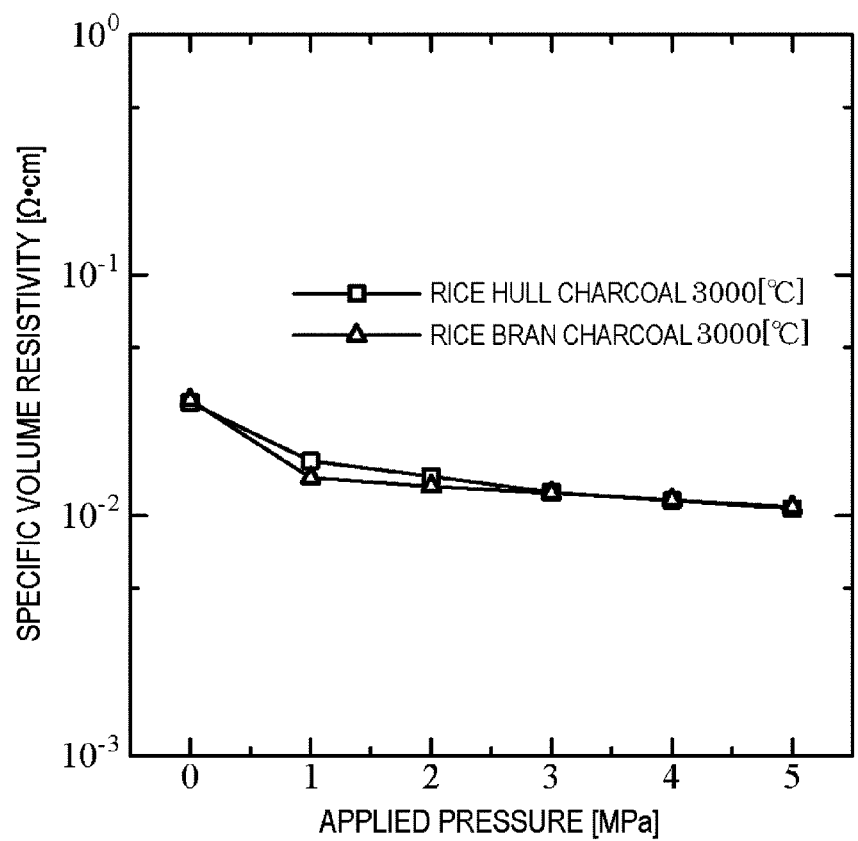
FIG. 47 shows a chart indicating the test results of the conductivity test for the burned material of rice hulls and burned material of rice bran, both were burned at a temperature of 3000 [° C.].

FIG. 47 shows a chart indicating the test results of the conductivity test for the burned material of rice hulls and burned material of rice bran, both were burned at a temperature of 3000[° C.], and it corresponds to FIG. 6. The lateral axis and vertical axis of FIG. 47(a) respectively represent the pressure [MPa] applied to the burned material of soybean hulls and the specific volume resistivity [Ω·cm].

According to FIG. 47, the specific volume resistivity of the burned material of rice hulls can be evaluated as equivalent to the specific volume resistivity of the burned material of rice bran. This is because there are almost no components left behind other than carbon due to burning at a temperature of as high as 3000[° C.].

When comparing FIG. 47 with FIG. 6(b), although both charts show the specific volume resistivity of the burned material of rice hulls, it is confirmed that there is a change with a level of one decimal order in the specific volume resistivity under pressure due to the difference in the burning temperatures. That is, it is found that the burned material of rice hulls improves its conductivity when burned at a relatively high temperature.

Figure 48:
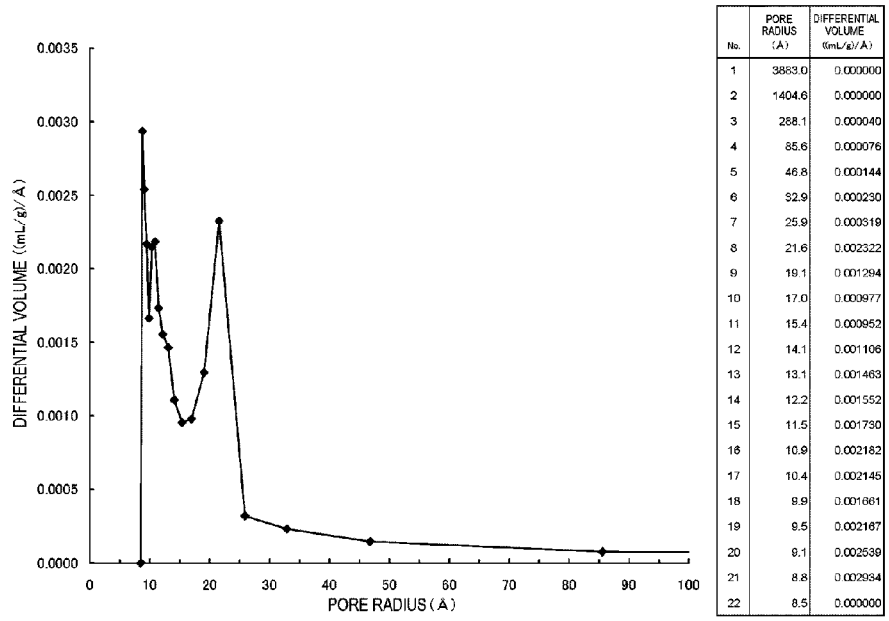
FIG. 48 shows a chart of the pore size distribution curve in the gas desorption process for RHC.
Figure 49:
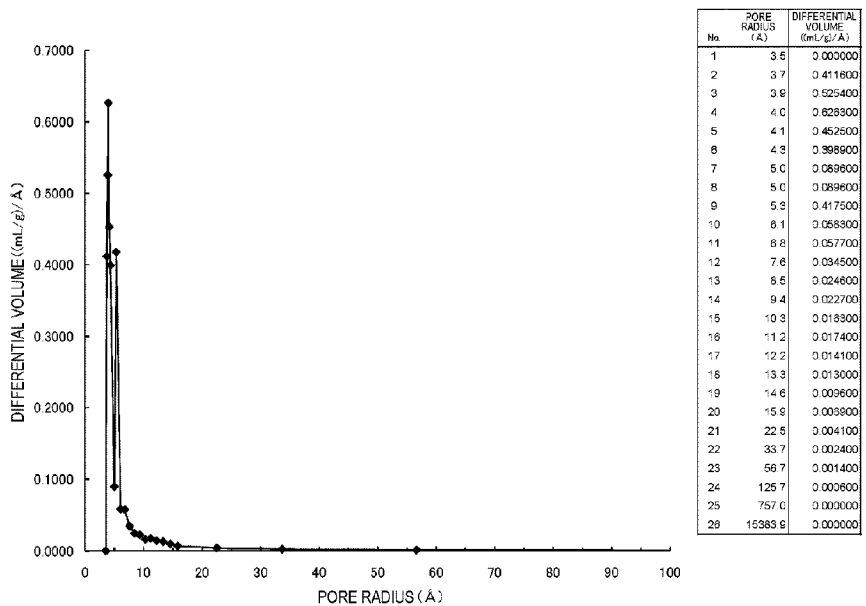
FIG. 49 shows a chart of the pore size distribution curve in the gas adsorption process for RHC.

FIG. 48 shows a chart of the pore size distribution curve in the gas desorption process for the burned material of rice hulls that were not impregnated with a resol-type phenolic resin and were then burned at a temperature of 3000[° C.] (hereinafter referred to as "RHC"), and corresponds to FIG. 42. FIG. 49 shows a chart of the pore size distribution curve for RHC and corresponds to FIG. 43. In FIG. 48 and FIG. 49, the lateral axis and vertical axis respectively represent the pore radius (Å) and the differential volume ((mL/g)/Å).

As shown in FIG. 48 and FIG. 49, a plurality of peaks appear in the differential volume at a specific pore radius.

Specifically, a small hysteresis is observed in the medium pressure range in the gas desorption process shown in FIG. 48. In addition, a sharp peak appears in the differential volume at a pore radius of approx. 11.0 Å and at a pore radius of approx. 22.0 Å.

In contrast, a peak appears in the differential volume at a pore radius of approx. 4.0 Å and at a pore radius of approx. 5.3 Å in the gas adsorption process shown in FIG. 49. However, since both peaks are close to 5.0 Å, it can be evaluated as the same as the case of showing a sole peak in the differential volume. In addition, in the gas desorption process shown in FIG. 49, some gas adsorption is observed in the lower pressure range. See the chart in FIG. 48 and FIG. 49 for the detailed measurement results.

Figure 50:
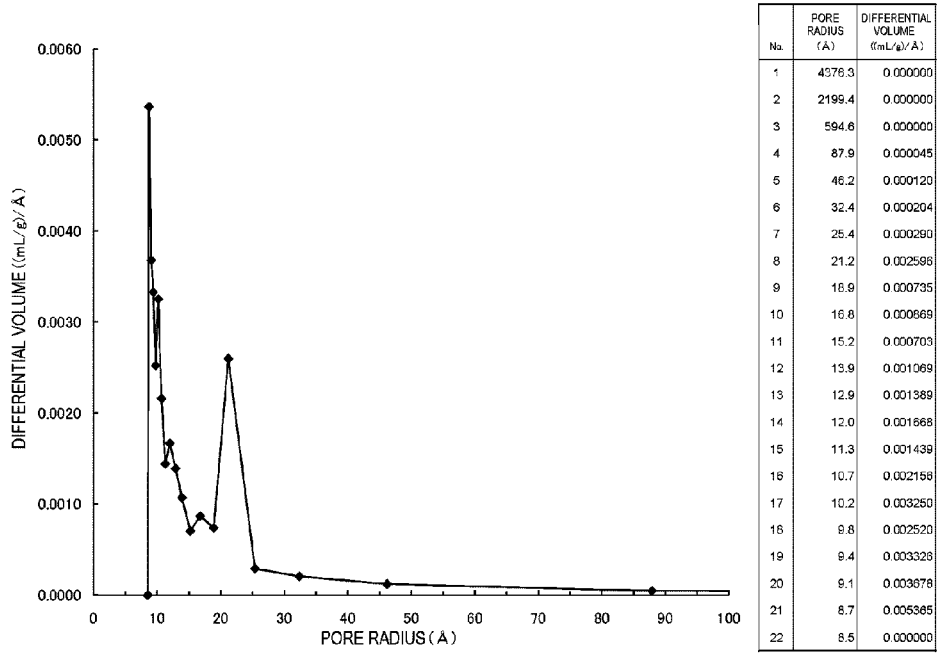
FIG. 50 shows a chart of the pore size distribution curve in the gas desorption process for RHSC.
Figure 51:
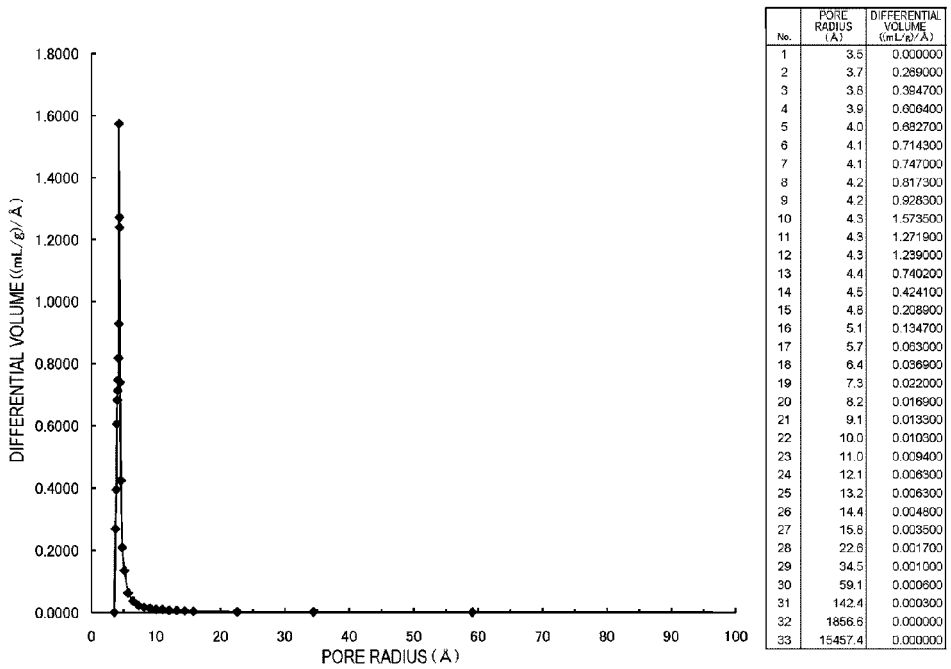
FIG. 51 shows a chart of the pore size distribution curve in the gas adsorption process for RHSC.

FIG. 50 shows a chart of the pore size distribution curve in the gas desorption process for the burned material of rice hulls that were impregnated with a resol-type phenolic resin and were then burned at a temperature of 3000[° C.] (hereinafter referred to as "RHSC"), and corresponds to FIG. 42. FIG. 51 shows a chart of the pore size distribution curve in the gas adsorption process for RHSC and corresponds to FIG. 43.

In the gas desorption process shown in FIG. 50, it is observed that a peak appears in the differential volume at a pore radius of approx. 12.0 Å and at a pore radius of approx. 21.0 Å. In addition, a small hysteresis is observed in the medium pressure range in the gas desorption process shown in FIG. 50.

In contrast, in the gas adsorption process shown in FIG. 51, it is observed that a sole peak appears in the differential volume at a pore radius of approx. 4.3 Å. In addition, in the gas desorption process shown in FIG. 51, some gas adsorption is observed in the lower pressure range. See the chart in FIG. 50 and FIG. 51 for the detailed measurement results.

Figure 52:
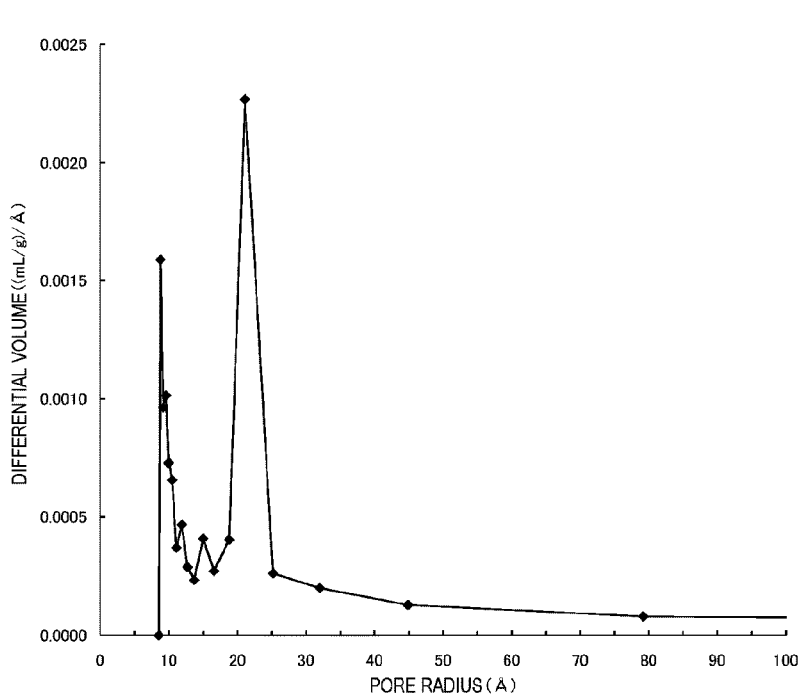
FIG. 52 shows a chart of the pore size distribution curve in the gas desorption process for RBC.
Figure 53:
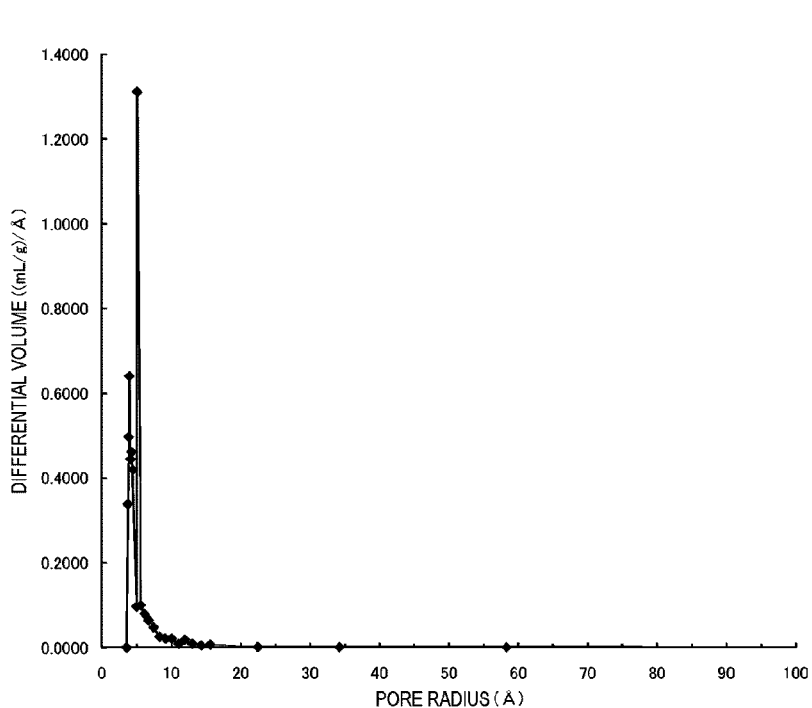
FIG. 53 shows a chart of the pore size distribution curve in the gas adsorption process for RBC.

FIG. 52 shows a chart of the pore size distribution curve in the gas desorption process for the burned material of rice bran that was not impregnated with a resol-type phenolic resin and was then burned at a temperature of 3000[° C.] (hereinafter referred to as "NRBC"), and corresponds to FIG. 42. FIG. 53 shows a chart of the pore size distribution curve in the gas adsorption process for NRBC and corresponds to FIG. 43.

In the gas desorption process shown in FIG. 52, it is observed that a peak appears in the differential volume at a pore radius of approx. 21.0 Å. In addition, a small hysteresis is observed in the medium pressure range in the gas desorption process shown in FIG. 52.

In contrast, in the gas adsorption process shown in FIG. 53, it is observed that a peak appears in the differential volume at a pore radius of approx. 4.0 Å and at a pore radius of approx. 5.1 Å. However, since both peaks are close to 5.0 Å, it can be evaluated as the same as the case of showing a sole peak in the differential volume. In addition, in the gas desorption process shown in FIG. 53, some gas adsorption is observed in the lower pressure range. See the chart in FIG. 52 and FIG. 53 for the detailed measurement results.

Figure 54:
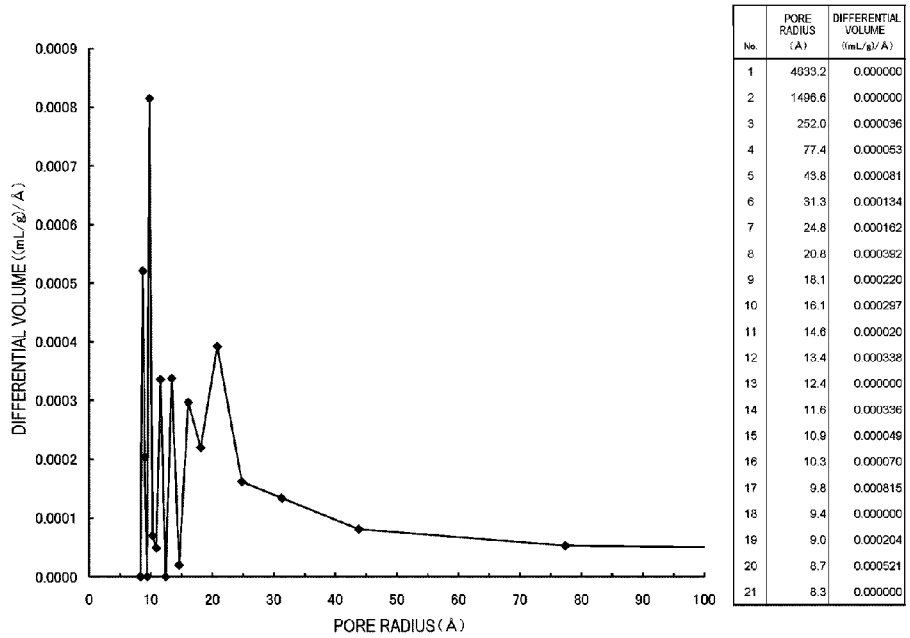
FIG. 54 shows a chart of the pore size distribution curve in the gas desorption process for NRBC.
Figure 55:
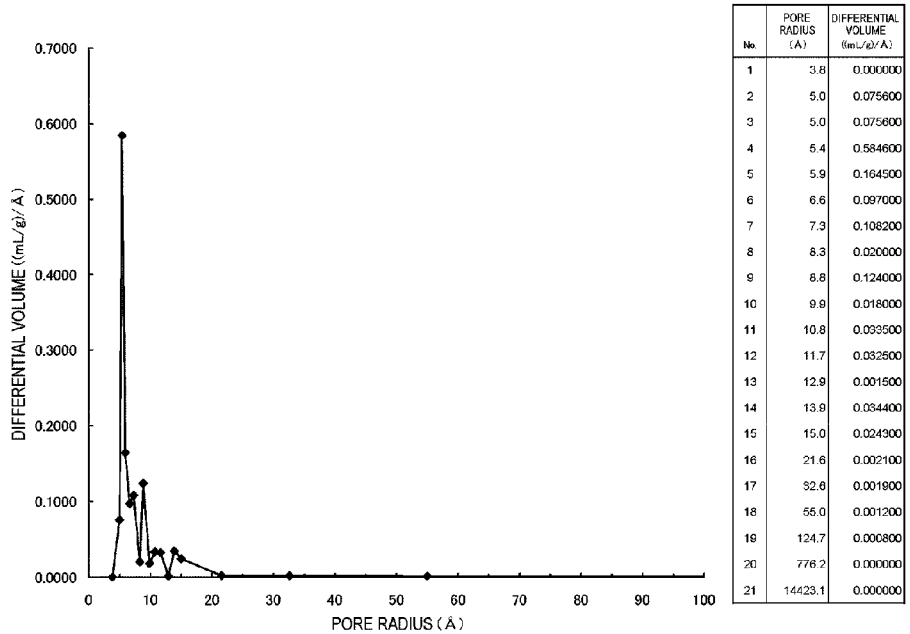
FIG. 55 shows a chart of the pore size distribution curve in the gas adsorption process for NRBC.

FIG. 54 shows a chart of the pore size distribution curve in the gas desorption process for the burned material of rice bran that was not impregnated with a resol-type phenolic resin and was then burned at a temperature of 3000[° C.] (hereinafter referred to as "NRBC"), and corresponds to FIG. 42. FIG. 55 shows a chart of the pore size distribution curve in the gas adsorption process for NRBC and corresponds to FIG. 43.

In FIG. 54, it is observed that a plurality of small peaks appear in the differential volume in a relatively wide range of pore radius value. In other words, you may say that the pore size distribution curve is broad. In addition, no hysteresis is observed in the gas desorption process shown in FIG. 54.

In contrast, in the gas adsorption process shown in FIG. 55, it is observed that a sole peak appears in the differential volume at a pore radius of approx. 5.4 Å. In addition, no hysteresis is observed also in the gas desorption process shown in FIG. 55. See the chart in FIG. 54 and FIG. 55 for the detailed measurement results.

Table 1 summarizes the measurement results in the gas desorption process and gas adsorption process including the measurement results shown in FIG. 48-FIG. 55.

TABLE 1

| Plant-derived carbon | Sample weight (g) | Relative pressure range of BET-plot | Measured area ($m^2$) | Specific surface area ($m^2/g$) | Pore volume Vp ($cm^3/g$) | Average pore radius $r_m$ (Å) | Number of adsorptions/ desorptions | Measurement time (h) | Profile of adsorption isotherm | Pore size distribution curve analyzed from adsorption process | Profile of desorption isotherm | Pore size distribution curve analyzed from desorption process |
|---|---|---|---|---|---|---|---|---|---|---|---|---|
| RHC | 1.0175 | 0.01-0.15 | 174.81 | 171.8 | 0.0868 | 10.10 | 28/22 | 17.5 | Some gas adsorption is observed in the lower pressure range of adsorption process. | A considerably sharp peak appears at 4.0 Å and 5.3 Å (pore radius). | A small hysteresis is observed in the medium pressure range of desorption process. | A relatively sharp peak appears at 11 Å and 22 Å (pore radius). |
| RHSC | 1.0277 | 0.01-0.15 | 290.74 | 282.9 | 0.1276 | 9.02 | 35/22 | 12 | Some gas adsorption is observed in the lower pressure range of | A considerably sharp peak appears at 4.0 Å (pore radius). | A small hysteresis is observed in the medium pressure range of desorption | A relatively sharp peak appears at 12 Å and 21 Å (pore radius). |

TABLE 1-continued

| Plant-derived carbon | Sample weight (g) | Relative pressure range of BET-plot | Measured area (m²) | Specific surface area (m²/g) | Pore volume Vp (cm³/g) | Average pore radius $r_m$ (Å) | Number of adsorptions/ desorptions | Measurement time (h) | Profile of adsorption isotherm | Pore size distribution curve analyzed from adsorption process | Profile of desorption isotherm | Pore size distribution curve analyzed from desorption process |
|---|---|---|---|---|---|---|---|---|---|---|---|---|
| RBC | 1.0457 | 0.01-0.15 | 210.92 | 201.7 | 0.0929 | 9.21 | 31/22 | 22 | Some gas adsorption is observed in the lower pressure range of adsorption process. | A considerably sharp peak appears at 4.0 Å and 5.13 Å (pore radius). | A small hysteresis is observed in the medium pressure range of desorption process. | A relatively sharp peak appears at 21 Å (pore radius). |
| NRBC | 1.0130 | 0.015-0.20 | 102.31 | 101 | 0.0525 | 10.40 | 23/21 | 26 | Some gas adsorption is observed in the lower pressure range of adsorption process. | A considerably sharp peak appears at 5.4 Å (pore radius). | No hysteresis is observed in the medium pressure range of desorption process. | No particular peak is observed. |

Hereinafter, each measurement result shown in FIG. 48-FIG. 55 and Table 1 will be examined. First, as shown in Table 1, all of four measuring objects had gone through almost the same number of gas desorption processes. The time required for the desorption processes is presumed to be about 2-3 hours. Therefore, the difference in the measurement time shown in Table 1 is considered to be a difference required for the adsorption processes.

However, there seems to be hardly any correlation between the number of adsorption processes and the measurement time. That is, each measurement object seems to have a different time to reach the adsorption equilibrium that completes one adsorption process.

In addition, for RHSC, the measurement time was approx. 12 hours for approx. 1 g of sample weight as shown in Table 1. In the case of the adsorption process of soybean hulls, the measurement time was approx. 11 hours for approx. 1 g of sample weight. Thus, in consideration of this aspect, it can be said that the measurement result of RHSC is similar to the measurement result of the adsorption process of soybean hulls.

For the measuring objects other than RHSC, the measurement time was approx. 17.5 hours or more for approx. 1 g of sample weight, and thus in consideration of this aspect, it cannot be said that each measurement result is similar to the measurement result of the adsorption process of soybean hulls. In particular, NRBC with the number of adsorptions of as small as 23 times took a considerably long time to reach a single equilibrium, and the entire measurement time resulted in approx. 26 hours, that was, over a day.

As above, the behavior of slow-going nitrogen adsorption such as taking a long time to reach adsorption equilibrium in spite of the small specific surface area is not a behavior seen in activated carbon, and it is rather a behavior typical for charcoal. That is, NRBC is presumed to have a surface structure and surface property similar to those of charcoal in comparison with the other 3 types of burned materials.

Here, the background technology etc. of the anti-static material using rice bran or rice hulls is described. The burned material of rice hulls etc. can be substitute for carbon materials such as carbon black. Furthermore, in the case of anti-static material, using the burned material of rice hulls advantageously makes it easier to control the specific volume resistivity rather than using carbon black.

Figure 23:
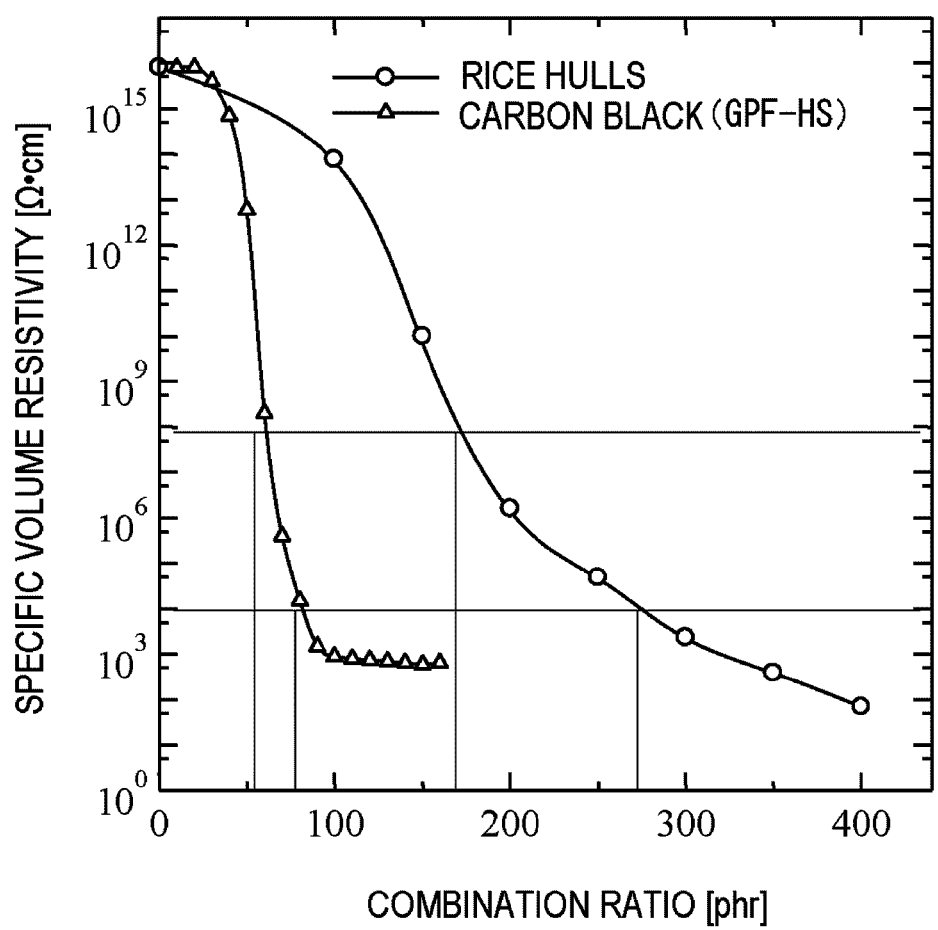
FIG. 23 shows a chart indicating the relationship between the combination ratio of the anti-static material using the burned material of rice hulls and the anti-static material using carbon black and the specific volume resistivity thereof.

FIG. 23 shows a chart indicating the relationship between the combination ratio of the anti-static material using the burned material of rice hulls and the anti-static material using carbon black (GPF-HS) and the specific volume resistivity thereof. As shown in FIG. 23, both anti-static materials reduce the specific volume resistivity as the carbon blending ratio increases. However, in the case of the anti-static material using the burned material of rice hulls, the reduction in the specific volume resistivity is gentler than that in the specific volume resistivity of the anti-static material using carbon black.

The anti-static material is generally required to have a specific volume resistivity of $1\times10^4[\Omega\cdot cm]$-$1\times10^8[\Omega\cdot cm]$. In order to obtain this specific volume resistivity, the anti-static material using a general carbon material needs to set the blending ratio of the carbon material to a relatively narrow range between 62 [phr]-82 [phr], while it is very difficult for a general carbon material to obtain this specific volume resistivity due to the occurrence of percolation phenomenon.

In particular, jigs etc., for example, used for testing semiconductors are required to have a specific volume resistivity of $1\times10^7[\Omega\cdot cm]$-$1\times10^8[\Omega\cdot cm]$, and thus it is almost impossible to realize this specific volume resistivity by adjusting the blending ratio of the carbon material.

In order to handle this, when producing anti-static materials using a general carbon material, cumbersome tasks have been forced such as reducing the difficulty of controlling the specific volume resistivity by using 2 or more types of carbon materials, or closely measuring the specific volume resistivity even after the production of the anti-static material.

In particular, although there is a conductive resin roll as an application of the anti-static material using a general carbon material, there have been problems of causing a contamination to the other material and reducing the strength of the anti-static material due to escape of the carbon component in the resin roll when the combination ratio of the carbon material increases.

In contrast to this, the anti-static material using the burned material of rice hulls has a property of changing the specific volume resistivity gently in accordance with the blending ratio of the burned material of rice hulls, and thus the specific volume resistivity can be easily controlled without requiring cumbersome tasks as explained above. Specifically, in order to obtain a specific volume resistivity of $1\times10^4$[$\Omega\cdot$cm]-$1\times10^8$ [$\Omega\cdot$cm], the anti-static material using the burned material of rice hulls simply needs to set the blending ratio of the carbon material to a relatively wide range of 174 [phr]-276 [phr].

In addition, since the burned material of rice hulls etc. also changes its conductivity in accordance with the burning temperature and median diameter, the anti-static material using the burned material of rice hulls can easily control the surface resistivity in a relatively wide range. Thus, the anti-static material using the burned material of rice hulls can be used as conductive filler that allows controlling a wide range of conductivity.

To date, the applicants of the present invention have produced carbon powder that takes advantage of the porous structure of rice hulls and have studied its utilization as an industrial material for the purpose of recycling and secondary utilization of agricultural waste. Since the burned material of rice hulls is produced by the impregnation of phenol resin, a porous strength is maintained by glassy carbon.

In other words, the burned material itself of rice hulls does not have strength, however, when it is mixed with phenol resin, the hard carbon originated from the phenol resin reinforces the strength of the burned material of rice hulls, and thus the mechanical strength of the anti-static material will not be impaired. In addition, since some applications do not require strength, the impregnation of phenol resin is unnecessary.

Next, the method for producing the anti-static material using the burned material of rice hulls is described. First, 25 parts by weight of resol-type phenolic resin (for example, Phenolite ST-611-LV produced by Dainippon Ink and Chemicals, Inc.) are blended with 75 parts by weight of raw rice hulls, and are dried for hardening. Next, this mixture is burned at 900[° C.]. As an example, this embodiment took approx. 4 hours for the temperature increase from a room temperature to 850[° C.] in a nitrogen atmosphere, and took approx. 25 min to 900[° C.], and then maintained for approx. 5 hours at 900[° C.].

After the above burning, the burned material may be naturally cooled down, or may be actively cooled down. In this way, the mixture is carbonized. Subsequently, grinding and sieving processes are performed in the same procedure as those of Embodiment 1. It is better to grind rice hulls to 3 mm or below prior to blending with a resin so as to facilitate the permeation of the resin. Next, similar to Embodiment 1, the mixture after the sieving process is kneaded with ethylene propylene diene rubber to produce an anti-static material.

Various applications are considered for the burned plant material of each embodiment described above. Typically, those using carbon such as carbon black as a raw material can be applied to any products.

In the electrical and electronic fields, wafer carrier, wafer cassette, tote-bin, wafer boat, IC chip tray, IC chip carrier, IC carrier tube. IC card, tape and reel packing, liquid crystal cassette, various cases, storage tray, storage bin, carrier device parts, magnetic card reader, connector, computer slot, HD carrier, MR head carrier, GMR head carrier, HSA carrier, HDD VCM, and liquid crystal panel carrier are some of the examples.

In addition, in the field of OA equipment, charging member such as charging roll, charging belt, anti-static belt, transfer roll, transfer belt and developing roll in an image-forming apparatus such as electrophotographic copier and electrostatic recording apparatus, transfer drum for recording apparatus, printed-circuit board cassette, bush, paper and bill carrier parts, paper feed rail, font cartridge, ink ribbon canister, guide pin, tray, roller, gear, sprocket, computer housing, modem housing, motor housing, CD-ROM housing, printer housing, connector, and computer slot are some of the examples.

Furthermore, in the field of communication equipment, mobile phone parts, PDA parts, and mobile computer parts are some of the examples.

In the field of automotive, interior material, under hood, housing for electrical and electronic equipment, gas tank cap, fuel filter, fuel line connector, fuel line clip, fuel tank, door handle and various parts are some of the examples.

In other fields, electric wire and power cable covering material, electric wire support, radio wave absorber, floor material, carpet, insect deterrent sheet, pallet, shoe, shoe sole, tape, brush, blower fan, sheet heating element, radiator and heat shielding material are some of the examples.

When using the burned plant material according to the embodiments of the present invention for a coaxial cable as an example of electric wire and power cable covering materials, the following advantages are particularly gained. That is, coaxial cables are used for connection between television set and antenna, connection between radio set and antenna, connection of measurement instruments, transmission of audio and video signals, and various wirings inside automotive, etc.

A coaxial cables is composed of 4 layers including an inner conductor to transmit signals, an outer conductor that functions as a shielding material to cover the inner conductor, an insulator for preventing short-circuit between the inner conductor and outer conductor, and a sheath to cover the outer conductor. Since a coaxial cable comprises an outer conductor, it can suppress the effect of electromagnetic wave from the inner conductor to the outside or from the outside to the inner conductor. In addition, it is flexible, and thus it has a characteristic of allowing bending to some extent.

Since the burned plant material has a shielding function as explained above, the outer conductor is no more required if it is kneaded into the sheath. Despite that, the shielding property and flexibility of the conventional shielding wire can be realized.

As a result of this, cut-down in material costs by reducing the number of parts, cut-down in production costs by facilitating production, and down-sizing and weight reduction of the shielding wire by reducing the number of parts can be advantageously achieved. In particular, since the burned material of soybean hulls has a higher electromagnetic shielding capability in radio frequency band, it is useful for radio noise suppression when it is used as a covering material for the wires used inside automotive.

The invention claimed is:

1. An electromagnetic shielding member comprising a burned plant material formed by adjusting any of carbon content, burning temperature and median diameter of the burned plant material, wherein the burned plant material is selected from the group consisting of burned soybean hulls, burned rapeseed meal, burned sesame meal, burned cotton seed meal, burned cotton hulls, burned grain, burned rice husk and burned rice bran, and the electromagnetic shielding member has an electromagnetic shielding effectiveness of 20 dB or above at a frequency band of 1000 MHz or below, and either an electromagnetic wave absorption of 20 dB or above at a frequency band of 4200 MHz to 8000 MHz or an electromagnetic wave absorption of 20 dB or above at a frequency band of 6800 MHz or above.

2. The electromagnetic shielding member as claimed in claim 1, wherein the burned plant material is ground and sieved material having a median diameter of approximately 80 µm or below.

3. The electromagnetic shielding member as claimed in claim 1, wherein a content ratio of the burned plant material is determined according to the frequency band of electromagnetic waves to be shielded.

4. The electromagnetic shielding member as claimed in claim 1, wherein a content ratio of the burned plant material is 150 phr or above.

5. An electronic appliance comprising the electromagnetic shielding member as claimed in claim 1.

6. An inspection apparatus for the electronic appliance comprising the electromagnetic shielding member as claimed in claim 1.

7. A building material comprising the electromagnetic shielding member as claimed in claim 1.

8. A covering material comprising the electromagnetic shielding member as claimed in claim 1.

9. An anti-static material comprising the electromagnetic shielding member as claimed in claim 1.

10. An electromagnetic shielding member comprising:
   (a) a burned plant material, wherein the burned plant material is selected from the group consisting of burned soybean hulls, burned rapeseed meal, burned sesame meal, burned cotton seed meal, burned cotton hulls, burned grain, burned rice husk and burned rice bran; and
   (b) a base material into which the burned plant material has been mixed, compressed and molded, wherein the electromagnetic shielding member has an electromagnetic shielding effectiveness of 20 dB or above at a frequency band of 1000 MHz or below, and either an electromagnetic wave absorption of 20 dB or above at a frequency band of 4200 MHz to 8500 MHz or an electromagnetic wave absorption of 20 dB or above at a frequency band of 6800 MHz or above.

11. The electromagnetic shielding member as claimed in claim 10, wherein the burned plant material is blended 100 phr or more against the base material, has a median diameter that is 1 µm or more, and is a plant material burned at a temperature of 700° C. or higher.

12. The electromagnetic shielding member as claimed in claim 11, wherein the base material is selected from the group consisting of urethane, glass wool, wood and rubber.

13. The electromagnetic shielding member as claimed in claim 10, wherein the base material is ethylene propylene diene rubber.

\* \* \* \* \*